United States Patent
Cummings

(10) Patent No.: US 9,300,133 B2
(45) Date of Patent: Mar. 29, 2016

(54) CENTRAL INVERTERS

(71) Applicant: MAXOUT RENEWABLES, INC., Livermore, CA (US)

(72) Inventor: Eric Bryant Cummings, Livermore, CA (US)

(73) Assignee: Maxout Renewables, Inc., Livermore, CA (US)

( * ) Notice: Subject to any disclaimer, the term of this patent is extended or adjusted under 35 U.S.C. 154(b) by 0 days.

(21) Appl. No.: 14/326,222

(22) Filed: Jul. 8, 2014

(65) Prior Publication Data

US 2014/0319917 A1    Oct. 30, 2014

Related U.S. Application Data

(63) Continuation of application No. 12/782,932, filed on May 19, 2010, now Pat. No. 8,786,139.

(60) Provisional application No. 61/179,606, filed on May 19, 2009.

(51) Int. Cl.
*H02J 3/46* (2006.01)
*H02J 1/10* (2006.01)
(Continued)

(52) U.S. Cl.
CPC ........... *H02J 1/102* (2013.01); *H01L 31/02021* (2013.01); *H02J 1/00* (2013.01);
(Continued)

(58) Field of Classification Search
CPC .......... Y02E 10/50–10/58; H02J 3/383–3/385; H02J 1/102; H01L 31/02021
See application file for complete search history.

(56) References Cited

U.S. PATENT DOCUMENTS

| 4,186,336 A | 1/1980 | Weinberg |
| 4,333,136 A | 6/1982 | Baker |

(Continued)

FOREIGN PATENT DOCUMENTS

| CN | 1271207 A | 10/2000 |
| CN | 1794537 A | 6/2006 |

(Continued)

OTHER PUBLICATIONS

International Search Report and Written Opinion for International Patent Application No. PCT/US2010/035368, mailed on Sep. 1, 2010, 10 pages.

(Continued)

*Primary Examiner* — Daniel Cavallari
(74) *Attorney, Agent, or Firm* — Kilpatrick Townsend & Stockton LLP

(57) ABSTRACT

Various techniques are employed alone or in combination, to reduce the levelized cost of energy imposed by a power plant system. Solar energy concentrators in the form of inflated reflectors, focus light onto photovoltaic receivers. Multiple concentrators are grouped into a series-connected cluster that shares control circuitry and support structure. Individual concentrators are maintained at their maximum power point via balance controllers that control the flow of current that shunts this series connection. DC current from clusters is transmitted moderate distances to a centralized inverter. The inductance of transmission lines is maximized using an air-spaced twisted pair, enhancing the performance of boost-type three phase inverters. Cluster outputs are separate from individual inverters in massively interleaved arrays co-located at a central location. Step-up transformers convert inverter voltages to grid voltages, and small transformers provide isolation and voltage step-up only on receiver-to-receiver imbalance currents, typically <20% of the total current.

17 Claims, 55 Drawing Sheets

(51) Int. Cl.
*H01L 31/02* (2006.01)
*H02M 7/493* (2007.01)
*H02J 3/00* (2006.01)
*H05K 7/20* (2006.01)
*H02J 1/00* (2006.01)

(52) U.S. Cl.
CPC ............... *H02J 3/00* (2013.01); *H02M 7/493* (2013.01); *H05K 7/20254* (2013.01); *H02J 2001/106* (2013.01); *Y02E 10/56* (2013.01); *Y10T 29/49826* (2015.01); *Y10T 307/555* (2015.04); *Y10T 307/609* (2015.04); *Y10T 307/865* (2015.04)

(56) References Cited

U.S. PATENT DOCUMENTS

| | | | |
|---|---|---|---|
| 4,604,567 A | 8/1986 | Chetty | |
| 6,262,558 B1 | 7/2001 | Weinberg | |
| 7,046,531 B2 | 5/2006 | Zocchi et al. | |
| 7,324,361 B2 | 1/2008 | Kasemsan | |
| 7,471,014 B2 | 12/2008 | Lum et al. | |
| 8,138,631 B2 | 3/2012 | Allen et al. | |
| 8,233,278 B2* | 7/2012 | Hoffman et al. | 361/697 |
| 8,786,139 B2 | 7/2014 | Cummings | |
| 8,860,246 B2 | 10/2014 | Hadar et al. | |
| 2002/0113534 A1 | 8/2002 | Hayashi et al. | |
| 2005/0121067 A1* | 6/2005 | Toyomura et al. | 136/244 |
| 2006/0055366 A1 | 3/2006 | Tsunetsugu et al. | |
| 2007/0159866 A1 | 7/2007 | Siri | |
| 2008/0143188 A1 | 6/2008 | Adest et al. | |
| 2008/0144294 A1 | 6/2008 | Adest et al. | |
| 2008/0164766 A1 | 7/2008 | Adest et al. | |
| 2008/0174955 A1 | 7/2008 | Eddy et al. | |
| 2008/0283118 A1* | 11/2008 | Rotzoll et al. | 136/251 |
| 2008/0285317 A1* | 11/2008 | Rotzoll | 363/80 |
| 2009/0284078 A1 | 11/2009 | Zhang et al. | |
| 2009/0302681 A1 | 12/2009 | Yamada et al. | |
| 2009/0302686 A1* | 12/2009 | Fishman | 307/82 |
| 2010/0079955 A1 | 4/2010 | Li et al. | |
| 2010/0127571 A1 | 5/2010 | Hadar et al. | |
| 2010/0157632 A1* | 6/2010 | Batten et al. | 363/74 |
| 2010/0253151 A1 | 10/2010 | Gerhardinger et al. | |
| 2011/0089763 A1 | 4/2011 | Svensson et al. | |
| 2013/0249319 A1 | 9/2013 | Cummings | |
| 2014/0319916 A1 | 10/2014 | Cummings | |
| 2014/0321057 A1 | 10/2014 | Cummings | |

FOREIGN PATENT DOCUMENTS

| | | |
|---|---|---|
| CN | 1902789 A | 1/2007 |
| CN | 1954484 A | 4/2007 |
| CN | 101072976 A | 11/2007 |
| CN | 101098112 A | 1/2008 |
| CN | 101128974 A | 2/2008 |
| CN | 201018313 Y | 2/2008 |
| CN | 201178315 Y | 1/2009 |
| EP | 1 243 872 B1 | 7/2008 |
| WO | 2004/006342 A1 | 1/2004 |
| WO | 2007/086472 A | 8/2007 |

OTHER PUBLICATIONS

International Preliminary Report on Patentability with Written Opinion for International Patent Application No. PCT/US2010/035368, mailed on Nov. 22, 2011, 7 pages.
Non-Final Office Action for U.S. Appl. No. 12/782,932, mailed on Jun. 28, 2013, 13 pages.
Office Action for Chinese Patent Application No. 201080032669.9, issued on Jul. 16, 2013, 5 pages.
Notice of Allowance for U.S. Appl. No. 12/782,932, mailed on Mar. 20, 2014, 12 pages.
International Search Report and Written Opinion for International Patent Application No. PCT/US2014/020862, mailed on Sep. 4, 2014, 13 pages.
Non-Final Office Action for U.S. Appl. No. 14/326,246, mailed on Oct. 24, 2014, 13 pages.
Notice of Allowance of May 6, 2015 for U.S. Appl. No. 13/840,958, 11 pages.
Notice of Allowance of May 12, 2015 for U.S. Appl. No. 14/326,246, 9 pages.

* cited by examiner

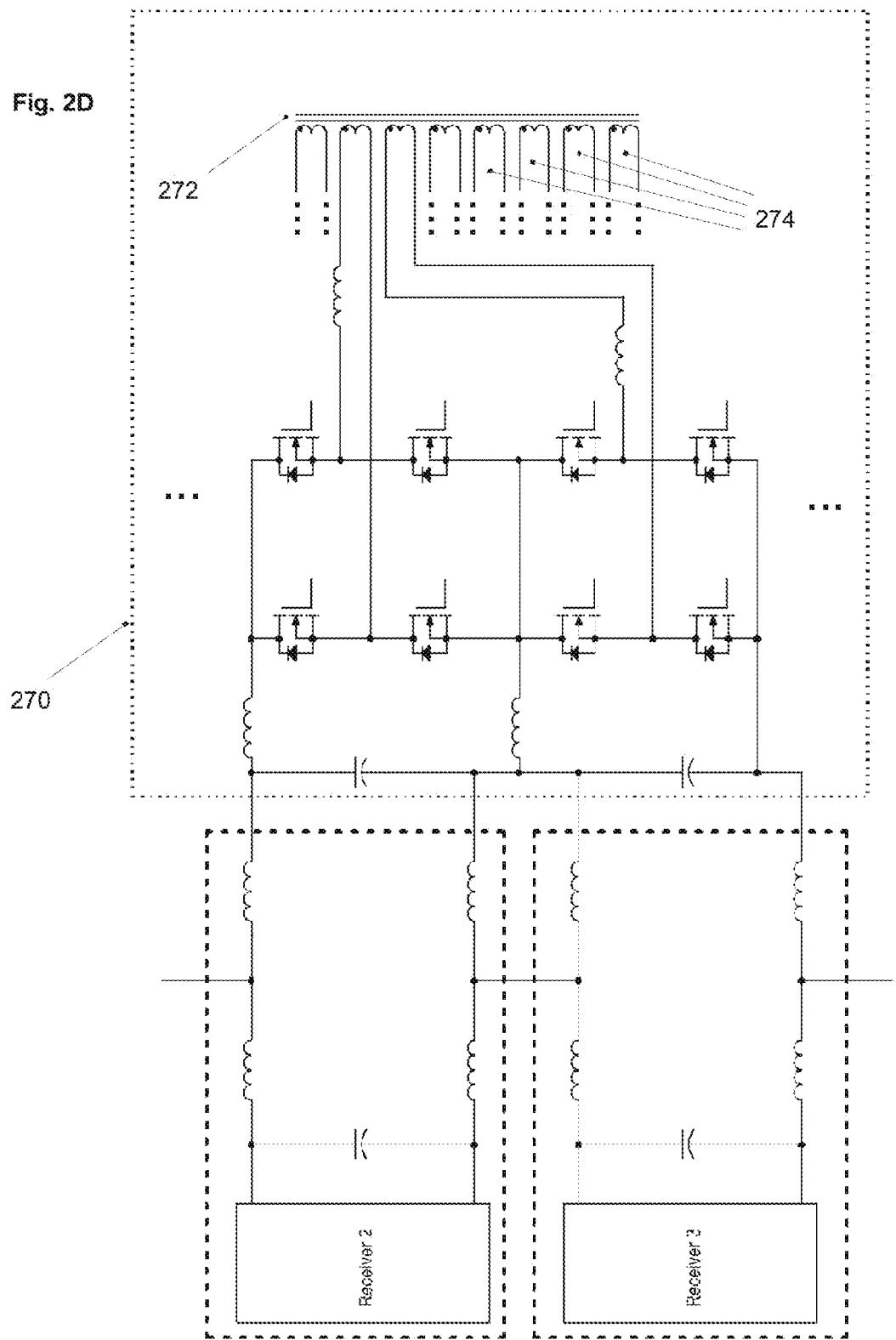

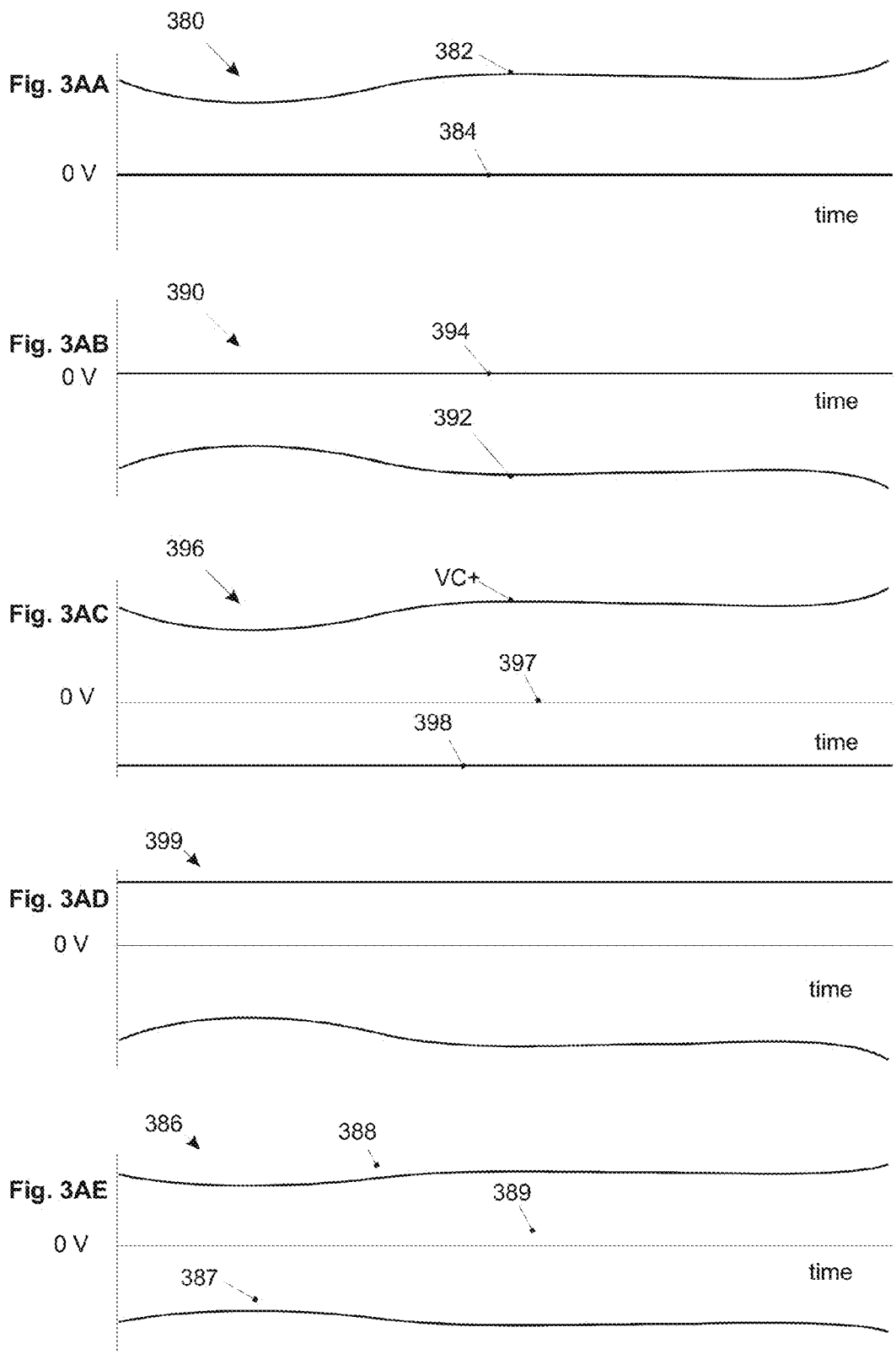

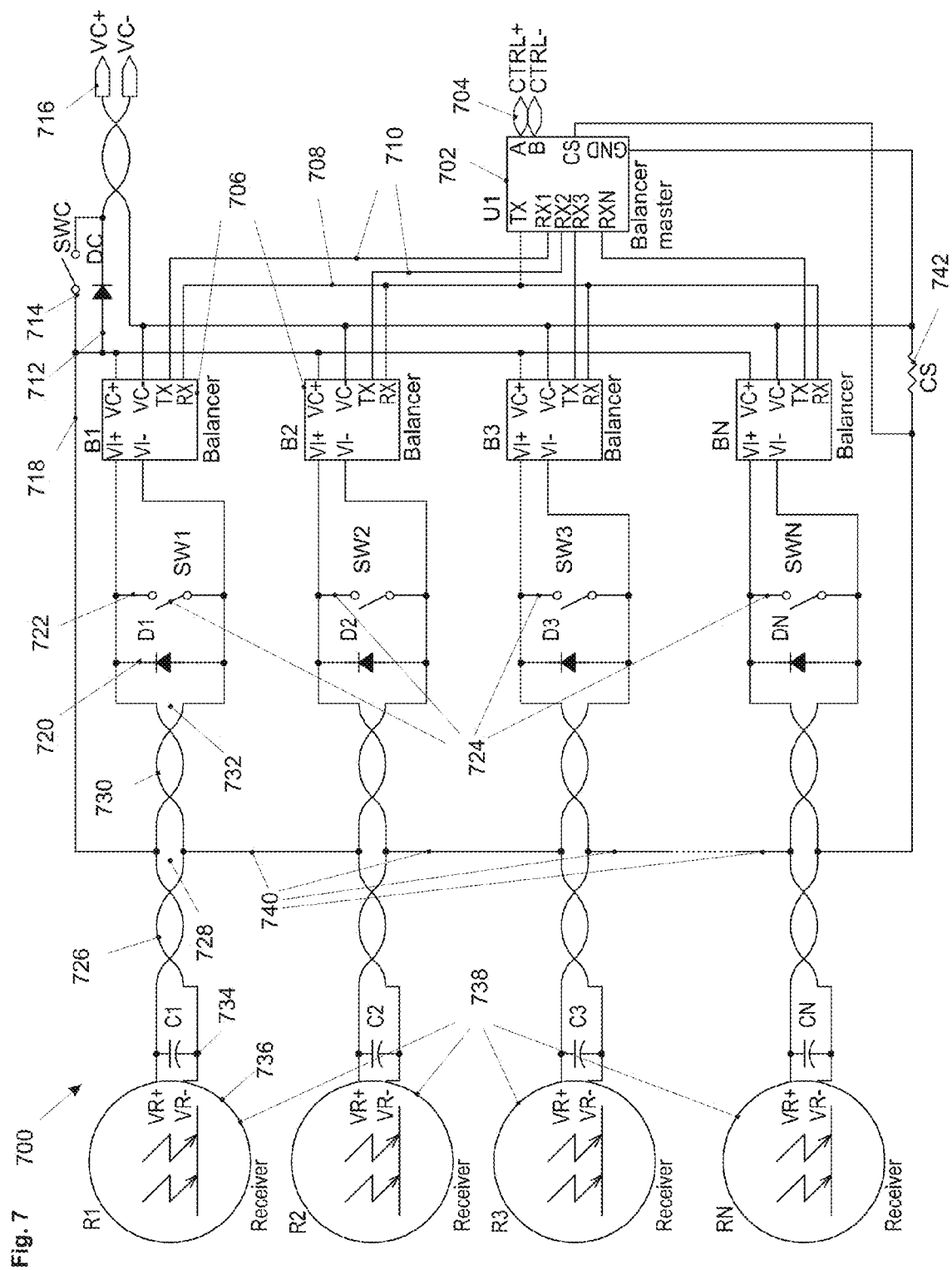

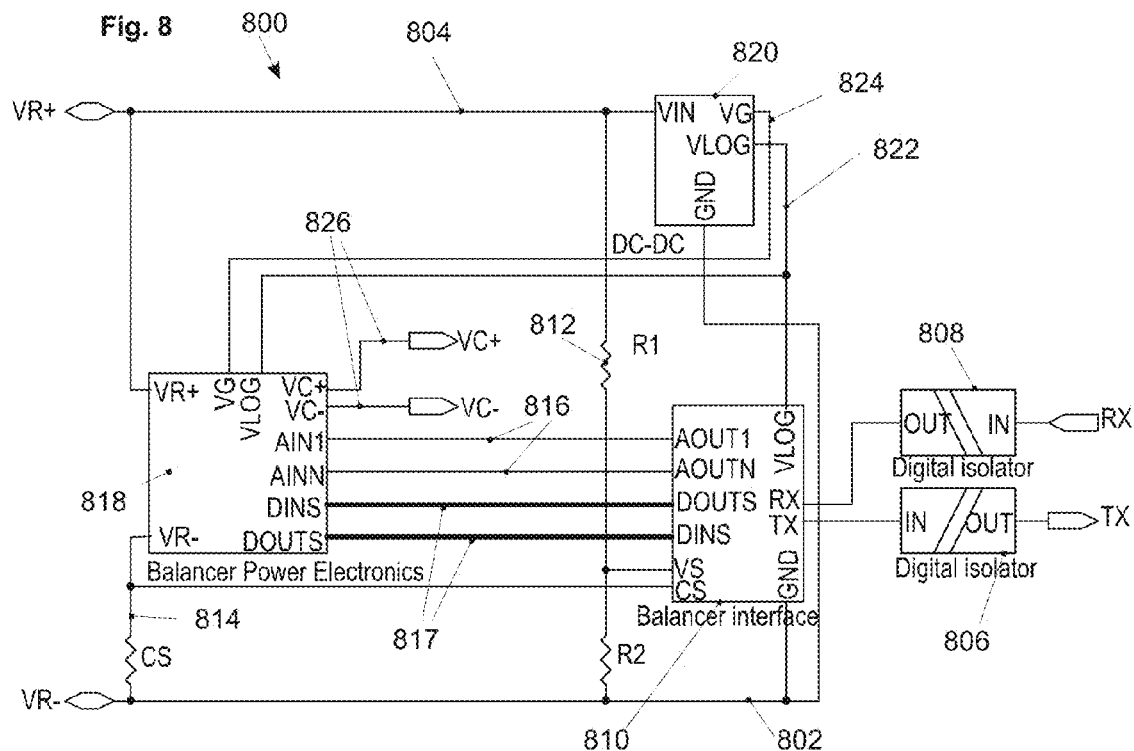

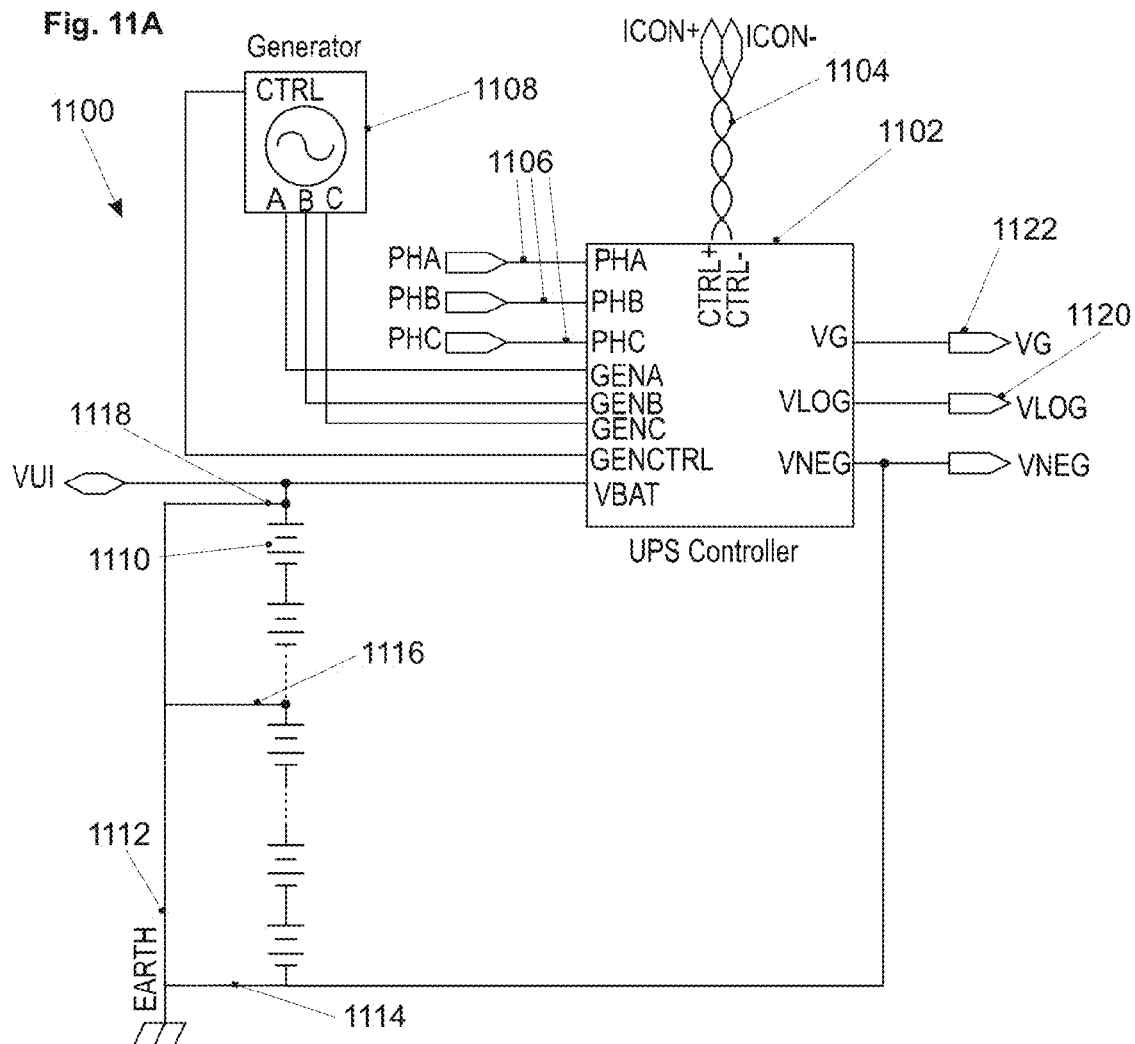

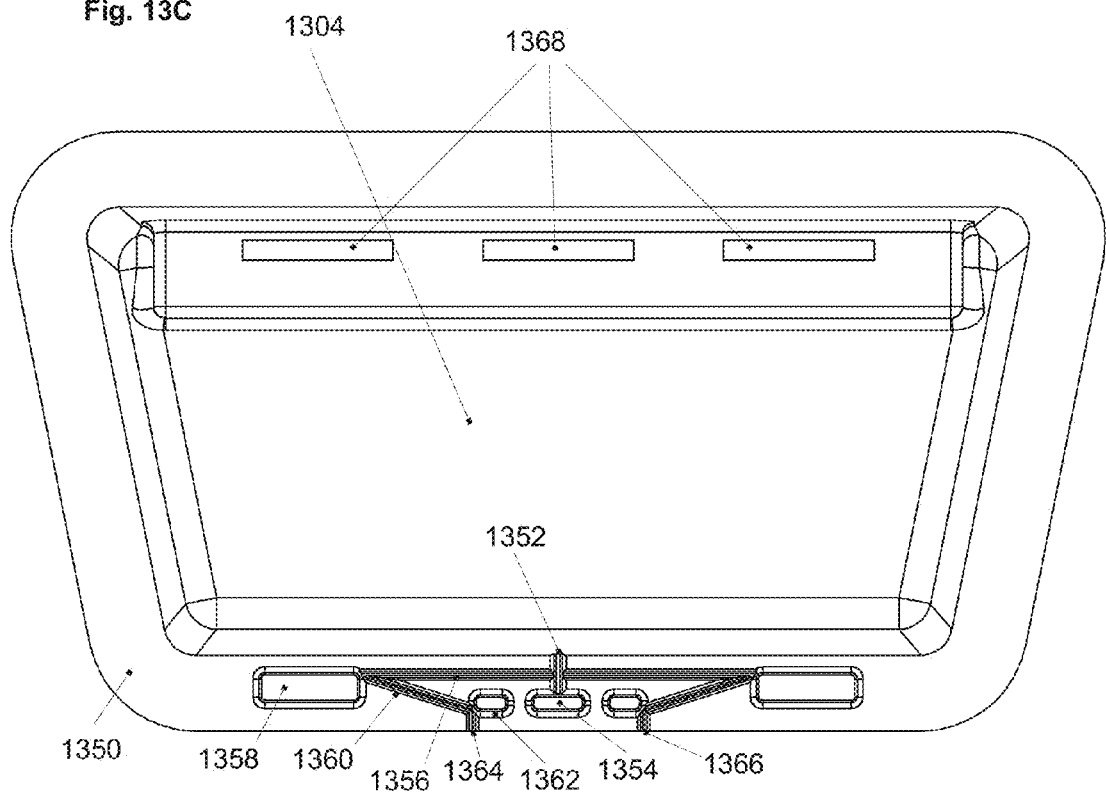

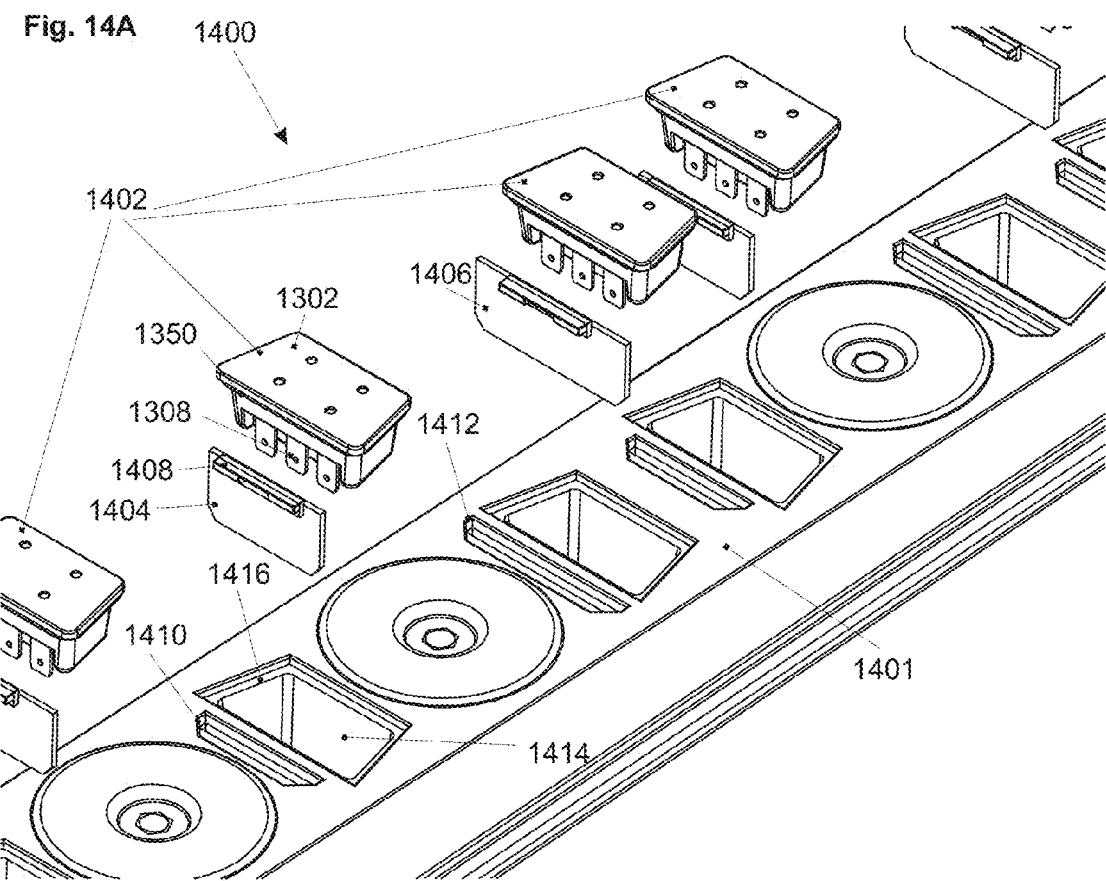

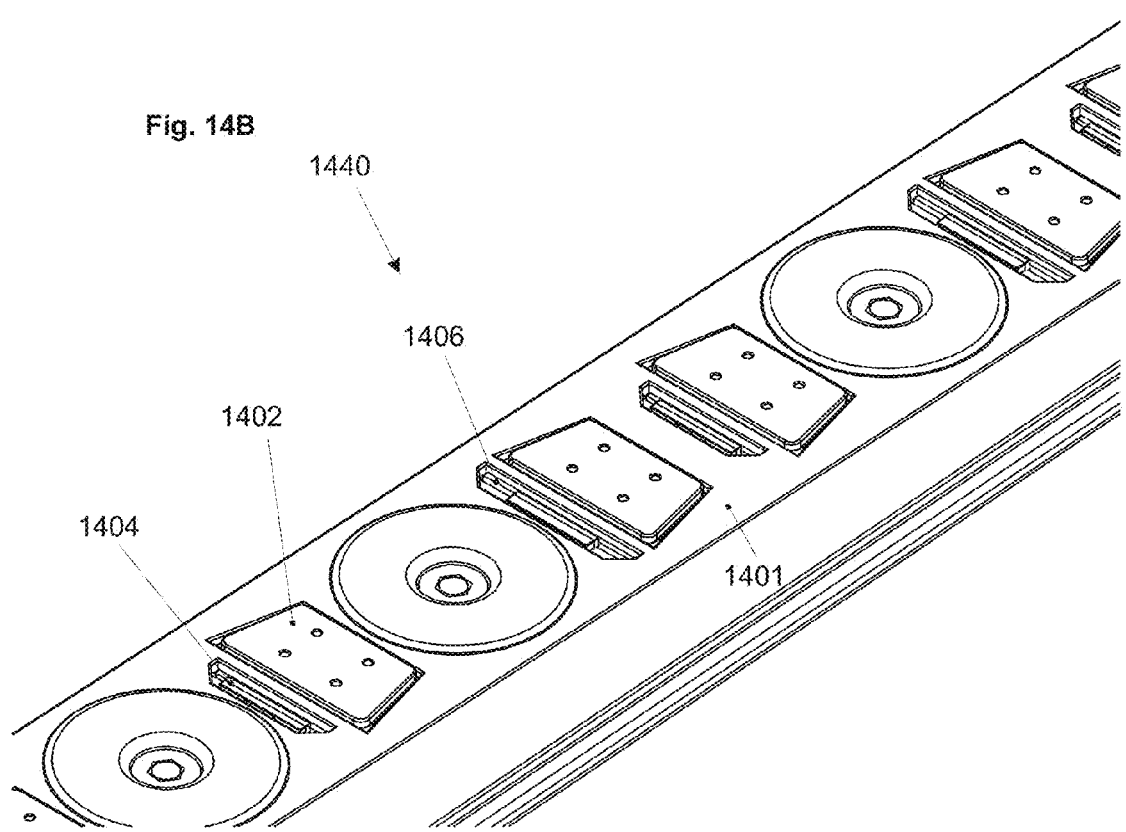

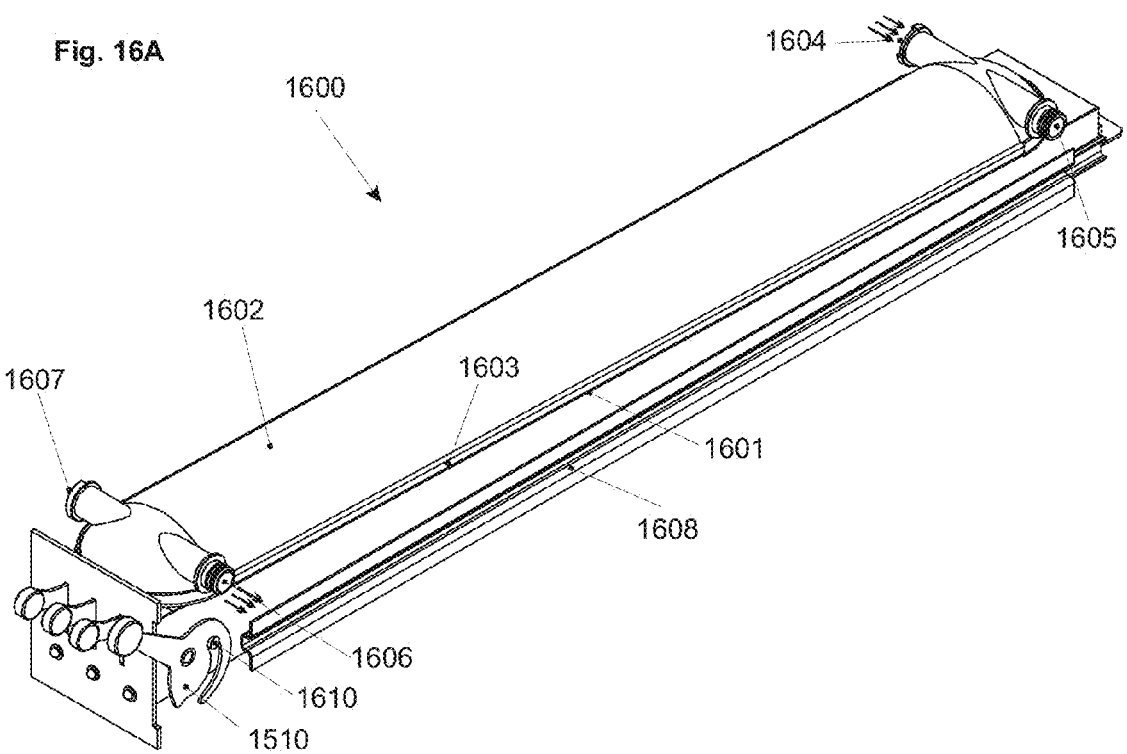

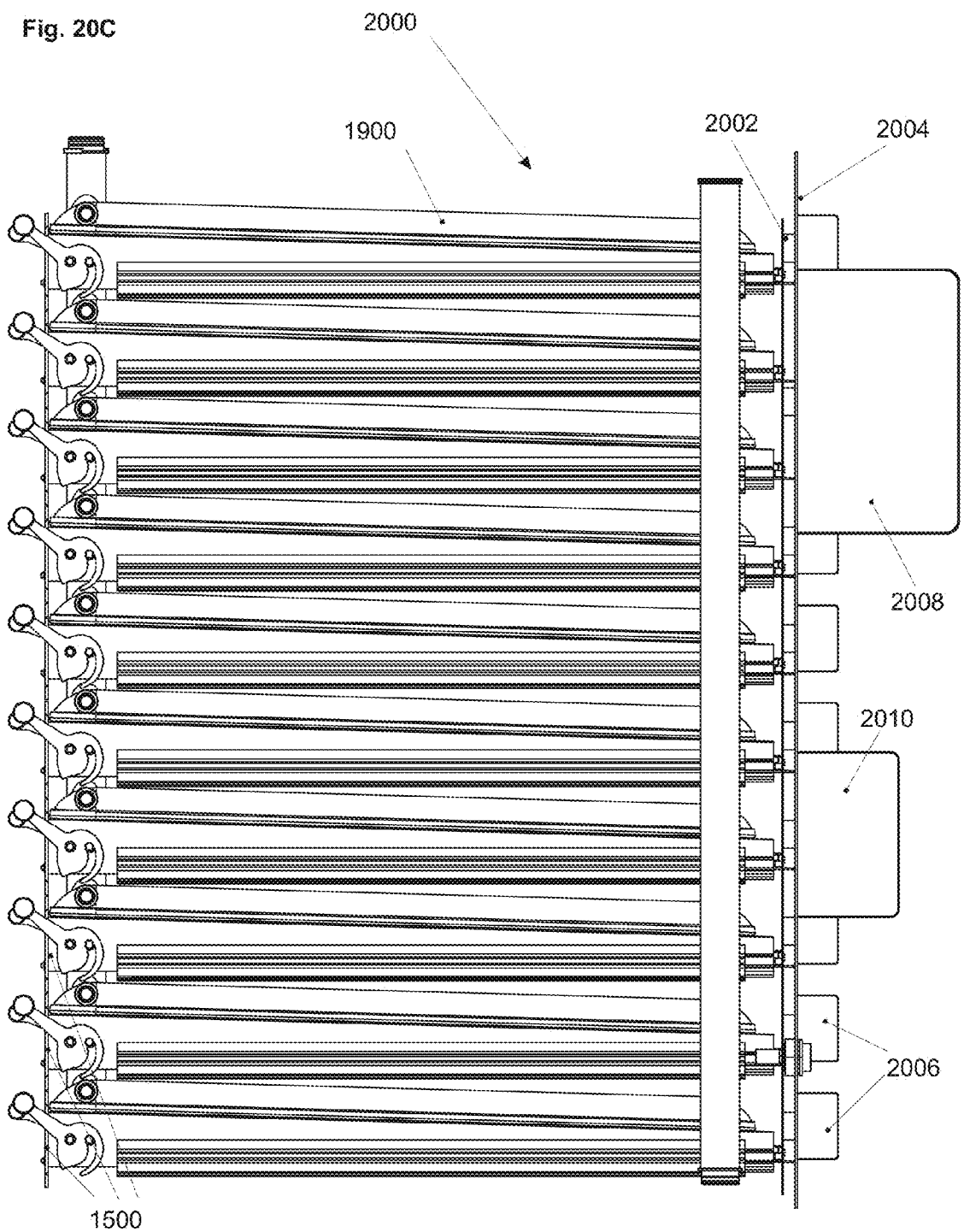

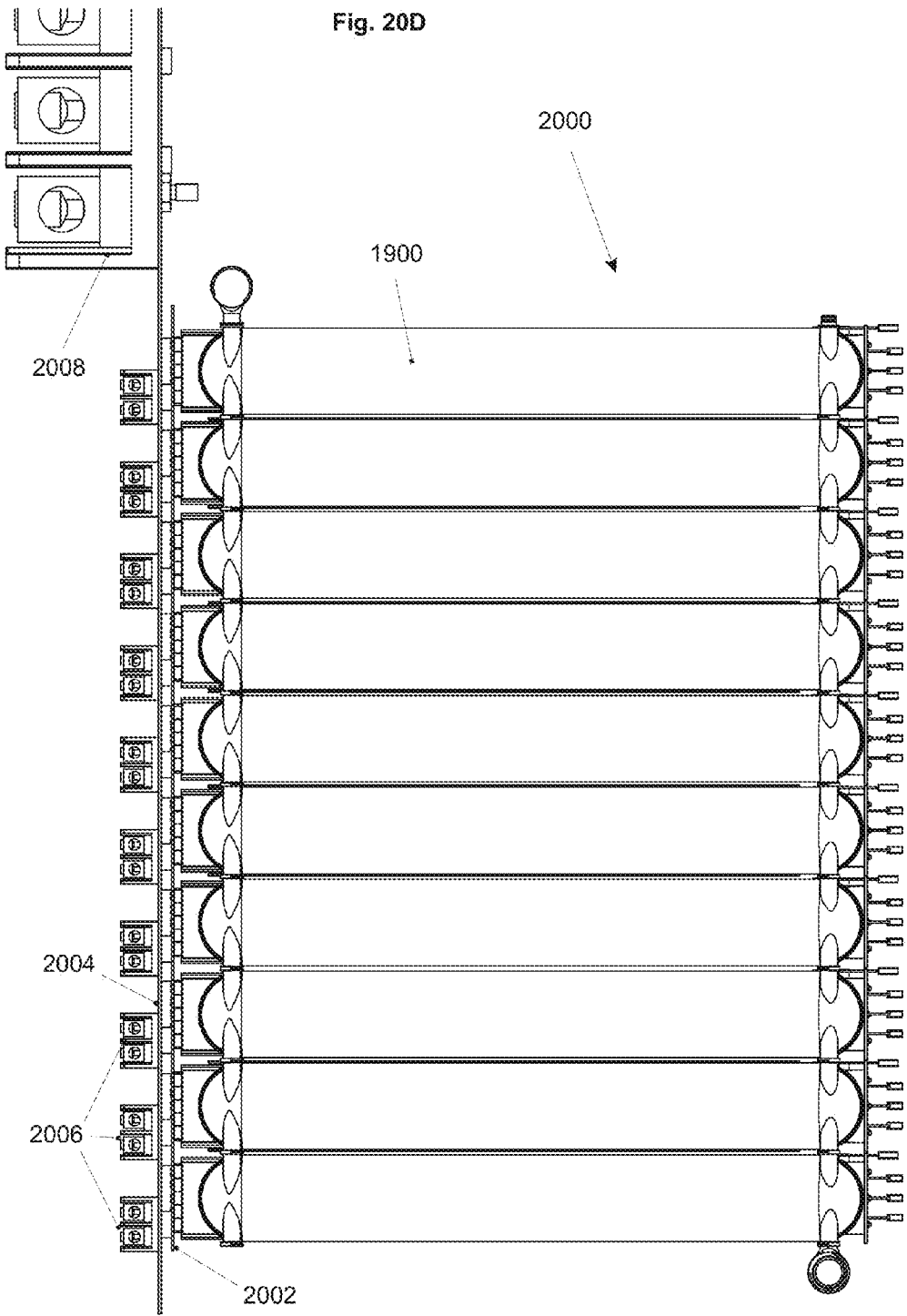

2300

2300

2300

CENTRAL INVERTERS

CROSS-REFERENCE TO RELATED APPLICATION

This application is a continuation of U.S. application Ser. No. 12/782,932, filed May 19, 2010, which claims the benefit of U.S. Provisional Application No. 61/179,606 filed May 19, 2009, which is incorporated herein by reference in its entirety for all purposes. The application is also related to the following applications, each of which is incorporated by reference in its entirety herein for all purposes: U.S. patent application Ser. No. 11/844,888 filed Aug. 24, 2007; U.S. patent application Ser. No. 11/843,531 filed Aug. 22, 2007; U.S. patent application Ser. No. 11/844,877 filed Aug. 7, 2007; U.S. patent application Ser. No. 11/843,549 filed Aug. 22, 2007; U.S. patent application No. 61/299,124 filed Jan. 28, 2010; and U.S. patent application No. 61/310,228 filed Mar. 3, 2010.

BACKGROUND

Solar energy is abundant and sustainable. However, using solar energy to power an electrical grid may offer certain challenges.

For example, photovoltaic cells generally produce a maximum power at a particular voltage and current that depends on the properties of the cell and the amount of illumination. Away from this maximum power point, the conversion efficiency of the cell drops.

A utility-scale power plant may comprise such cells numbering in the thousands, deployed across square kilometers. Given this large scale configuration, it may be difficult to operate an entire plant at peak efficiency.

In addition, the output from photovoltaic cells is typically processed to produce an alternating current to output onto the electrical power grid. This can be difficult to manage with such a large number of discrete PV cells.

Finally, a solar power plant must operate under a range of non-ideal conditions. Examples of non-ideal conditions include a lack of full sunlight, and possible outages on an electrical power grid.

Accordingly, embodiments of the present invention relate to a cost-optimized architecture for a photovoltaic power plant that can operate at or near its maximum production efficiency. Embodiments of the present invention may continue to function under adverse conditions, such as grid outages and lack of full sunlight.

SUMMARY

A power-plant power system architecture employs techniques to reduce the levelized cost of energy imposed by the power system, the elements of which may be unconventional. In one embodiment, a solar energy concentrator in the form of an inflated reflector, focuses light onto a high-concentration photovoltaic receiver. A plurality of these concentrators are grouped into a series-connected cluster that shares control circuitry as well as support structure. Individual concentrators are maintained at their maximum power point via balance controllers that control the flow of current that shunts this series connection. DC current from clusters must transmit moderate distances, e.g., 300-1000 m to a centralized inverter. The inductance of transmission lines is maximized using an air-spaced twisted pair, enhancing the performance of a boost-type three phase inverter. The outputs of clusters are kept separate to individual inverters in a massively interleaved array co-located at a central location. Step-up transformers convert from inverter voltages to grid voltages, and small transformers provide isolation and voltage step-up only on receiver-to-receiver imbalance currents, typically <20% of the total current. These massive inverter arrays can be pre-assembled and tested in rack-mounts in standard shipping containers for convenient deployment.

These and other embodiments of the present invention, as well as its features and some potential advantages are described in more detail in conjunction with the text below and attached figures.

BRIEF DESCRIPTION OF THE DRAWINGS

FIG. 2AA shows a simplified schematic diagram of a bidirectional isolated flyback converter used for bi-directional power flow.

FIG. 2AB shows a simplified schematic diagram of a half-bridge bidirectional converter used for bi-directional power flow.

FIG. 2AC shows a simplified schematic diagram of a bi-directional Cuk converter used for bi-directional power flow.

FIG. 2D shows a balancer circuit that employs a transformer that has isolated, coupled windings.

FIG. 2EB shows a simplified schematic diagram of a uni-directional two-switch forward isolated converter.

FIG. 2EC shows a simplified schematic diagram of a uni-directional isolated Cuk converter circuit.

FIGS. 3AA-3AE show arrangements of cluster voltages according to embodiments of the present invention.

FIG. 7 shows a schematic block diagram of an embodiment of a master/slave arrangement of balancers.

FIG. 8 shows a schematic diagram of an embodiment of a balancer slave according to the present invention.

FIG. 11A shows a UPS associated with inverters according to an embodiment of the present invention.

FIG. 13C shows a view of the base side of the switch module cover.

FIG. 14A shows a simplified mechanical drawing of the assembly of switch modules, low-side modules, and high-side driver modules as would be placed into an inverter slave housing.

FIG. 14B shows an arrangement of low-side and high-side driver modules and switch modules inserted into an inverter slave housing according to an embodiment.

FIGS. 16A and 16B respectively show isometric top front and back views of an embodiment of an inverter slave engaged with its active cooling module.

FIGS. 20A-20D show an embodiment of an assembly of inverter slaves, cooling system, motherboard, and back panel, fitting together.

DETAILED DESCRIPTION

Figure 1A:
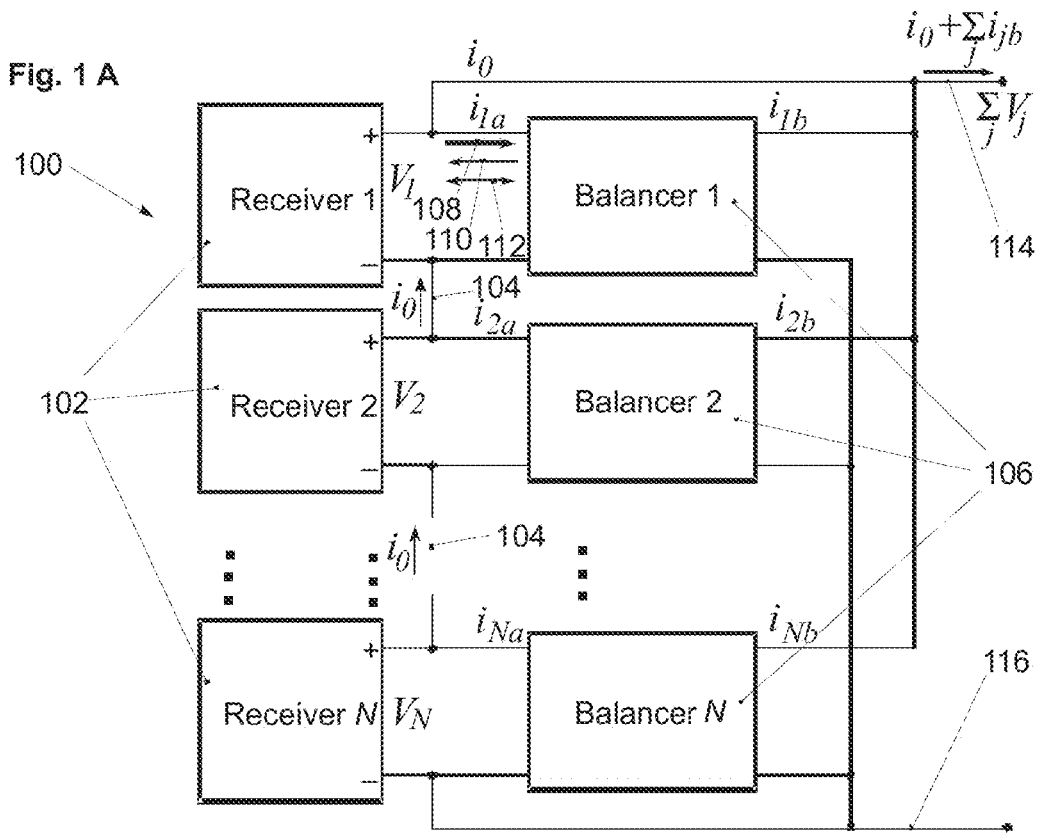
FIGS. 1A & 1AA are conceptual and physical illustrations of an arrangement of balancing circuitry according to an embodiment of the present invention, which supports a cluster of N receivers.

As used herein the "microcontroller" refers to a digital system that can perform a programmed function, e.g., a standard microcontroller, FPGA, CPLD, microprocessor, computer, ASIC, system on a chip, or composite assemblies of parts that can perform a function. As used herein, a switch refers to something whose conductivity can be made to change, e.g., MOSFETs, IGBTs, fets, bipolar transistors, SCRs, mechanical switches, mechanical and solid state relays, contactors, an IGBT in parallel combination with a free-wheeling diode such as a fast-recovery diode, a series combination of a MOSFET and blocking diode oriented oppositely to the MOSFET body diode, a series combination of MOSFETs connected such that their body diodes are oppositely oriented, and the like.

Embodiments of the present invention relate to a concentrated photovoltaic-based power plant for utility-scale electricity generation. An architecture of the plant is driven by at least the following two considerations. First, the plant is designed to be readily scalable to produce power levels relevant to global energy consumption.

Second, the plant is designed to achieve the minimum possible levelized cost of energy. This minimum cost includes various aspects of producing power, including but not limited to initial capital costs, installation costs, maintenance costs, and consumable costs.

According to embodiments of the present invention, power plants are designed that can be routinely upgraded by improved firmware and software, and managed obsolescence of rapidly evolving components. Certain cost savings are based on making maximal use of phenomena and materials that are economic externalities, for example the use of air and soil as structural elements. Other cost savings may be achieved by forming a rigid concave reflector shape of a thin film under air pressure. The architecture of the power distribution system can utilize a similar cost-saving philosophy.

Particular embodiments of the present invention utilize inflated reflective films, or "balloons", to concentrate light onto photovoltaic receivers. Additional details describing various embodiments of inflatable solar concentrator balloon methods and apparatuses, which may be suited for use in accordance with the present invention, can be found in U.S. patent application Ser. No. 11/843,531, which is published as U.S. Patent Publication No. 2008/0047546 and U.S. Provisional Patent Application No. 61/299,124, which are both incorporated by reference in their entirety for all purposes. Additional details describing various embodiments of receiver structures, which may be suited for use in accordance with the present invention, can be found in U.S. patent application Ser. No. 11/844,888, which is published as U.S. Patent Publication No. 2008/0135095, which is incorporated herein by reference in its entirety for all purposes.

Each mirror may reflect light from an approximate 2.25-3 m diameter area to a secondary optic roughly 200 mm in diameter. This secondary optic distributes and further concentrates light by a factor of approximately 2-3, onto a dense array of photovoltaic die, while providing passive optical compensation for pointing-angle errors. Additional details describing various embodiments of secondary optic structures and interconnection of die can be found in U.S. patent application Ser. No. 12/720,429, which is incorporated by reference in its entirety for all purposes.

According to certain embodiments, dies may be series-connected in substrings. These substrings can be joined together in series and/or parallel combinations to provide passive electrical compensation for pointing-angle errors.

Figure 5A:
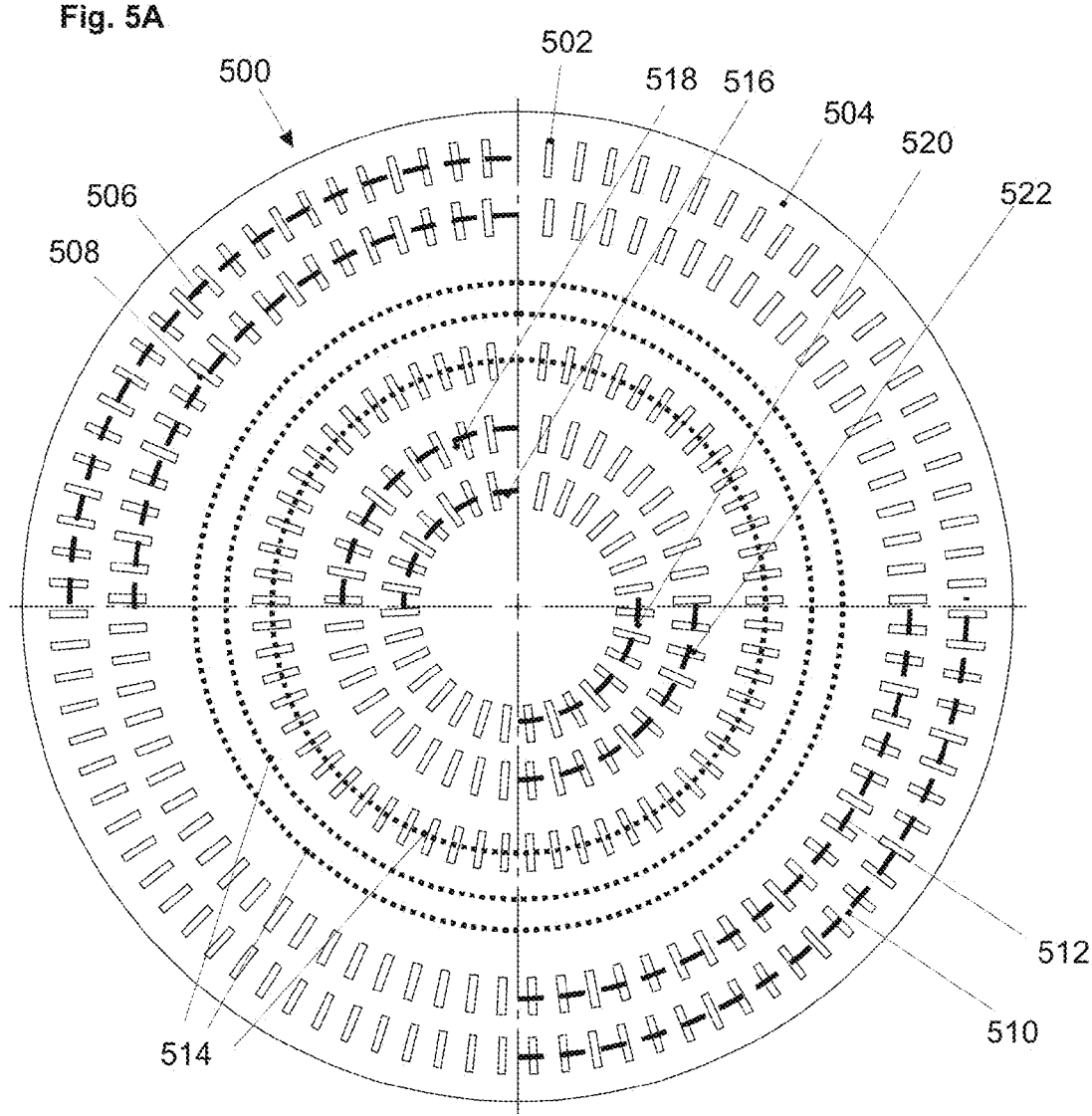
FIG. 5A shows an embodiment of a physical layout of die on a receiver substrate.

FIG. 5A shows an embodiment (500) of a physical layout of die (e.g., 502) on a receiver substrate (504). Some sequences of adjacent die may be series connected in strings, for example 506.

In some embodiments, strings may be paralleled with others to provide substantially the same total power output when pointing is non-ideal. For example, string 506 could be paralleled with string 508, 510, or 512.

In some embodiments, a region of die 514 are substantially series connected. In some embodiments, compensation may be provided near the center, for example via paralleling strings 516 and 518, 520, or 522.

Figure 5B:
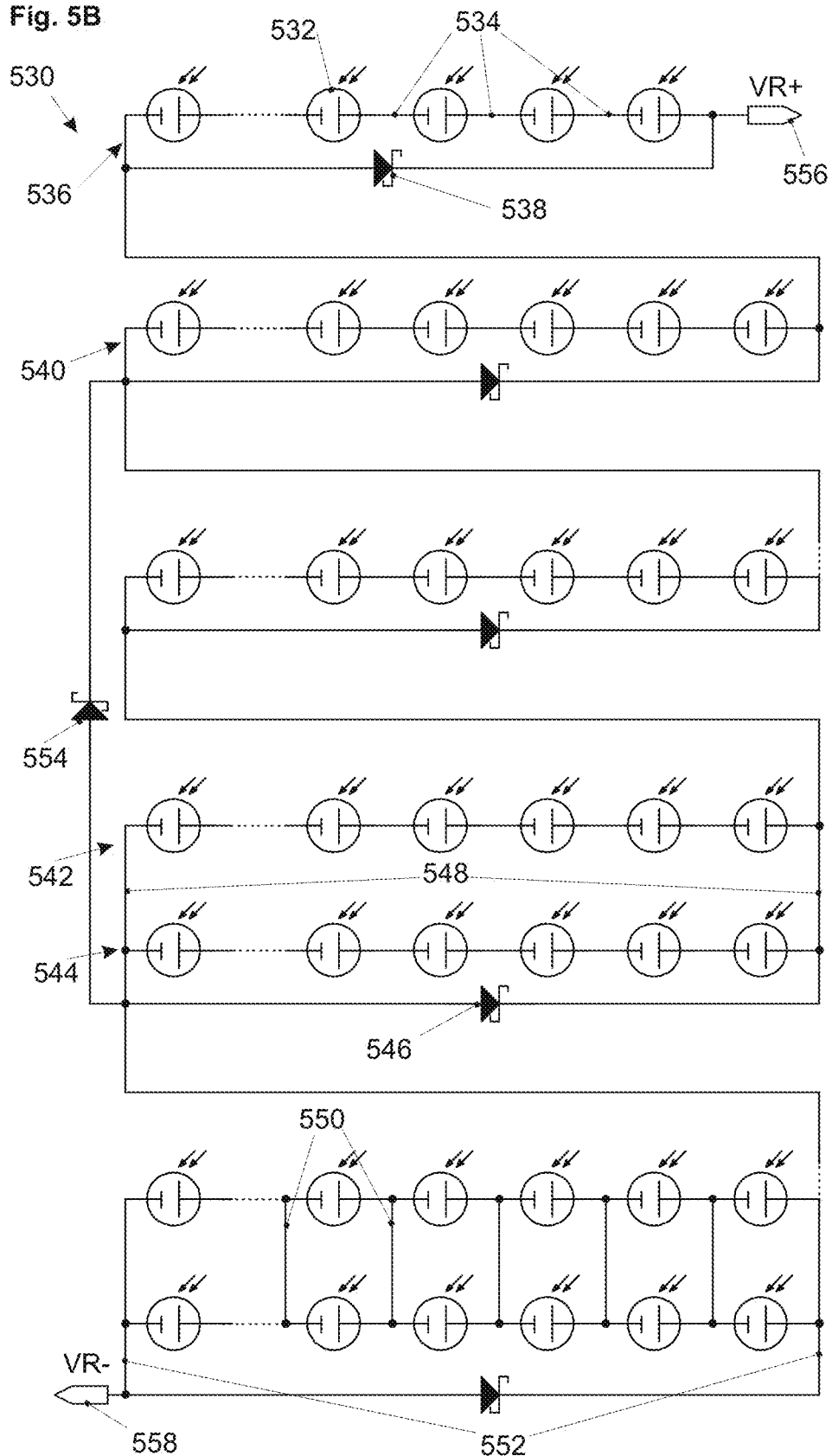
FIG. 5B shows a schematic diagram of a electrical circuit in a receiver showing an assortment of design elements aimed at improving off-design performance.

FIG. 5B shows a schematic diagram 530 of a electrical circuit in a receiver showing an assortment of design elements aimed at improving off-design, e.g., mis-pointed, receiver performance Solar cell die, e.g., 532, are connected in series chains, e.g., 534 into a string 536.

Element 538 may be a diode, typically a Schottky diode because of its low forward voltage drop, that provides an alternate current conduction path when the string current is greater than that supported by the photocurrent produced by the die. Such a case can arise when one or a plurality of die in a string are under-illuminated.

A number of die in a string bypassed by a Schottky diode may be judiciously chosen, and this number may vary from one string (e.g., 536) to another (e.g., 540). Considerations in this choice can include but are not limited to including the reverse breakdown voltage of the solar cells, the receiver-location-specific variation in illumination, and others.

In some embodiments, a plurality of strings, e.g., 542 and 544 may be paralleled, and the combination are protected by a diode 546 across the terminals of the strings 548. In certain embodiments, individual die or a substring of die may be paralleled via connections 550 and bypass diode(s) inserted across the terminals of the strings 552. In some embodiments, bypass diodes, e.g., 554, may be arranged to reduce the cumulative voltage drop of a plurality of bypass diodes if multiple diodes are forward biased. The voltage between receiver terminals 556 and 558 is the receiver output voltage.

It may be desirable to connect a capacitor across this connection in a location that is physically close to a receiver. In concentrated photovoltaic receivers, this connection may be performed at a safe distance from the receiver, away from heat and high illumination levels.

The size of capacitance can be chosen judiciously according to one or more considerations. A smaller capacitor is typically less expensive than a bigger one, but isolates the receiver from current ripple arising from switching circuitry less. This current ripple may reduce efficiency by causing the receiver to depart periodically from its maximum-power-production region.

An excessively large capacitor may cause problems with high inrush currents in switching circuits, such currents being far larger than could be sustained by the receiver. This could thereby increase potential current stresses, and possibly requiring additional protection circuitry and snubbing. One element of certain embodiments according to the present invention is the use of a capacitor that is small enough to obviate or mitigate source-side over-current protection.

An objective of the secondary optic/receiver design is to provide peak power output for the largest possible pointing errors. In some situations, it may be appropriate for a receiver to produce more than one voltage or current output. Such a configuration avoids excessively dividing the receiver voltage by paralleling to a common voltage that all substrings can support.

According to certain embodiments, a target power for each receiver is O (600-1000 W) with a voltage of O (100 V). Using silicon solar cells, this corresponds to approximately 200-400 individual die, given some paralleling of strings. Throughout this description some values are presented using "O," which stands for "on the order of." For example O (600-1000 W) stands for on the order of 600 W to 1000 W.

In certain plant designs according to embodiments of the present invention, concentrators are grouped into a cluster, for example 8 balloons that share a common support and tracking structure and inflation controller. Additional details describing various embodiments of balloon support and/or tracking structures can be found in U.S. patent application Ser. No. 11/844,877, which has been published as U.S. Patent Publication No. 2008/0168981 and U.S. Provisional Patent Application No. 61/310,228, which are both incorporated by reference in their entireties herein for all purposes.

Figure 6:
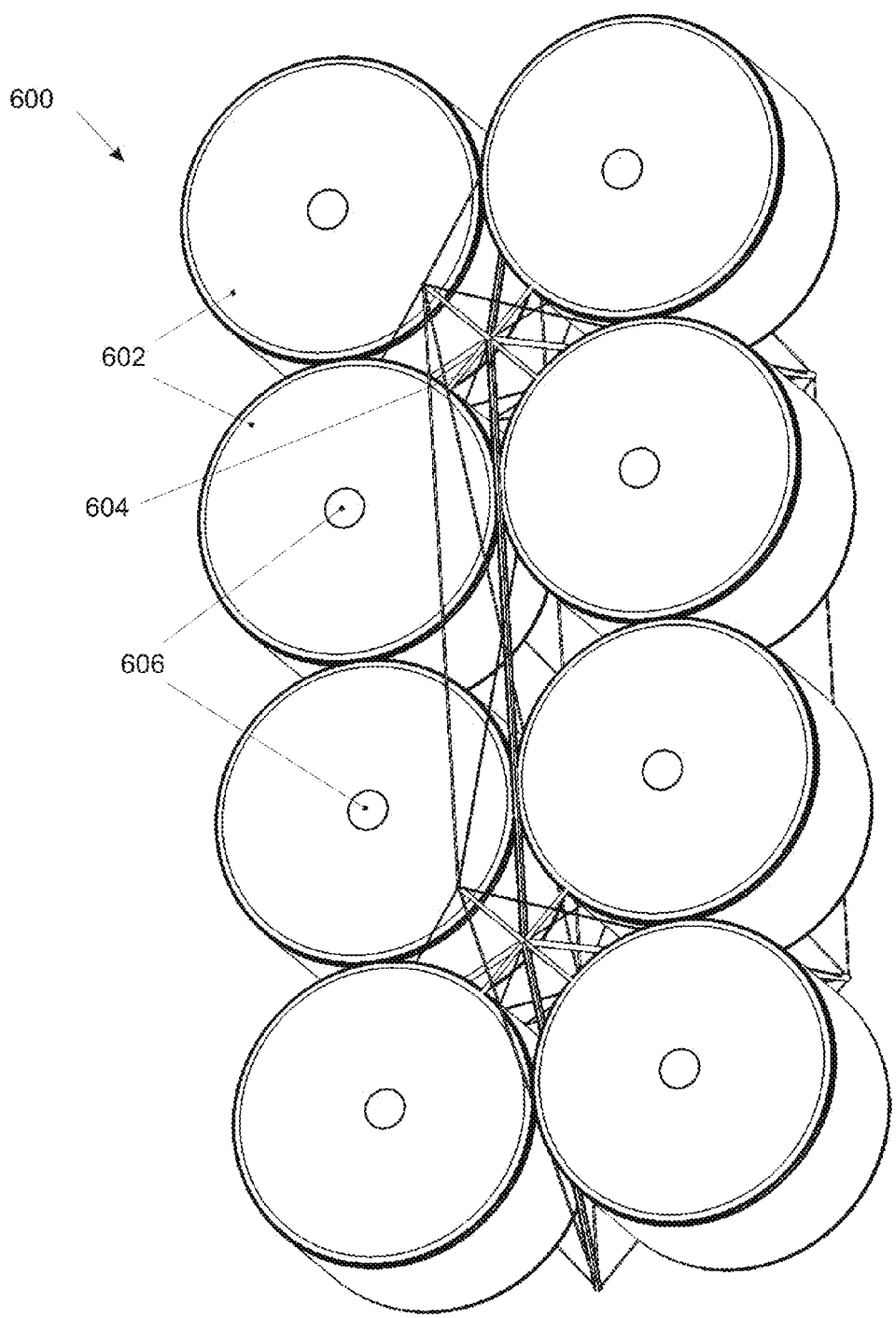
FIG. 6 shows such a cluster of collectors.

FIG. 6 shows such a cluster 600 of collectors. Elements 602 are concentrators, element 604 is a structure that supports the concentrators. Elements 606 are receivers that convert light that fell on the mirrors of 602.

In some embodiments, each cluster produces approximately between 6-8 kW. The output or outputs of individual concentrators are series connected. However, the maximum power of each concentrator is expected to vary significantly (e.g., up to 30%) over the life-span of its reflector. This variance can depend on such factors as the model of the reflector, and variations in the receiver.

In order to maximize the total power produced by the cluster, each concentrator can be operated near its maximum power point, which requires excess or deficit currents to be drawn or supplied individually to each concentrator by a balance circuit. Where the strings are series connected, this balance circuitry only needs to supply or draw imbalance currents (for example <30% of the total load), thereby providing the dual advantage of requiring lower-rated circuitry and dramatically reducing the dependence of the overall efficiency on the efficiency of the balance circuitry.

Details describing various embodiments of interconnection systems for solar energy modules and ancillary equipment can be found in U.S. patent application Ser. No. 11/843,549, which has been published as U.S. Patent Publication No. 2008/0057776, and are incorporated by reference in their entirety herein for all purposes. The DC voltage from each cluster may be transmitted on high-inductance twisted pairs of aluminum wires having optimized cross-sectional area. The length of these individual wires in a power plant may be between about 300-1000 m, because of the relative diffuseness of the solar power resource. With a 0.5 cm air-spaced helix, it is practical to obtain inductances of several hundred micro-Henries over transmission lines of this distance, reducing the need for input filter inductors for properly chosen inverter architectures (and obviating them in some arrangements).

The DC power from each cluster (or in some cases small groups of clusters) goes to individual three-phase inverter circuits that are massively interleaved. The DC power from clusters may not be combined in order to reduce the wire conductor count. In general, a cost of the small amount of extra insulator material to keep the lines separate, is more than offset by the elimination of power-sharing concerns among the interleaved inverters.

A 1 MW plant can include approximately 200 clusters, thus O (200) interleaved inverters are combined to produce precision sinusoidal outputs with minimal filtering. Inverters may be co-localized, simplifying maintenance and high-frequency coordinated interleaving. These inverters are preferably arranged in a factory pre-assembled and tested rack system in a standard shipping container.

According to certain embodiments, the primary power path of these inverters is completely transformer-less. This is because transformers are expensive in up-front capital costs, produce significant parasitic electrical losses, and require ongoing maintenance.

The function of electrical system isolation, may be served by the main power plant step-up transformer at the point of electrical interconnection with the grid. In specific embodiments, this main plant transformer can comprise four single-phase transformers, with three normally in service and the fourth serving as a plant spare. The transformers will also be co-located with the inverter (within ~30 m).

This above description is specific to a particular embodiment. However, the approaches to power extraction, and the hierarchy of receiver, cluster, and centralized inverter described herein, are widely applicable to high-performance, cost effective concentrated and one-sun photovoltaic energy conversion.

Design of a power plant according to embodiments of the present invention, may be guided by one or more of the following principles.

Efficiency may be pursued only as cost justified. This is due to the marginal cost of increased DC power production of a technology-specific cost per Watt, for example less than about $0.50-5.00/W.

The greatest result may be achieved utilizing the fewest resources. For example, soft switching may be employed as much as possible without adding cost or complexity. As another example, sophisticated timing techniques and interleaving may be exploited to achieve the best performance out of hardware.

Complexity in software may be favored over complexity in hardware. However, it is important to ensure that the system is tolerant of microcontroller overhead tasks, and to reduce risk by judicious use of analog circuitry (for example managed one-cycle control).

Where possible, switching is performed only on imbalance currents or mismatch voltages. Active operation is only on the margins.

Long wire runs should be DC at the highest practical voltage, with managed Electromagnetic Interference (EMI)/Radio Frequency Interference (RFI) and inductance. For example, a twisted pair with controlled spacing and/or flattened twisted pair is used. A spacer could be formulated with material to augment inductance with low loss, if cost justified.

Avoid placement close to ferro-metals unless specifically designed for low eddy current/hysteresis losses so interconnect inductance is more nearly ideal.

AC runs could follow the shortest possible paths to the voltage-step-up transformers (for example <10 m).

Large voltage step-up/step-down operations can be performed only once, and only where a transformer is otherwise required, for example for isolation. A turn ratio on the isolation transformer can be employed to optimize efficiency.

Chopper/switcher circuit architectures may be utilized that benefit from the inductance of the interconnect wires. An example is where the inductance of the interconnect wires replaces or is in series with, a discrete inductor.

Where practical, DC currents from separate sources are not combined. Rather, the DC currents are run parallel to separate switching circuitry in order to avoid issues of power balancing.

Separate switching circuitry may be massively interleaved. This interleaving is finely timed in order to reduce switching stresses.

Separate switching circuits may be grouped to one location, and in some cases to one enclosure. Such grouping can minimize component duplication, facilitate interleaving and high-frequency communications and coordination, minimize enclosure cost, minimize maintenance costs, minimize enclosure and interconnection costs, etc.

Water cool switches, capacitors, and/or inductors can be used to save on heat sinks, and extend component life, reduce size, eliminate fans and openings to the environment.

Elements that tend to fail may be grouped in minimum units, e.g., single IGBT or MOSFET+driver, and these groupings are made easily and safely swappable in the field. These are consumable parts, and should be minimized along with the cost of replacing them. The system can also be designed to eliminate throwing good parts away with bad ones because of co-packaging, for example the case with IGBT "six-packs."

Elements are packaged soundly to prevent secondary damage or contamination on failure. An example of this is packaging to contain exploding electrolytics or burning IGBTs.

A hybrid of analog and digital control may be used for the best dynamic response and pseudo-static optimizations. This is referred to as managed one-cycle control (mOCC).

The system may be designed to be able to oppose non-ideal grid waveforms, such as departure from sinusoidality and to control production of imaginary power. This opposition could require the attention and intervention on a sub-cycle or cycle-to-cycle basis of a microcontroller. This behavior may be useful for solar power plants to become majority power producers.

Where possible, systems are designed for unconditional safety in the event of microcontroller malfunctions. Ideally, the systems should continue to work at a reduced performance level.

Massive interleaving is favored over large passive components to produce high-quality output.

The interleaved inverter may be designed to degrade gracefully when inverters fail or clusters are taken offline.

Essential communications can be performed using wired connections, preferably using RS485 physical layers or similarly mature and robust links. Wireless links may be used for non-essential control or monitoring or for sparse auxiliary equipment such as weather stations and video surveillance/monitoring/event troubleshooting. Barring new developments, optical links should be used only if necessary because of cost concerns.

Microcontroller firmware can be updated from a central location, for example via a plant-local RS485/Ethernet network.

Remote debugging and control may be implemented over a plant-local network. For example, the plant network can comprise RS485/Ethernet and preferably via a non-local network such as the internet.

All elements of the power system can be designed to survive lightning strikes to the plant without damage, via lightning-rods, grounding, and appropriate transient suppression at entry and exit points of shielded enclosures.

Receiver Design

The receiver may contain a ~200-mm diameter, one-layer, high-heat-transfer, printed circuit board bearing a radial array of rectangular silicon solar cell die attached to printed circuit traces via eutectic solder and aluminum wire or ribbon bonds. The individual die may be series connected into a number of strings. The board is kept cool via impingement of numerous immersed jets of cool water on the back side of the printed circuit board that is electrically insulated from the front circuitry by a thin thermally conductive ceramic dielectric.

The power from strings is carried via multiple conductors from this primary printed circuit board to a nearby conventional printed circuit board, for combining in parallel and series arrangements to reduce the effect of concentrator misalignment on power output. An example is shown in FIGS. 5A and B. It is possible that the final receiver supplies more than one voltage/current through separate outputs if it is impractical to achieve enough passive electrical alignment-error compensation otherwise. This secondary board may also contain filter capacitors, bypass diodes, active switching circuitry, and sensing circuitry. Water cooling is available for this circuit board, if needed.

This board can be located at the interior of the concentrator at heights that make servicing difficult. Therefore it may not be an ideal location for components that require periodic replacement, such as electrolytics.

In one embodiment, the target voltage for the receiver is O (100 V @ 8 A). This voltage may be produced by a series and parallel combination of ~200 to 400 silicon solar cell die illuminated at several hundred suns concentration. For minimal support structure stiffness requirements, the mass of the receiver should be kept at a practical minimum.

The following summarizes one or more characteristics of particular embodiments of a receiver.

The receiver produces ~O (100 V @ 8 A).

The physical receiver comprises an approximately 200-mm diameter one-layer die-mount board with conventional secondary PCB for string combining and/or active power circuitry and/or sensing circuitry.

The receiver employs passive electrical compensation coupled with passive optical compensation.

The receiver provides for active compensation of imbalance currents/voltages of substrings to approximate MPPT across in-homogeneously illuminated receiver.

The receiver includes high-frequency filter capacitors, preferably on a secondary, conventional, printed circuit board.

The mass of the receiver should be as low as practical.

Mounting low-frequency filter capacitors on the receiver may not be favorable because of thermal stresses, extra mass, and difficulty of replacement.

Water cooling is available for electronics at the receiver.

Cluster Design

A cluster comprises multiple concentrators in proximity, for example as shown in FIG. 6. In certain embodiments, a cluster comprises O (8) concentrators. Clusters of concentrators share support structure, track together, and share control circuitry in an easily serviced enclosure, typically within about 8-10 m of wire distance of the furthest receivers.

To reduce the number of series-connected die to a minimum for cost and reliability considerations, in certain embodiments the receivers may supply only O (100 V). These modules may be connected in series to obtain a voltage O (600-1000 V) at ~8 A for efficient plant-scale (e.g., 300-1000 m) DC-transmission to our inverter circuitry.

In particular embodiments, circuitry is needed to shunt currents to and/or from each receiver to ensure each receiver is individually power optimized. This circuitry is referred to as "balance circuitry."

An analogous approach could apply to paralleled receivers, in which a power supply/sink provides a boost voltage, or extracts a voltage from each receiver so that each receiver operates at its maximum power point at a common output voltage. Such an arrangement might be particularly advantageous for series of high-voltage solar cells, such as triple-junction cells, which more readily reach high voltages.

FIGS. 1A & 1AA are conceptual and physical illustration of an arrangement 100 of balancing circuitry according to an embodiment of the present invention, which supports a cluster of N receivers 102. The receivers are series connected via conductors 104 through which a common current $i_0$ flows.

An array of "Balancers" 106 either unidirectionally draws current 108, unidirectionally supplies current 110, or bidirectionally passes current 112 through shunt paths. This allows each receiver to supply a total current different from $i_0$, such that each receiver independently operates at its maximum power point.

The output voltage 114 relative to the current return 116 is the sum of the receiver voltages. The output current is the sum of the common current $i_0$ and the individual Balancer currents $i_{jb}$, which could be positive or negative depending on the design of the Balancers.

The specific balancing arrangement shown in FIG. 1A represents just one embodiment, and alternatives are possible. For example, other embodiments may employ parallel input connections and imbalance-voltage balancing, drawing and supplying power to or from a separate DC or AC line, etc.

Most of the gain of the Balancer arrangement lies in operating only on correcting or adjusting imbalances, rather than adjusting the full receiver power. The particular arrangement of the embodiment of FIG. 1A may minimize the cost of routing imbalance power through the plant, relative to some of the alternates just mentioned.

Figure 1B:
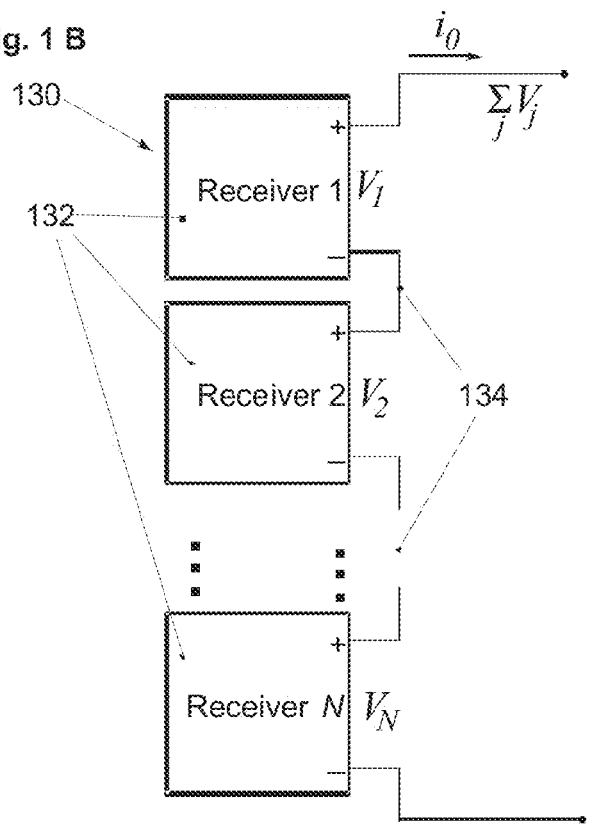
FIG. 1B shows a conventional cluster of series-connected receivers.
Figure 1:
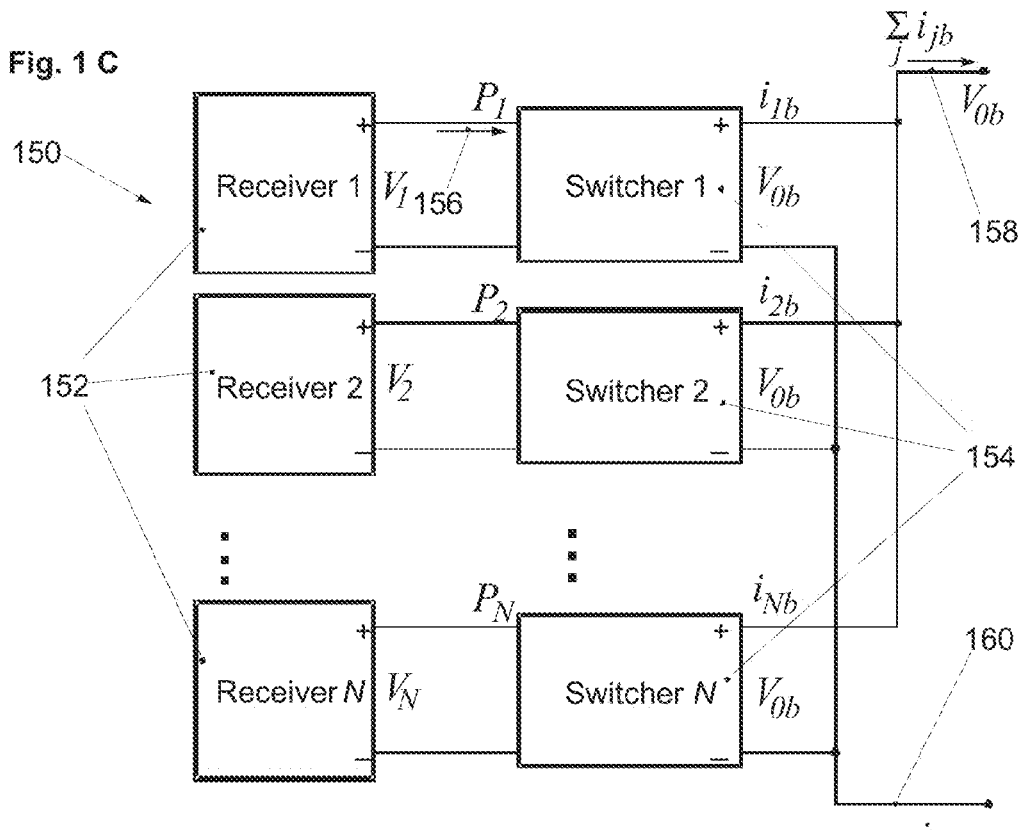
FIG. 1C shows a conventional approach to handling power imbalances among clusters of receivers.
FIG. 1D shows a conventional cluster in which maximum-power-point tracking switchers are series connected.
FIG. 1E shows an alternate arrangement of balancer circuits which can pass current bi-directionally between each receiver without the need for a direct connection to each other or a connection to a power bus.
Figure 1:
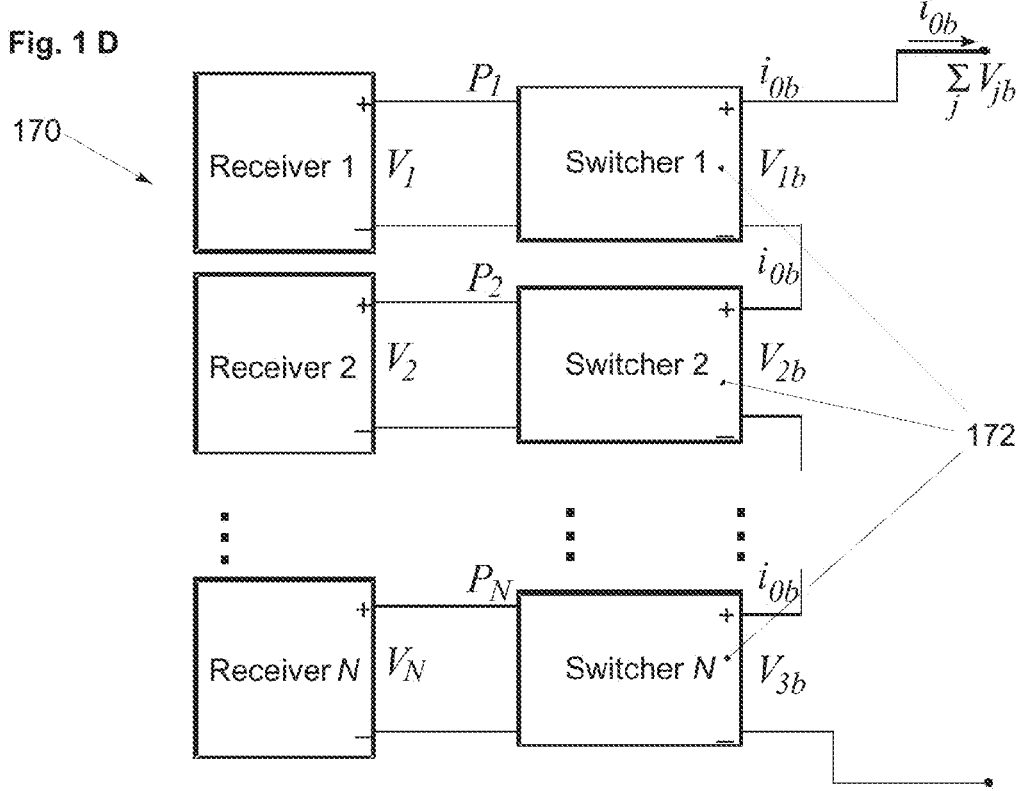

The Balancer system according to an embodiment of the present invention shown in FIG. 1A, may be contrasted with conventional configurations. For example, FIG. 1B shows a conventional cluster 130 of series-connected 134 receivers 132. In this approach, all receivers must pass the same current, producing the maximum possible power only if the receivers and their illumination is suitably matched.

FIG. 1C shows a conventional approach 150 to handling power imbalances among clusters of receivers 152. Separate switching circuits 154 operate so as to draw the maximum power 156 from each receiver, producing a common output voltage $V_{Ob}$ to paralleled outputs across 158 and 160.

Alternatively, FIG. 1D shows a conventional cluster 170 in which maximum-power-point tracking switchers 172 are series connected, producing a common output current. These switchers can be converters, producing a DC output or inverters, producing one or more phases of AC output.

In the case of either of the convention approaches shown in FIG. 1C or 1D, the switching circuit operates on 100% of the output power of the receiver, requiring correspondingly large and expensive components and must be highly efficient to be justified if expected imbalance currents are small. As a result, the extra power harvested by circuits in FIG. 1C and FIG. 1D is at best marginally cost justified over the interconnection approach in FIG. 1B. In contrast, the Balancer approach in FIG. 1A overcomes these cost issues without sacrificing output power.

Figure 1E:
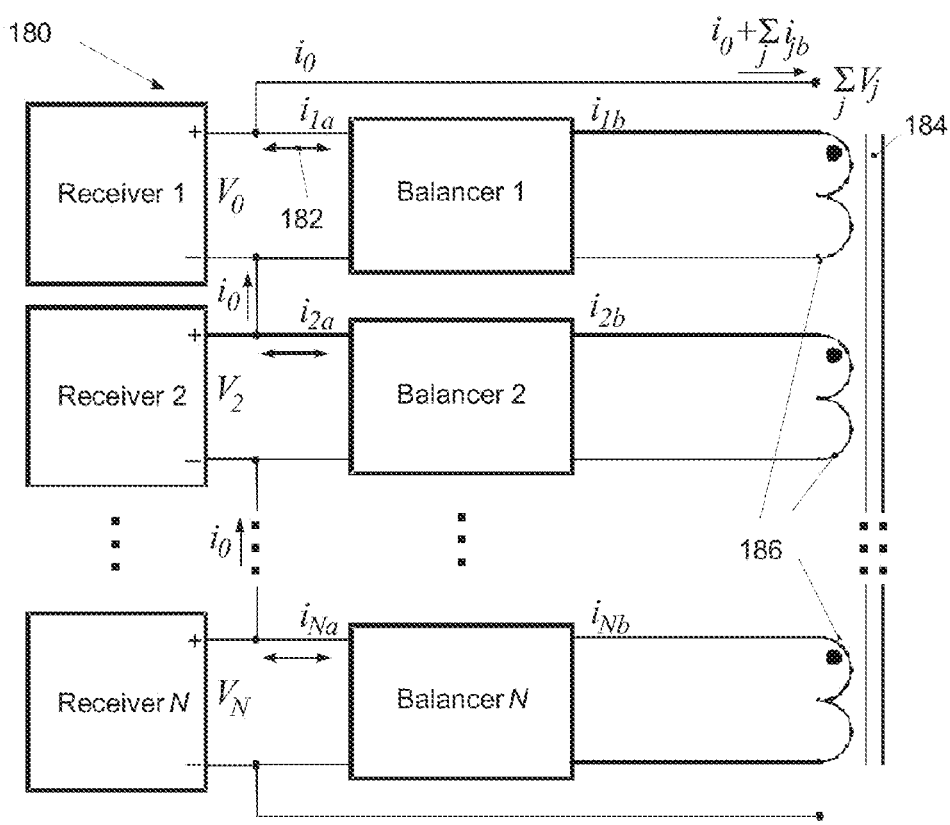
Figure 1A:
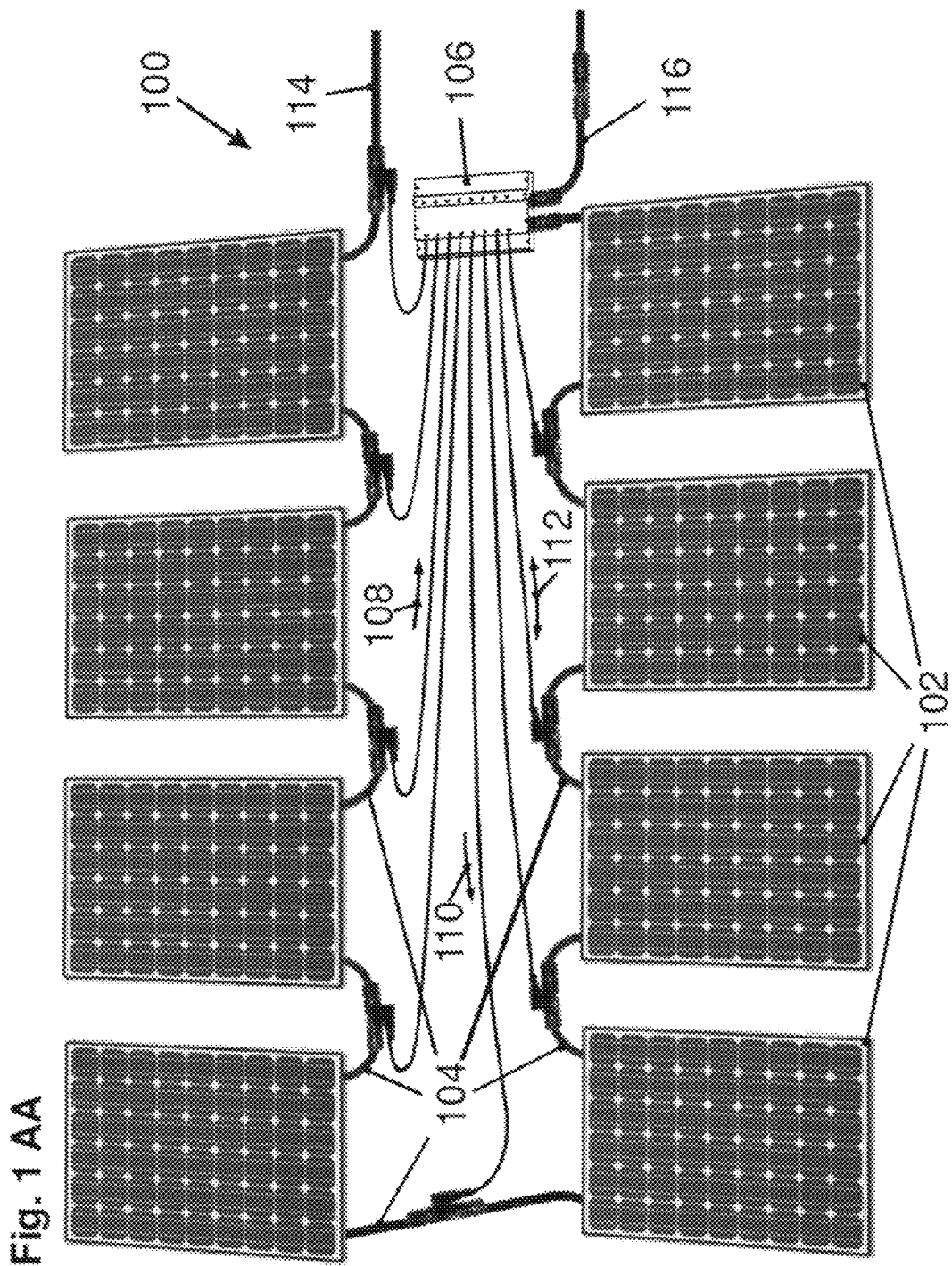

The design 180 in FIG. 1E shows an alternate arrangement of balancer circuits which can pass current 182 bi-directionally between each receiver without the need for a direct connection to each other or a connection to a power bus. Instead, balance currents are passed via at least one transformer 184 which inductively couples outputs of balancers 186.

According to embodiments of the present invention, the Balancers may be designed to support a maximum current imbalance that is considerably lower than the maximum expected series current $i_0$. In normal operation, it would be unlikely for receivers to exhibit more than a certain variation in output power relative to each other, for example between about 5-20%. The Balancer may be designed for best efficiency in this normal range and/or a reduced efficiency up to a maximum power rating. This de-rating of the balance circuit can considerably reduce cost.

Moreover, the required efficiency of the balance circuit is much lower than if it operated on the full power output of the receiver. For example, if a Balancer has an efficiency of 80% while Balancing 20% of the receiver current, the overall power efficiency, assuming no series connection losses, is a respectable 96%. The reduced efficiency requirements translate to further cost savings.

If maintaining the maximum power point requires exceeding the maximum power limits of a Balancer, the weakest-performing active receiver in a cluster could be shut down. Balancers that draw excess receiver current as in 108 must be coordinated (for example via communications or handshaking) because a maximum power condition at a Balancer associated with the top-performing receiver can prompt the shutdown of the bottom-performing receiver. In some cases, especially for larger N, shutting down a weak-performing receiver may be prompted by a net reduction in output associated with inefficiencies in the Balance circuits.

In the event of shut down, the Balancer may 1) actively short-circuit its associated receiver (in the manner of a synchronous rectifier switch using mechanical relays or solid state switches), 2) passively bypass the associated receiver with a diode, or 3) perform no operation if its associated receiver has acceptable bypass elements. If the receiver uses synchronous rectification, it may be paralleled with passive bypass circuitry so the Balancer may periodically deactivate the bypass switch to check to see if the receiver performance has changed. It may be advantageous to choose a balance-circuit architecture that utilizes switches that can short-circuit the receiver when kept turned on.

The power used by a balancer circuit can be supplied in whole or in part by the voltage $V_j$ from its associated receiver or by the voltage $\Sigma V_j$ from the cluster or from an alternate power source. The power source for critical balancer circuitry (such as microcontrollers), must be designed and managed judiciously to ensure devices do not "brown out" or enter indeterminate states, and to ensure that the system remains in control and responsive as needed, regardless of energy production from its associated receiver and to a lesser extent, its cluster.

Receivers may be routinely inoperative, for example during and awaiting concentrator maintenance. Mis-pointed clusters will also lose locally generated power. Careful consideration of the power source at least for critical elements of the balance circuitry is necessary. It may be advantageous to power this critical circuitry via a separate non-volatile power source, or for the cluster voltage to be maintained at a minimum level that allows critical operations via a low-power centralized supply.

The power supplied to or harvested from the modules, is locally provided at least substantially from the solar cells. Excess power harvested from a receiver may be injected to the 600-800 V output of the array. For an 8-receiver cluster, this involves a voltage step up of ~8× from the receiver voltage. This voltage step up can be made efficient by utilizing an appropriate winding ratio in the isolation transformer that is needed to allow balance circuits to float relative to the cluster output. Such large voltage adjustments are generally to be made only where a transformer is otherwise required, and a turns ratio is employed judiciously to maintain efficiency.

Boost and buck or buck/boost circuitry could be used in such balance circuits. The same voltage-ratio considerations apply for circuits that borrow power from this cluster output and circuits that shunt power bidirectionally. A principal advantage of utilizing locally-produced power is a reduction of interconnect losses and costs.

The Balancers shown in FIG. 1A have inputs and outputs that are isolated. The voltage at the output is ~N times that at the input, since it is the result of series connecting as many as N receivers, given that some receivers may be bypassed. The balancer circuit may therefore use an isolation step-up transformer having an appropriate turns ratio to ensure efficient switching behavior.

The Balancers are able to detect the maximum power point of the receiver. This generally requires the Balancer to have information about both the receiver output voltage and the total receiver output current. According to the arrangement in FIG. 1A, the Balancers can readily measure the currents $i_{ja}$ and voltages $V_j$, but cannot as easily measure the common current $i_0$. Measuring $i_0$ can be accomplished by having a "master" controller that senses the common current and reports it to slave controllers in each balance circuit.

Because the data is common to all controllers, it can be transmitted as a broadcast to all slaves simultaneously. By dithering or some other such perturbation, each balance controller can then establish the maximum power point or the path toward the maximum power point of its receiver.

As used herein "digital communications" may comprise conduction-based signaling such as differential voltage signaling (e.g., RS485, Ethernet, and others), single-ended voltage signaling (e.g., RS232), current loop signaling (including voltage, current or others), or RF signaling that is multiplexed on conductors (e.g., coaxial cables, twisted pairs, or power lines), inductively coupled signals, capacitively coupled signals, free-space RF signaling (e.g., WiFi, blue tooth, or others), microwave links, optical signaling (e.g., via free-space, light-pipe, optocoupled, or fiber transmission and reception of LED or laser light). Optical signaling can involve modulated reflection or scattering of ambient light, for example using visual patterns that are remotely discernable by the eye, camera, or other sensor.

Digital communications as used herein may be synchronous or asynchronous. Digital communications may involve 1-wire, 2-wire, 3-wire, 4-wire, or more-wire signaling. These signals may utilize an application-specific standard or conform to established standards, such as Ethernet, WiFi, USB, IEEE1394, modbus, CAN bus, PROFI-bus, one-wire protocols, SPI, I2C, HDMI, or alternate standards for electronic signaling. Some signaling standards provide acceptable communication bit error rates at the necessary data bandwidth and across the necessary physical distances in spite of electronic, RF, or optical interference at low cost. Digital signaling at the lowest level in the hierarchy may be the most cost sensitive. Digital signaling at the highest level in the plant hierarchy may be the most bandwidth sensitive.

FIG. 7 shows a schematic block diagram of an embodiment of a master/slave arrangement of balancers (700). Element 702 is a master controller that digitally communicates to a network of the plant (for example a cluster-wide level in the plan hierarchy) via signals 704, and digitally communicates to balancer slave circuits 706 via an interface 708 and 710.

In the particular embodiment shown in FIG. 7, the transmissions from the master are common (bussed) to balancer slaves, and the transmissions from slaves are separate. Possible alternate arrangements may comprise bussed transmissions from slaves or separate transmissions from the master.

The particular arrangement of the interface 708 and 710 reflects the asymmetry in communicated data. For example, a master may frequently need to communicate the common string current to the balancers so that they can perform their power-point tracking. The master may also request status, voltage, or balancer current of all devices frequently to assess the state of the system. Communications to individual devices may also be required.

These different requirements can be supported by the use of a protocol having individual and group addressing capabilities. In some embodiments, this addressing may be separate or merged with "command" or "data identifier" bits.

Some embodiments of a master/slave balancer architecture may further comprise a diode 712 that blocks a reverse cluster current. However, in other embodiments such a diode may not be favored because of the forward diode drop voltage, large required reverse breakdown voltage and cost.

Some embodiments may further comprise a switch 714 to provide a direct connection between the cluster output and remote-conduction cable. In some embodiments, this switch may be controlled electrically, e.g., via master 702. Embodiments containing 714 may be used to provide for eliminating the forward diode drop of an element 712 or may be used for synchronous rectification.

As used herein "remote conduction" describes a plant-scale length of conduction of power. Some embodiments may have neither 712 nor 714, and the connection between the remotely conducted positive cluster output 716, and local positive cluster voltage 718 may simply be a conductor. Such an arrangement may reduce cost and improve efficiency at the expense of a possible increase in the requirements of the inverter to control power flow to and from a cluster.

Variations are possible. Some embodiments may comprise switch 714 as a manual isolator switch to provide for servicing. Some embodiments may provide a bypass diode 720 external to the receiver (e.g., to provide a path for current if a collector is grossly underperforming or inoperative).

Some embodiments contain a switch 722 to provide a direct conduction path to bypass a collector. Such a switch may further provide for short-circuiting a receiver to facilitate maintenance, to reduce the string voltage, etc.

Such as switch may be manual, mechanically actuated, or electrically actuated. Mechanically actuated switches may comprise solenoid actuated switches such as relays or latching relays. Mechanically actuated switches may further comprise switches having motor or pneumatic actuation, which can provide potential benefits of large contact separation that may be difficult or power intensive to accomplish with solenoids.

In some embodiments switches are co-located so a reduced number of actuators may be used. For example, a motor, such as a brushless DC motor, stepper motor, or brushed DC motor may be used to select a switch from a group (e.g., 724), and another motor to actuate the selected switch. In some embodiments, a first motor selects a switch, a solenoid or second motor engages with the selected switch, and the first motor actuates the switch.

Embodiments using such a motorized switching array may offer one or more benefits, including but not limited to:
- high isolation voltages between actuator and both sides of switched circuits;
- bi-directional switch currents and voltages;
- low switch conduction losses;
- large contact separation distances for switching of high-voltage circuits;
- self-indication, e.g., the state of the switch may be discerned by its position;
- manual actuation as an option, and in some cases obviating redundant switches; and/or
- lower cost per actuated switch over individually actuated switches. This cost tradeoff improves as the number of switches in such a group increases.

Connection 726 represents conductors spanning a distance from a receiver to the point 728 where the receivers are physically connected in series. In some embodiments, this distance may be of the order 1 to 5 m.

Connection 730 represents conductors spanning the distance between the series connection point 728 and the balancer input 732. In some embodiments this distance may be of the order 1 to 30 m.

Capacitor 734 may alternatively located or paralleled with a second capacitance at positions 728 and 732. Element 736 is a receiver from an array of N receivers 738, that are series connected at 740.

The balancer master may measure the series cluster current, for example by the use of a low-side current-sensing resistor 742. Such a resistor might comprise a number of low-valued resistor technologies, including metal ribbon, carbon composition, metal wire, and specially-designed printed circuit board trace.

The variation in resistance with temperature may optionally be compensated for by providing the master circuit with an ability to measure or infer the resistor temperature. Such a measurement may be accomplished by thermistors, varistors, thermocouples, transistors, diodes, and/or integrated circuits, via capacitively coupled or directly coupled known currents flowing through the same trace or a substantially proximal trace.

A possible advantage of the architecture is the ability for the balancer master to measure current directly via a sensing resistor on the low side. However, in some embodiments, the balancer master may measure current via a resistor on the high side or by a non-resistor-based means.

Alternatively, the current may be measured using hall effects, and other magnetic-based measurements.

In some embodiments, a balancer master may update its current calibration via coordination with an inverter. An inverter may allow for a precision or precisely known current to flow to the cluster. This current may be digitally communicated to the balancer, which could revise its calibration to match that from the inverter.

In some embodiments, this message and recalibration would be performed frequently enough to obviate temperature compensation. An advantage of such an arrangement is that the inverter connected to the cluster may be centrally disposed with a number of other inverters that could time share a common precision current sensing or reference capability to minimize the per-cluster cost of this ability.

According to certain embodiments, the balancer master may measure the cluster voltage, for example via a resistive voltage divider. In some embodiments, the balancer master may measure each receiver voltage using a chain of voltage dividers. In particular embodiments, the master may transmit this voltage information to a slave digitally. The balancer master may receive reports of individual balancer voltages from its slaves digitally, if needed.

FIG. 8 shows a schematic diagram of an embodiment of a balancer slave 800 according to the present invention. In this embodiment, the balancer slave circuitry is referenced to the negative voltage from the receiver (802). In alternate embodiments, the slave circuitry could be referenced to the positive voltage from the receiver (804) to the negative or positive voltage of the cluster, to a voltage from another receiver, to earth ground, or to another voltage. The arrangement of FIG. 8 may offer a benefit in that the only necessary voltage isolation is in the digital communications with the master, 806 and 808, for which a large number of effective and inexpensive isolator technologies are available (for example optocouplers, inductively or capacitively coupled isolators).

Element 810 is a substantially digital controller, which may comprise an ASIC, microcontroller, microprocessor, PLD, CPLD, FPGA, and the like. This controller may provide for analog-to-digital conversion of the receiver voltage, via for example, a resistive voltage divider 812, balancer current (such as via current-sensing resistor 814), and/or other parameters, such as temperature, switch temperature, analog signals involved with power maximization, etc. In addition, the controller 810 may provide one or a plurality of analog outputs (for example 816) to a power electronics circuit 818.

One or more of these outputs could be produced in part by pulse-width modulation of digital signals. In some embodiments, one such analog signal may comprise a power calculated from the product of receiver voltage and string current. In some embodiments, this signal may comprise a power calculated from the product of the receiver voltage and sensed current. In some embodiments this signal may comprise a combination of both.

In some embodiments, the relative weighting of these combined powers may be adjusted to account for circuit losses and sensor inaccuracy. In certain embodiments, an analog signal is proportional to a weighted sum of the receiver and string current wherein the weights are adjusted similarly.

Digital control and indicator signals may pass between 810 and power stage 818 over lines 817. Such a power electronics stage may utilize elements of one-cycle-control or analog feedback for performing agile maximum power-point tracking, using analog versions of signals such as the string current or string voltage for this purpose. In some embodiments, the string voltage communicated from 810 to 818 may be the voltage from the voltage divider 812 or a processed (e.g., filtered or amplified) version of that voltage.

According to some embodiments of the present invention, the interface may manipulate an analog signal to adjust the behavior of power stage 818. An example of such manipulation is to adjust the control system to achieve better efficiency. In such embodiments, power stage 818 may provide for fast response to transients but less favorable power point optimization. Controller 810 may use analog signaling or manipulation or analog signals 816 or digital signaling 817 to trim the control of 818 to achieve both fast responsiveness and high accuracy.

One possible advantage offered by the particular circuit arrangement of FIG. 8, is that analog sensing voltages, for example, those produced by circuitry 812 and 814 may be referenced to a common negative voltage or local ground shared by the circuitry 818 and 810.

In some embodiments, the balancer master may assist the balancer slave with current and voltage calibration. For example, the balancer master may first calibrate its own current sensing resistor, for example by disabling all balancers and receiving an accurate current reading from a central inverter.

Next the balancer master may enable a balancer slave to operate. The balancer master may then infer what actual current the balancer is supplying to the cluster by measuring the string current and receiving a report of the cluster current from the inverter.

The balancer master may then transmit this information to the balancer slave, which can use it to infer an adjustment calibration factor to apply to its own receiver-side-current sense measurement. This may be done by tweaking an analog signal via a PWM line, by changing a parameter in the calculation of an analog signal produced via PWM or some alternative digital-to-analog conversion. The receiver-side parameters can thereby be adjusted relative to the cluster-side power performance, which implicitly accounts for balancer circuit non-ideality and inefficiency.

One possible advantage of this type of calibration approach is that it can be designed to converge on an operating point that maximizes the power at the central inverter without requiring high accuracy of each balancer measurement. Moreover, this calibration procedure may provide for better power maximization than is possible with accurate receiver-side-only-based current measurements.

A similar technique may be used to calibrate voltage. For example, the balancer master can short-circuit a receiver and receive an accurate voltage report from a central inverter then re-enable the receiver and receive a second accurate voltage report from a central inverter. The difference in these measurements can inform the voltage calibration of the balancer slave.

According to some embodiments, the balancer slave may sweep a calibration parameter over a range of values until the measured cluster power is maximized. This procedure may be requested by the balancer master, who would provide feedback on the results of the sweep experiment.

In some embodiments the effect of sweeps is measured at the central inverter. This can potentially provide better overall system power optimization indications than is possible local to the balancer.

In some embodiments, both types of optimizations are made at different intervals. For example, the balancer master may undergo such a calibration at one interval utilizing the central inverter. The balancer master may then perform a calibration of its balancer slaves at another interval, either involving the central inverter or not. Calibrations that do not involve the central inverter may be conducted more frequently than those that do, since the central inverter generally services a large plurality of clusters.

In some embodiments, a balancer master is not connected to a cooperative inverter. In such cases, the balancer master may have sufficient circuitry to perform power optimization without accurate quantification, because it can perform power maximization without knowing absolute power, or it may have sufficient circuitry for absolute power measurement, for example if it desired to use the balancer for power quantification.

A DC-DC power supply may draw power from the receiver to produce logic power 822 and power for analog circuitry and switch gates, 824. In some embodiments, this supply does not allow the logic or gate power voltage to drop below a certain level, to avoid improper operation of the balancer.

In some embodiments, this power may be provided from the cluster voltage, which may be "uninterruptible," or some other power source. However, there may be no need to operate a balancer when insufficient power is available from the receiver to run the balancer slave circuit.

Certain embodiments of the present invention may carefully design elements 818, 810, and 820, such that the circuits power up, operate, and power down favorably with wide swings in the power output of the receiver.

Excess power harvested from the receiver, or the deficit power supplied to the receiver by the balancer, depending on its configuration, comes from a common bus 826. In some embodiments, this bus is the cluster output.

In certain embodiments this bus is separate from the cluster. In some embodiments this bus is isolated, in other embodiments the bus may share a common voltage.

According to some embodiments, the bus is serially connected to the receiver string, for example between intermediate receivers in a string, or before or after a terminal receiver. In some embodiments, the bus is connected to a bus voltage derived by a DC to DC converter from the cluster voltage. In some embodiments, this converter is a boost converter, a buck, converter, or a buck-boost converter.

At an optimal common series current, the sum of the operations of the balancing circuits is minimized. For example, if the balancing circuits work by drawing current from the receiver, an optimal operating condition exists in which at least one, weakest-performing receiver is at its maximum power point with zero current drawn by its balance circuit. Conversely, if the balance circuits supply current, an optimal operating condition exists in which at least one, strongest-performing receiver is at its maximum power point with zero current supplied by its balance circuit.

In either case, it is possible for the master to stabilize a control loop near this optimal condition, by monitoring the presence of a response or flag set by one or more balance circuits that they are at or past a zero-shunt-current maximum-power condition. If the master detects at least one zero-current condition report, it can instruct all balance circuits to increase their average current draw/supply over the following time interval by an increment until no balance controllers are signaling a zero-current condition. If no balance circuits are reporting zero-current condition, the master can instruct all slaves to reduce their average current draw/supply. By repetitively operating in such a manner, the master can ensure that this optimum operation is closely tracked.

The master controller can alternatively force controllers to adjust their balance circuits in a particular direction by intentionally under- or over-reporting the common current. Of course more sophisticated control methods can be employed to improve the maximum power-point tracking frequency response for given signaling bandwidths, or if the balance circuits are bi-directional and the optimal operating point is not sensed by a zero-current condition. Other considerations, such as minimum or maximum operating voltages or currents may require the cluster to operate away from these maximum-efficiency settings.

The Balancer is able to measure the receiver voltage(s) and the balance current. The total power can be calculated by multiplying the measured voltage with the total receiver current.

Circuitry associated with the balancer can be used to provide benefits for the plant. One example of such a use is the actively control of the maximum cluster voltage, such as to avoid over voltage if the cluster load is low. In some embodiments, such a function could be performed rapidly via switches associated with the balancers.

According to certain embodiments, this function may be hardware supported. For example, a minimum number of collectors could be short-circuited if an overvoltage threatens. This threat could be detected by a fast comparator, allowing the balancer to assist with protection of the cluster's inverter.

In some embodiments, output of a cluster could be clamped by a conventional over-voltage suppressor such as a zener diode. In such cases, the suppressor reduces the need for response speed. When the required response speed is sufficiently low, the balancer microcontroller may be able to force a short circuit in one or more collectors before any device is damaged.

Alternatively, the cluster's inverter can be designed such that it can tolerate the full open-circuit voltage of a high-performing cluster. Design tradeoffs in the inverter switches, however, may lead to reduced power efficiency or increased cost.

In some embodiments the inverter is designed to handle the full open-circuit voltage. An active clamping scheme utilizing the balancer may provide an additional margin of safety.

The balance controller may need to convert the digitally reported common current reading it receives to an analog signal, e.g., via a pulse-width modulation (PWM) or digital to analog (D/A) peripheral, if the maximum power-point optimization is done via an analog control system. The balance controller can intentionally skew this analog signal to force the control loop in a desired direction.

An advantage of using an analog control system is the ability to maintain a tight and accurate high-frequency control loop without perturbations from microcontroller latency and multi-tasking. A hybrid of the one-cycle control (OCC) methodology" managed and adjusted by a microcontroller offers a good balance of frequency response and sophisticated controllability. Such a scheme is referred to as a managed OCC (mOCC).

This circuitry may require a frequency response of at least several Hz to several tens of Hz if dynamic fluctuations, e.g., from wind-loading are to be compensated. Simple digital control schemes generally require a high degree of oversampling to perform well. Digital loop frequencies as high as 10 kHz are practical with modest microcontrollers linked via an isolated communication scheme, e.g., SPI, I2C, or RS485. Analog control loop frequencies can be much higher in a mOCC arrangement.

Figure 2A:
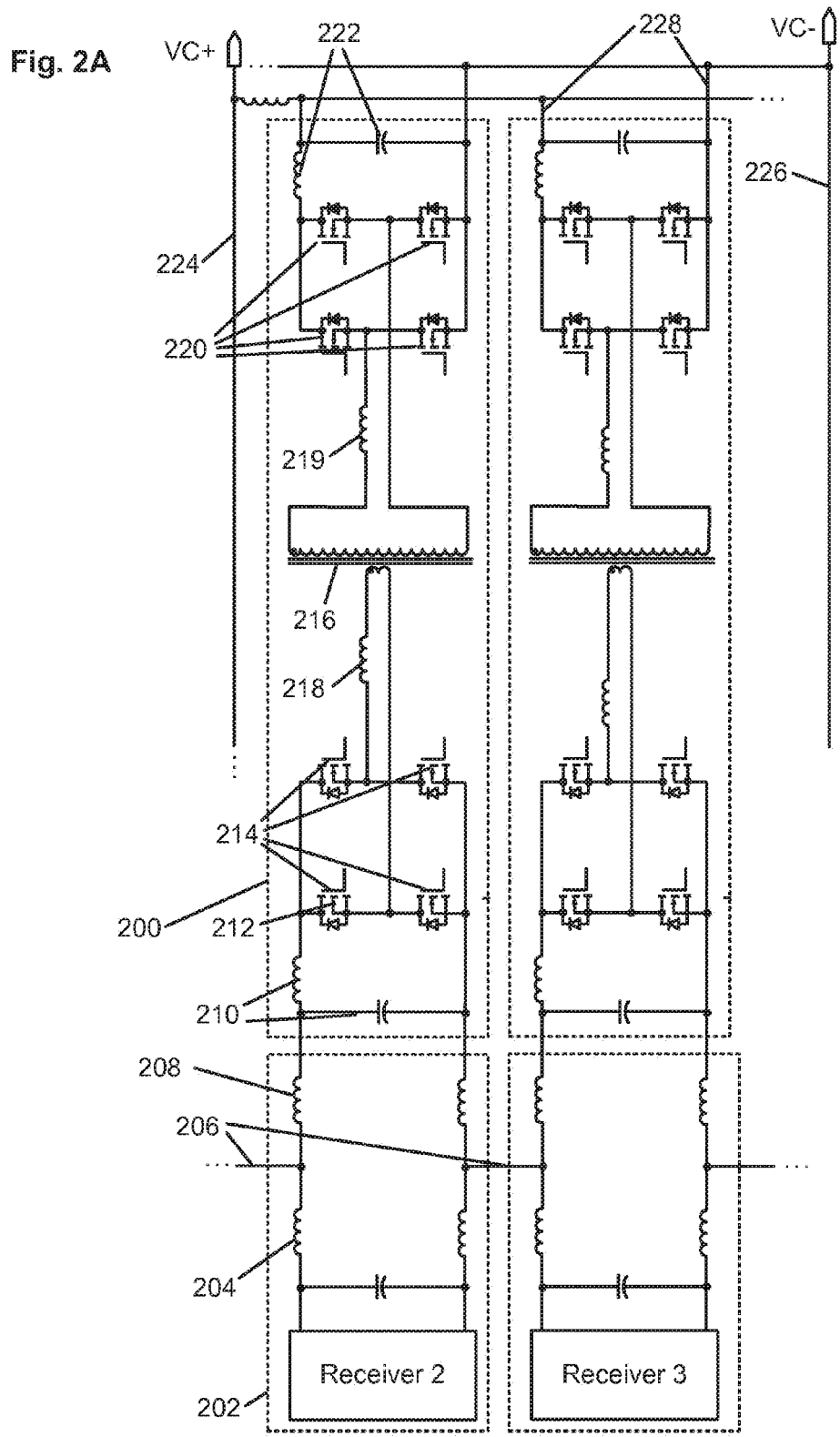
FIG. 2A shows a balancer circuit arrangement in which the balancer circuit for each receiver is separate.
Figure 2A:
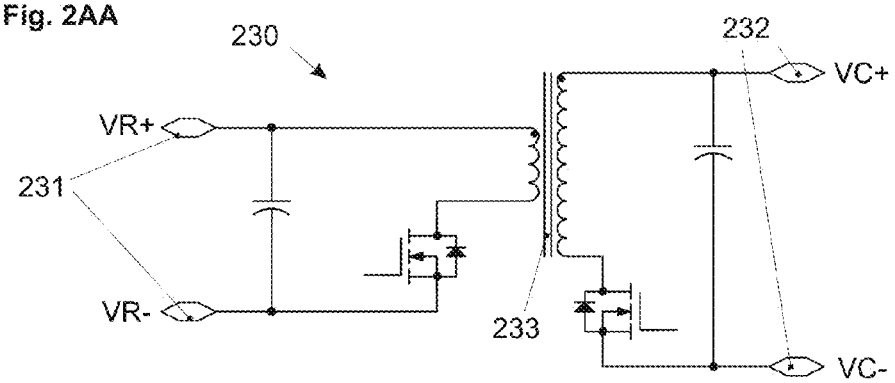
Figure 2A:
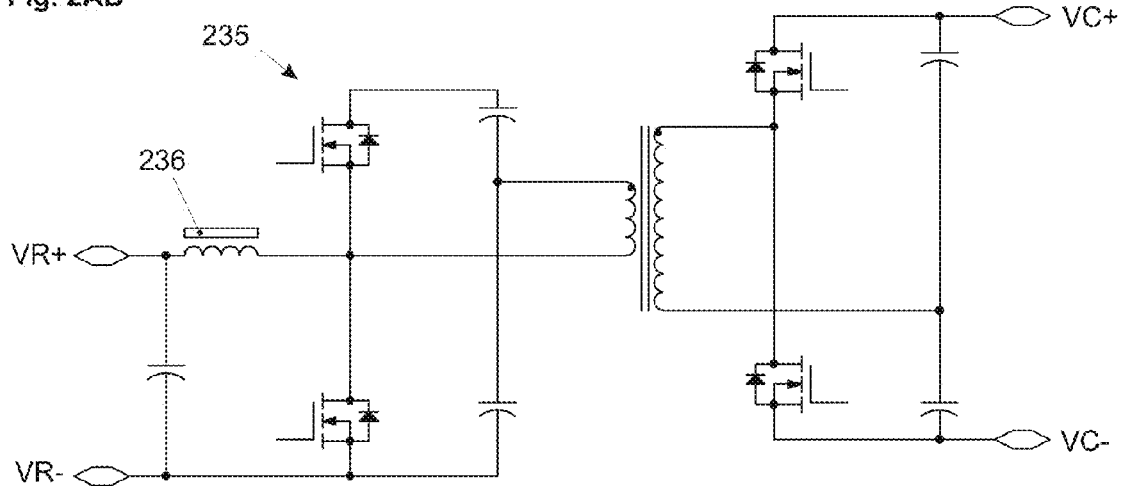
Figure 2A:
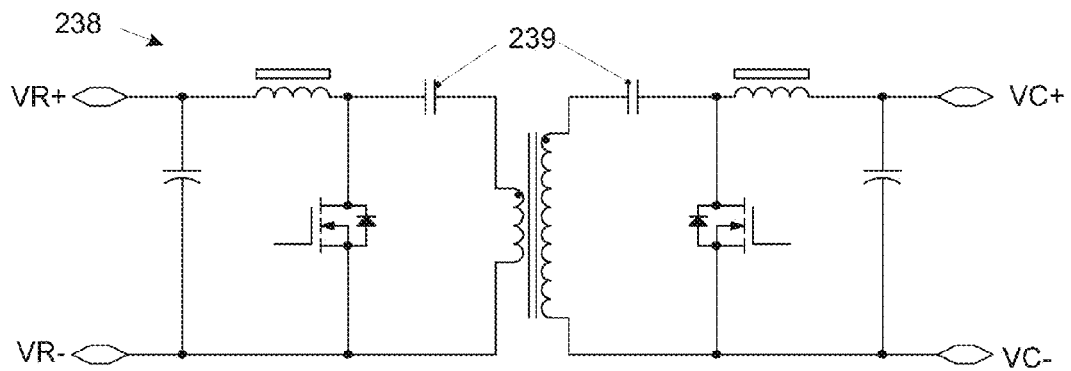

FIGS. 2A-2D show a variety of simplified balancer schematic diagrams according to embodiments of the present invention. FIG. 2A shows a balancer circuit arrangement (200) in which the balancer circuit for each receiver is separate. The receiver power source equivalent circuit (202) shows interconnect inductance and possibly added inductance (204) in its path to the series connection 206. Additional interconnect inductance and possibly added inductance (208) is in the path to the balancer circuit.

It may be desirable to design the architecture of the switching circuit to make use of this inductance, for example by placing the switching circuit in series with an inductor in the filter circuit 210. Element 212 is drawn as an enhancement mode N-channel MOSFET, but can be any electrically controlled switch. The full bridge 214 drives a coil in step-up transformer 216.

Elements 218 and 219 represent the transformer leakage inductance and in some cases an added inductor. Alternately, a half-bridge driver could be employed as is known in the art.

The full bridge 220 and filter 222 comprise the side of the balancer circuit that works at the cluster voltage (224 to 226). By the symmetry of the design, this balancer circuit can be bidirectional.

FIGS. 2AA through 2AC show simplified schematics of alternative circuits that provide for bi-directional power flow according to embodiments of the present invention. Circuit 230 in FIG. 2AA shows a bidirectional isolated flyback converter. Depending on the switch timing, current can flow into receiver terminals 231 and out of the cluster 232 or out of receiver terminals 231 and into the cluster 232. The flyback step up transformer 233 must be carefully designed with a substantial leakage inductance. In some embodiments of the present invention, the flyback transformer 233 may comprise additional taps or windings to improve efficiency by recovering demagnetization energy.

FIG. 2AB shows a simplified schematic diagram of a half-bridge bidirectional converter 235 according the an embodiment of the present invention. This converter comprises two switches on both the receiver and cluster side and a discrete inductor 236. This additional circuitry may improve conversion efficiency over that of the circuit in FIG. 2AA.

FIG. 2AC shows a simplified schematic diagram of a bi-directional Cuk converter. This converter has the advantage of fewer switches than in the circuit of FIG. 2AB. However, the full converted power must pass through multiple capacitors 239 and other components that are not lossless in practical implementations, which in some cases may reduce conversion efficiency.

In unidirectional operation, this bridge works as a synchronous rectifier, which could alternatively be replaced by a diode bridge. Alternatively, the bridge 214 could be replaced by a diode bridge. However, because of the lower voltage on this side of the transformer, the diode's forward voltage would have a greater effect on efficiency.

As either a diode bridge or switch bridge, element 214 can be used to bypass a receiver. However losses in the filter 210 and perhaps inductance 208 may justify placing an active or passive bypass closer to the receiver.

Each balancer can be completely modular, or may share control circuitry to provide for enhanced coordination between balancers and reduced component costs. A degree of soft switching can be achieved by judicious use of the inductances and capacitances on the receiver side (204, 208, 210, and 218), and in some cases by coordinating timing between switching of the balance circuits through the series connections 206 on the receiver side and parallel connections 228 on the cluster side. Coupling on the cluster side could be enhanced, for example by the addition of one or more passive elements, such as inductor 230.

Figure 2B:
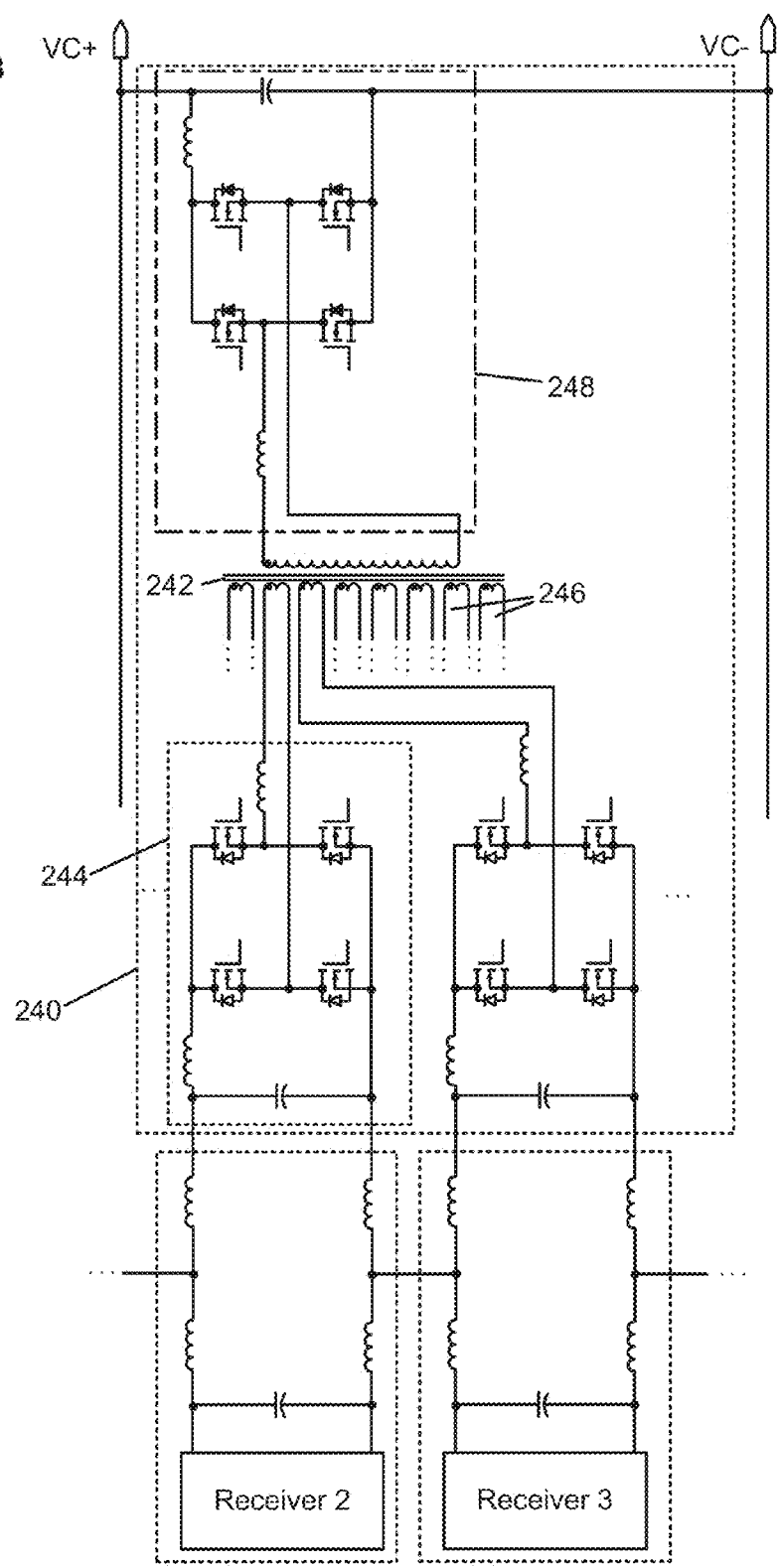
FIG. 2B shows an alternative arrangement or balancer circuitry in which a single multiple-tap transformer is employed.

FIG. 2B shows an alternative arrangement or balancer circuitry 240 in which a single multiple-tap transformer 242 is employed. Separate switcher circuits 244 feed isolated taps 246 of the transformer.

A common switcher circuit 248 is connected to the cluster voltages. For unidirectional operation, this switcher circuit could be replaced by a diode bridge. However, unlike in FIG. 2A, at least one active switch is required in the circuit 244 to control the relative amount of balancing current flow.

The use of a single transformer produces strong coupling between the balancer circuits 244, providing for soft switching via careful time synchronization. The use of a single transformer may provide additional savings in magnetics.

The transformer can be sized for the maximum imbalance power to be processed. This limit is generally less than the sum of the maximum permissible power imbalances of each individual receiver.

The use of a single cluster-side circuit represents a considerable reduction in part count and hardware complexity. A degree of soft-switching may be accomplished through careful coordination of switching timing.

Figure 2C:
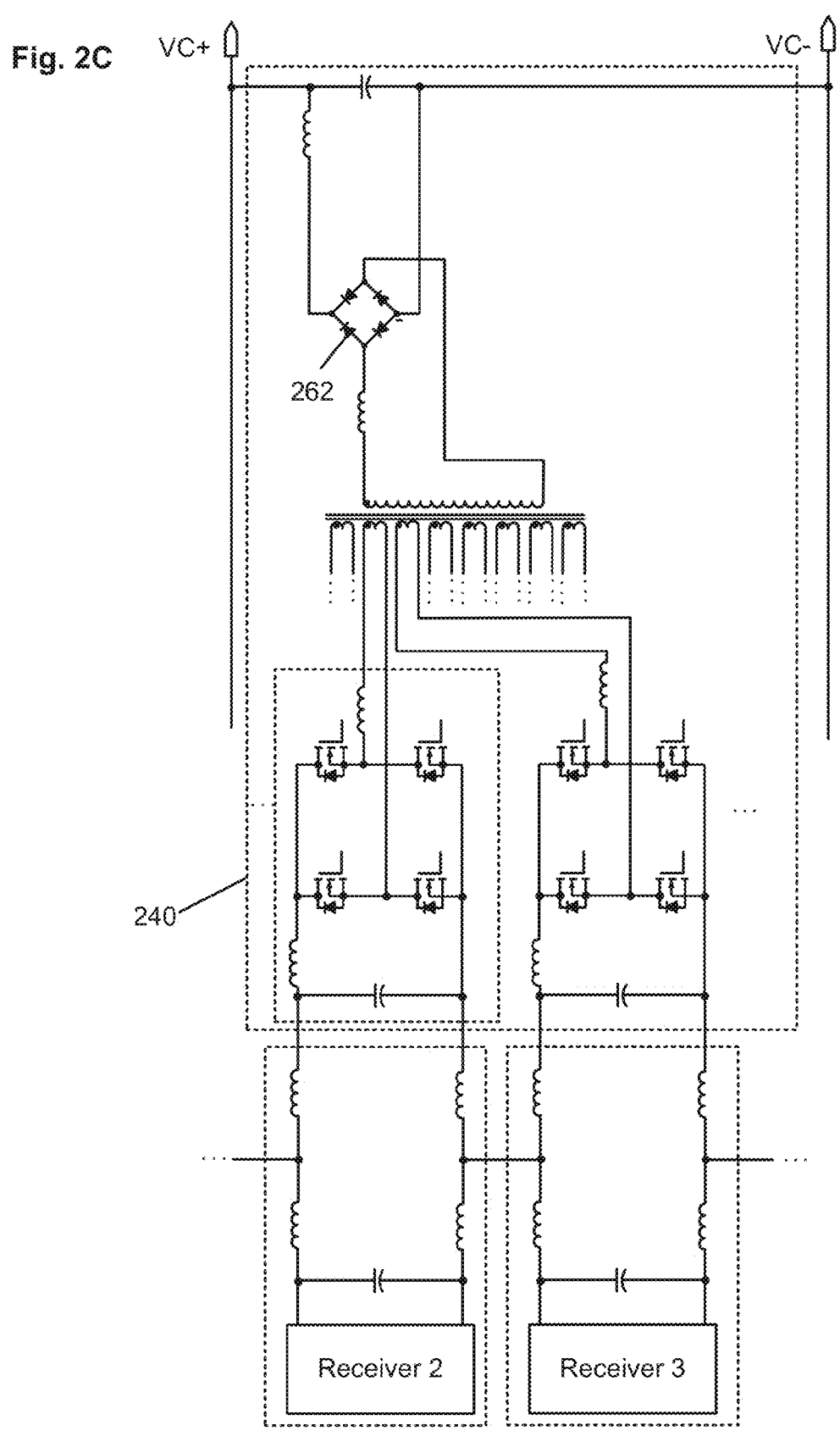
FIG. 2C shows a balancer circuit that employs a passive rectifier bridge.

FIG. 2C shows a balancer circuit 260 that employs a passive rectifier bridge 262.

FIG. 2D shows a balancer circuit 270 that employs a transformer 272 that has isolated, coupled windings 274. Rather than flowing power to or from the cluster output, this circuit draws and supplies currents as needed to operate each receiver near its maximum power point.

Figure 2E:
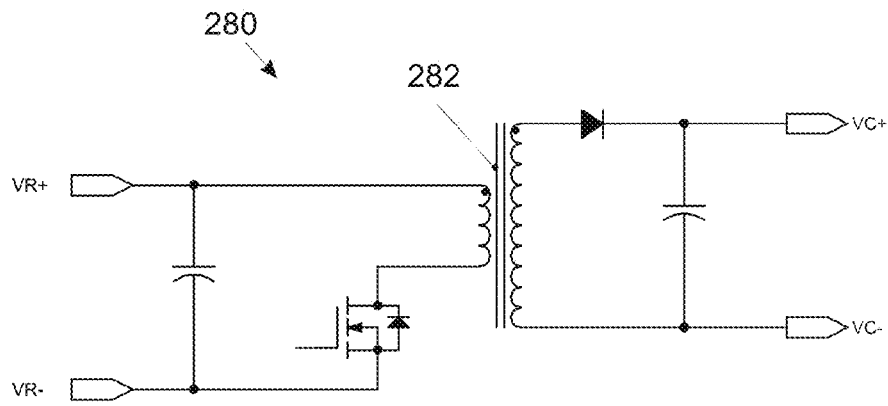
FIG. 2EA shows a simplified schematic diagram of a uni-directional isolated flyback converter.
Figure 2E:
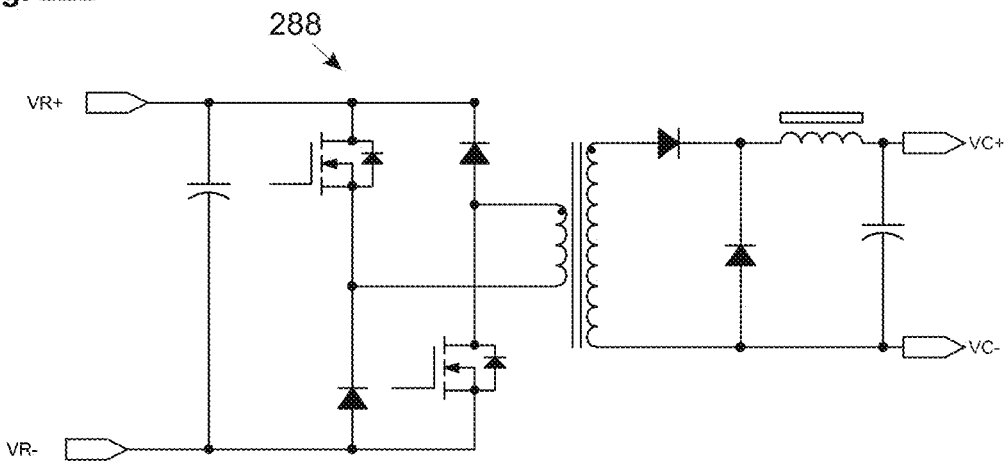
Figure 2E:
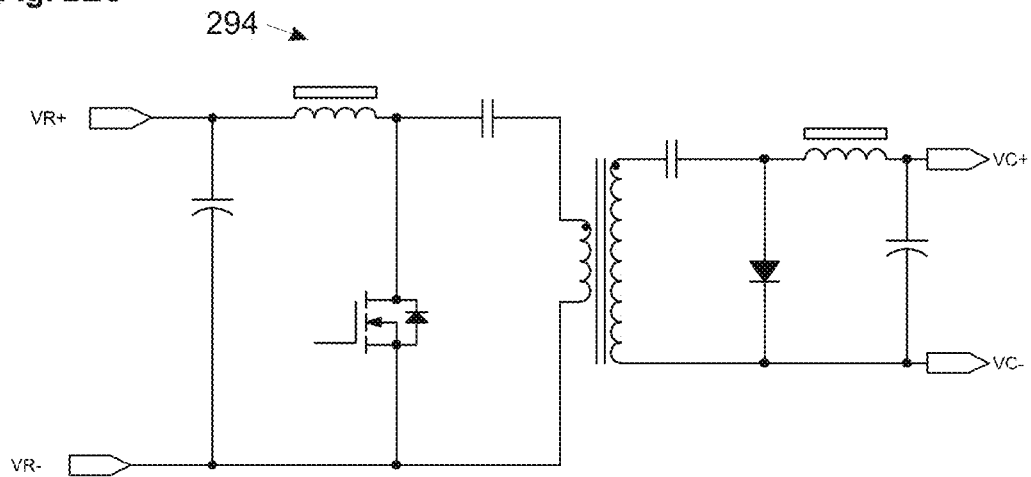

FIG. 2EA to 2EC shows simplified schematic diagrams of alternative embodiments of unidirectional isolated converter circuits according to elements of the present invention that have switching circuitry solely on the receiver side. In some alternative embodiments, these converters may be reversed such that all switching circuitry lies on the cluster side.

FIG. 2EA shows an isolated flyback converter 280. The isolation and step-up transformer 282 is designed to have leakage inductance to permit the low-component-count circuit. In some embodiments of the present invention, the transformer is designed to have additional windings or taps that feed circuitry that recovers magnetization energy that would otherwise be lost when switching.

FIG. 2EB shows a schematic diagram of an embodiment of a two-switch forward isolated converter circuit 288 that may be employed in a balancer according to the present invention.

FIG. 2EC shows a schematic diagram of an embodiment of an isolated Cuk converter circuit 294 that may be employed in a balancer according to the present invention.

The circuit embodiments in FIG. 2 may contain additional auxiliary coupling circuitry to provide for soft switching from one phase to the next. In some embodiments, this circuitry includes coupling capacitors. In some embodiments this circuitry includes inductively coupled windings on an isolation transformer. In some embodiments, this circuitry is connected as a daisy chain from one receiver to the next. When a particular balancer is not switching, it may remove itself or be removed from the daisy chain by the use of semiconductor or mechanical switches, such as relays or ganged, motor-actuated switches.

In some embodiments, the timing of switching or power transfer between receivers is carefully coordinated. In some embodiments, this coordination is performed via one or more handshaking signals. In some embodiments, the balancer master coordinates the switch sequence timing. In some embodiments this timing is coordinated in part by the balancer slave circuits. In some embodiments, some timing handshaking or clocks is implemented as a bus. In some embodiments some timing handshaking is implemented as a daisy chain. In some such embodiments, timing handshaking signals may be bypassed by a balancer slave or balancer master. In some cases this bypassing is performed using a semiconductor switch or logic gate. In some other embodiments this bypassing is performed using a mechanical switch, relay, or motor-actuated switch. In some such embodiments, the switch may comprise several throws that include all circuitry needed to soft switch to distribute power from one balancer slave circuit to another.

The source, destination and magnitude of balance current depends on the time sequencing of the switches. By judicious time sequencing, switching stresses and losses can be reduced. These losses may be further reduced by the use of passive soft-switching and active soft-switching techniques, for example quasi-resonant and resonant switchers.

In certain embodiments, the circuits 200, 240, 260, and 270 are located in a physically compact space that may serve to achieve one or more of the following results: reduce EMI/RFI; facilitate careful time-sequencing; maximize the use of shared components (such as precision clocks, power supplies, communication buses, etc.); and/or maximize the inductance 208, which supplements that of 210.

In some embodiments, a single, relatively powerful processor may perform all switching timing calculations and control. In other embodiments, several less powerful processors may perform switching calculations and control for individual receivers, coordinating via communications, and handshaking.

Certain embodiments may employ OCC or mOCC in order to perform switching control. The general complexity of optimizing the bidirectional switching of N circuits to each of the N−1 others for maximum power-point, best efficiency, and lowest noise/ripple, favors the use of comparatively sophisticated digital processing.

One objective in the design of power circuitry is the need to operate with reasonable efficiency at relatively low currents, while retaining relatively high current capacity. The maximum-efficiency point should be biased below the maximum permissible power setting, and the roll off in efficiency should be optimized, for example by the use of variable switching frequencies, pulse-skipping, soft-switching, and/or other techniques.

These switching circuits should be carefully interleaved to reduce switching losses and minimize the instantaneous departure from maximum power-point operation of each receiver. Judicious interleaving can reduce the efficiency roll-off at low balance currents.

The following summarizes one or more characteristics of particular embodiments of a cluster.

- A cluster comprises O (8) receivers in proximity with an enclosure within about 8-10 m of wire of all receivers.
- Receivers are electrically connected in series to achieve the maximum voltage for the number of die connections.
- Isolated switching circuits, called "balance circuits" (ideally) draw imbalance current, supplement imbalance current or draw and supplement (bi-directional) imbalance current.
- The power drawn or injected by balance circuits is consumed or produced locally. That is, power balancing is self-contained, requiring no extra long runs of high-power-bearing cables to a remote location to support power maximization.
- Balance circuits are able to efficiently bypass receivers that underperform by an excessive amount. This can be accomplished passively by the use of a bypass diode or with a switch, and in some cases a switch that is already used otherwise in the normal operation of the balance circuit if series resistance of the circuit is sufficiently low.
- Within a cluster, all balance circuits are contained in one enclosure that is mounted for convenient servicing. Co-location also provides for fast communications and shared elements, e.g., clocks. Some elements of balance circuits must be electrically isolated from each other.
- The enclosure can also house the inflation and tracking controller(s), which optimize the power distribution on the receiver. This controller(s) can also perform role of "master controller."
- Low-frequency input filter capacitors may be located here because of their lifetime limits and possible need for replacement. This configuration provide for easier maintenance. Therefore, although the configuration of this embodiment may not be as ideal as placing the capacitors directly at the receiver because of the inductance of the intermediate wires (~1-15 uH), maintenance concerns may make this configuration more desirable even though there is a potential performance penalty.
- Water cooling is readily available in this enclosure and is used liberally to extend the lifetime of equipment, eliminate excessive heat sinks, and reduce size.
- Consumable components, e.g., capacitors, IGBTs or MOSFETS and their drivers are modular for easy and safe field replacement. The cost of consumables and their replacement is minimized Consumables are enclosed to prevent secondary damage on failure.

Central Inverter Design

The moderately long DC transmission lines from each cluster, or in some cases from small groups of clusters, will individually converge at a central plant location housing a massively interleaved inverter. Each transmission line pair goes to a separate interleaved inverter.

Such an arrangement does not in principle add to the conductor cost over an arrangement in which conductors are merged; rather it may reduce the conductor cost by providing a convenient way to optimize the total conductor cross-section at each point in the plant. However, this arrangement adds to the insulator cost. This cost should be offset by making power balancing between phases trivial and allowing different clusters to operate at different voltages, according to a less constrained overall efficiency optimization.

At some plant scale, the cost of DC interconnect wires to transmit power efficiently from clusters to a distant inverter, may justify the cost of adding a closer inverter and step-up transformer. Such large plants may justify a cellular structure.

It is generally most advantageous in cost and efficiency to use only one stage of transformer between a plant and the grid. But, in some cases utility requirements may demand a separate isolation transformer. In such cases, it may be best to consider breaking plants into smaller units and distributing them geographically, providing the added value of reducing the magnitude of the effect of weather and cloud factors on total power generation.

Thus the scale at which DC interconnect wires become prohibitively expensive sets a natural plant size limit. This limit scales with the fourth power of the DC voltage, which only increases insulation costs proportionally (if that). Thus in some circumstances it may be advantageous to press for higher DC bus voltages and bi-polar operation in order to scale plant power.

In certain embodiments, high DC voltages may require increased dielectric thickness in the high-heat flux water-cooled primary heat exchanger. This enhanced thickness in turn increases the temperature drop in the dielectric. However, it is practical to use dielectric thicknesses large enough to stand off many kilovolts without excessive thermal resistance.

A second voltage limiter is the insulation on the isolation transformer of the Balancers. The switching-circuit capacitors and switches also set limits on maximum voltage.

Beyond these physical limits, are relatively arbitrary (and much stricter) limits set by agencies generically to ensure product safety. These agency restrictions may significantly affect the cost and availability of commercial high-voltage equipment.

Figure 9A:
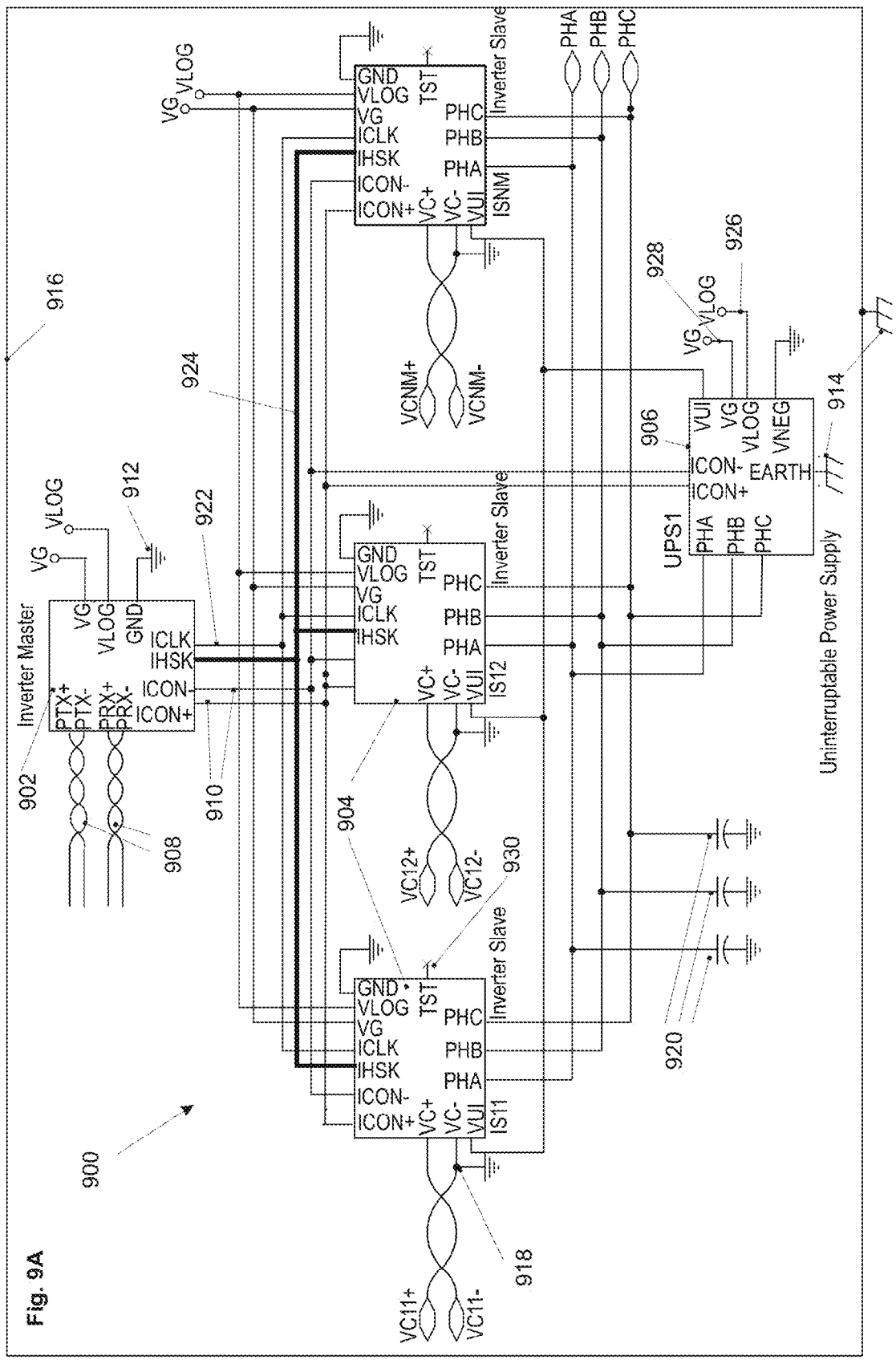
FIG. 9A shows a schematic diagram of an interleaved inverter system according to an embodiment of the present invention.

FIG. 9A shows a schematic diagram of an interleaved inverter system 900 according to an embodiment of the present invention. This system comprises an inverter master 902 and a plurality of inverter slaves 904. This system may further provide an uninterruptible power supply system (UPS) 906.

The inverter master may digitally communicate at a high level in the plant network hierarchy via signals 908. In turn it may digitally communicate with its slaves via signals 910.

In this particular embodiment, the communication is shown as bussed and differential-signaling-based, such as RS485. However, embodiments of the present invention are not limited to this form of communication, and as described earlier alternate communications schemes are possible.

In the embodiment shown, the blocks share a common "ground" voltage 912 which is distinct from earth ground 914. The rectangle around the inverter 916 depicts the chassis, housing, and metal objects with which an operator may contact. This is connected to earth ground via techniques established by the power industry, for example by conductors driven into the earth. Other features of the inverter system that may be earth grounded include the cooling system, coolant, and other elements.

In the particular embodiment shown, the sole physical earth ground connection referenced by the circuitry occurs at the UPS 906. This earthing arrangement may avoid issues associated with earth ground currents.

In some embodiments the central inverter establishes the cluster bus voltage reference. In the embodiment shown, the negative voltage of each cluster is tied (e.g. 918) to a common voltage at the inverter. This common voltage is "ground", but not necessarily "earth ground." The clusters may separately earth ground their chassis, support structure, and cooling system, etc., but may not otherwise tie a voltage in their cluster to "earth ground."

In some embodiments of the present invention, the positive voltage of clusters are connected into a common positive voltage. In some alternative embodiments, one voltage from a plurality of clusters is connected. In some alternative embodiments, one voltage from a plurality of clusters is connected and the other voltage from a different plurality of clusters is connected in common.

In some embodiments of the present invention, the voltages of at least one cluster is not connected with any other cluster, e.g., all clusters outputs are maintained separate. In some such embodiments, the inverter slaves share a negative or positive common voltage that is substantially isolated from the cluster voltage. In some embodiments, this common voltage is constrained to fall within a range relative to one or both of the cluster voltages, for example, to ensure that circuitry is properly biased.

One reason for isolating a cluster voltage from another is to allow the inverter slave to switch using a more symmetrical high-side and low-side profile than may be possible if a number of clusters having different cluster voltages have one voltage in common. For example, if one cluster is producing at one voltage, another cluster is producing at a different voltage, a terminal of the clusters is connected together, and the circuits are switching into the same voltage, the switch timing on the high-side and low-side of the two clusters may be unsymmetrical. Such a lack of symmetry may increase switching, conduction, and/or core losses over those of a symmetrical profile. In principle, a slave inverter operating on an isolated cluster voltage, may attain a more symmetrical switching profile and may achieve a higher inversion efficiency. This possible increase in efficiency may come at the cost of isolated switches and additional isolated power supplies. In some embodiments, the extra cost and power required for these isolated elements is justified by efficiency gains. In other embodiments, e.g., in the embodiment shown it is not. In embodiments having isolated cluster voltages, some of the inverter-slave circuitry may share a common voltage to provide for simpler interfacing, e.g., of communication lines, clock lines, hand shaking lines, and the like.

The arrangement of establishing a common voltage reference for each cluster physically proximate to (or within) the inverter, may offer a benefit in that each inverter slave can share a ground with each other and with respect to the master. This potentially obviates the need for a large number of isolated power supplies, isolated communications, etc.

The potential success of such a grounding scheme may depend upon supplying a sufficiently low impedance and inductance ground plane, such that ground bounce and voltage offsets produced by ground currents do not disrupt communications and other circuit functions. A physically compact inverter, good circuit layout, and thick ground planes/traces may allow individual inverter circuitry to operate without isolation.

It may also be favorable to communicate between inverter slaves and the inverter master via differential signals that can swing beyond the power and ground rail (e.g., RS485). Analog circuitry that is over-the-rails tolerant may also be favorable.

According to this particular embodiment, the master inverter contains filter capacitors 920. The inverter slaves in this embodiment each function substantially as current sources, and so may share a common capacitor.

The individual filter inductors are contained in the inverter slave blocks 904. By interleaving the switching times of each inverter slave, the necessary size of this filter capacitor may be reduced by a large factor. In some embodiments, the inverter slaves may function substantially as voltage sources and share a series filter inductor whose inductance may be similarly reduced.

To reduce cost and provide for tightly synchronized operation, the master may supply a clock signal 922 to inverter slaves. In certain embodiments, this clock signal may be from a microcontroller.

Improved interleaving may rely upon accurate temporal switching coordination. Accordingly, the master may produce, listen, and/or contribute to a handshaking bus of digital timing signals (924) utilized by the inverter slaves in part for establishing switch timing and synchronization.

In the particular embodiment shown, the logical voltage 926 and gate/analog voltages 928 may be supplied by the uninterruptible power supply 906 and are shared for inverter slaves. To avoid unwanted power-supply inductance, these power supplies, while fed by the UPS may be placed proximate to or within the inverter.

In certain embodiments, the UPS provides an intermediate voltage, and each inverter slave individually produces its operating voltages from this source. Such an arrangement may be favorable if the power-supply inductance is large, or extra voltage isolation is desired between inverter phases.

According to some embodiments, each inverter slave may have a simple snubber and capacitor to eliminate power supply voltage excursions without resorting to separate supplies. Each inverter phase may also contain a "test port" containing signals and connections that are normally open in operation, but that support automated testing and troubleshooting when an inverter experiences a fault.

Figure 9B:
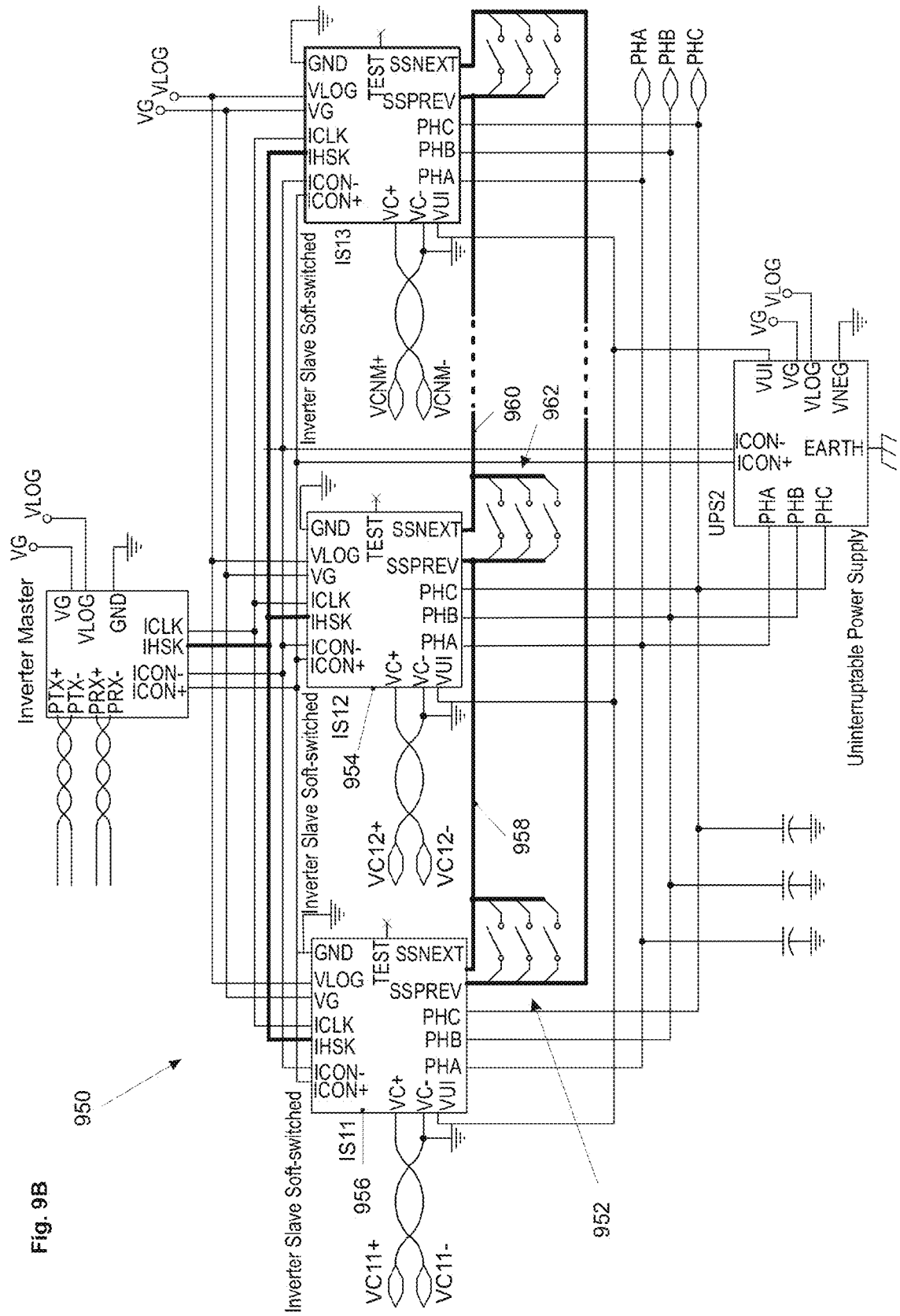
FIG. 9B shows an embodiment of an inverter system that provides for switch synchronization daisy-chaining via circuitry.

FIG. 9B shows an embodiment of an inverter system 950 that provides for switch synchronization daisy-chaining via circuitry 952. Soft-switching and high-precision switch interleaving between separate inverter slaves may utilize high-precision daisy-chain handshaking.

For example, a slave (e.g., 954) may await a signal from another slave (e.g. 956) previous in the timing chain on one handshaking line 958, before initiating a switch sequence. At some point in this switch sequence, it may assert a signal on a handshaking line 960 to the next slave in the chain, so that the next inverter's switching achieves a soft-switched, low-stress, or low-noise condition.

Maintaining a complete daisy chain may present a challenge when an individual inverter slave or its associated cluster, may be inoperative. Because soft-switching may be desirable, but is not necessary for operation, inverter slaves may be coded and designed to operate hard switched or with reduced interleaving performance if the daisy chain is broken.

Certain embodiments (for example that shown in FIG. 9B) may bypass one or more inverter slave timing signals in a daisy chain, by the use of a switch 962. Such a switch may be electronic, mechanical, etc.

If the signaling electronics are low voltage and share a common ground reference it may be favorable to perform this switching via logic devices or analog switches. Potentially desirable characteristics of such switches include low cost, low power requirements, and low transit-time delay. Such a switch may be thrown mechanically or programmatically when an inverter slave is removed from service.

Removing an inverter slave may involve physically removing the device. Thus, this function may be best handled by the inverter master or on a motherboard that remains in service when inverter slaves are removed.

Figure 10A:
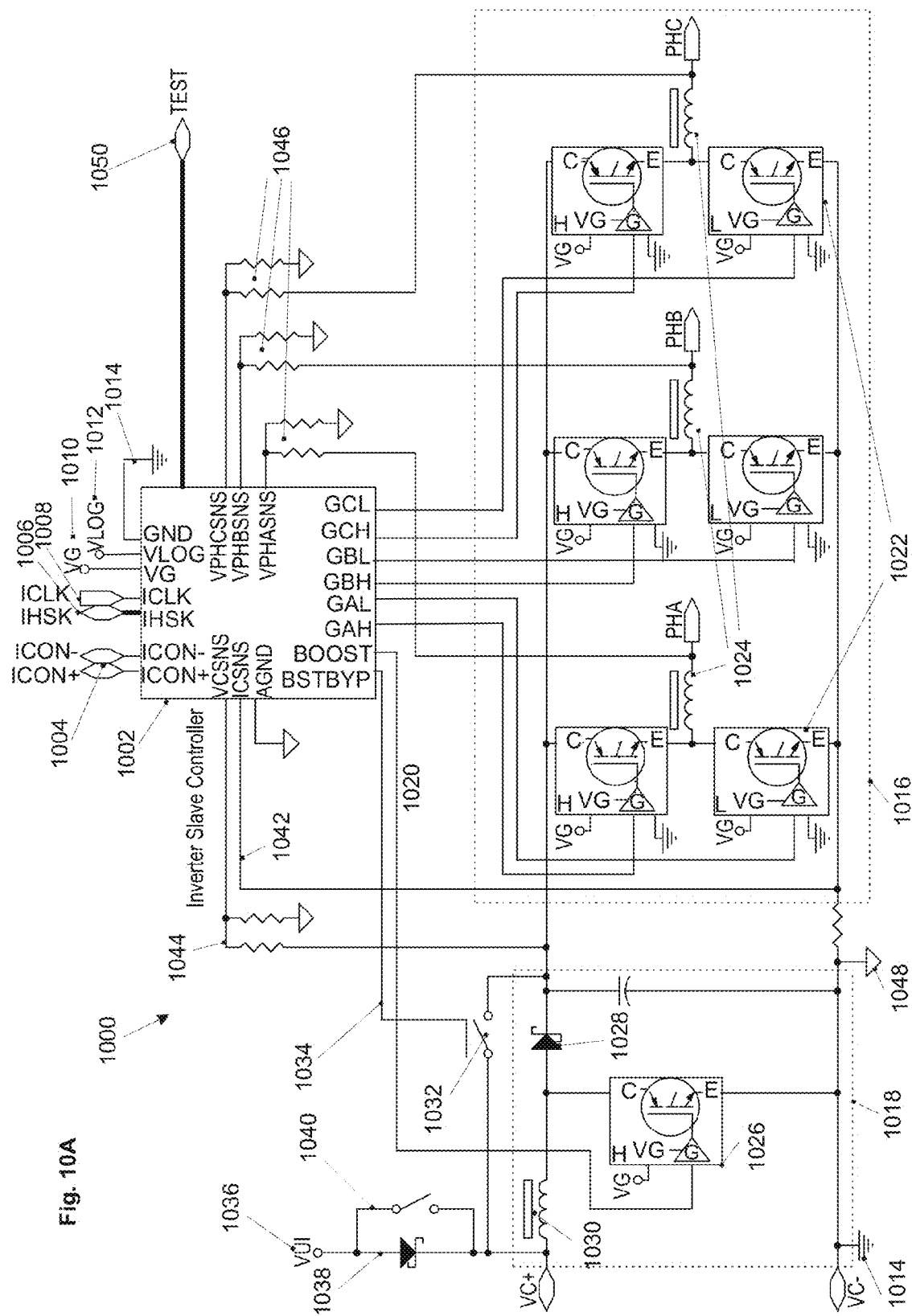
FIG. 10A shows a schematic diagram of an embodiment of an inverter slave according to an embodiment of the present invention.

FIG. 10A shows a schematic diagram of an embodiment of an inverter slave (1000) according to the present invention. This inverter slave comprises a controller 1002 that may perform one or more of the following functions: communicate with its master digitally via 1004; coordinate switching time via handshake signals 1006; derive a processor clock from 1008; and/or obtain logic power 1010 and gate-drive/analog power 1012, and a common voltage reference 1014 (ground) from a mother board. The controller may control switches in a one, two, three, or more phase inverter.

The particular embodiment shown includes a simplified schematic diagram of a three-phase buck inverter, 1016. Alternatively, an inverter slave may comprise a boost inverter.

The particular embodiment shown comprises a boost DC-DC converter. These converters utilize high-side switch modules 1020 and low-side switch modules 1022. The buck inverter utilizes series inductors 1024, sharing a common filter capacitor between slaves off out of the unit. Alternatively, a boost inverter may comprise an individual shunt filter capacitor and shared series inductor.

The boost circuit 1018 shown in FIG. 10A may be operated to provide an extended range of operation of the circuit. If the cluster voltage at maximum power point drops below the threshold needed to perform an inversion to a desired voltage, the inverter may:
1) reduce its power draw until the cluster voltage is sufficiently high to invert;
2) require other inverter slaves that are connected to better-performing (higher-voltage) clusters in the system to compensate by producing disproportionately more power at voltages where the underperforming inverter is not able to source; or
3) turn off One design approach ensures that the cluster bus voltage is normally in excess of the necessary voltage for buck inversion. This approach may employ over specification of switch voltages. This approach may affect average efficiency, since the buck inverter may operate less efficiently with a substantial voltage buck.

Adding a boost stage 1018 may provide the ability for an inverter to boost its voltage to a minimum value needed for inversion, allowing the use of a lower peak-production cluster voltage. The boost phase may use an extra switch 1026, diode or synchronous rectifier 1028, and inductor 1030 (in series with the interconnect inductance).

The inductor resistance and diode's forward voltage drop and resistance, may reduce the inverter efficiency when the boost is not needed. Under such circumstances it may be desirable to close a bypass switch 1032.

This bypass switch may be electronically controlled via 1034. This bypass switch may be mechanical switch, relay, latching relay, and the like.

Potential benefits of switching mechanical switches using motors (discussed above in the context of the balancer circuit), may apply even more favorably for this kind of switch. For example, this boost/bypass mode switch would not necessarily need to be activated more than a few times a day. If activated for 10 hours a day, saving 1 Volt of loss at 10 A, such a switch would save $1 in electricity at $0.10/kW-hr in 100 days. A sufficiently inexpensive mechanical switch activated by a motor (e.g., a simple x-y traverse robot) could cost about $1 each, providing an approximately three month marginal return on investment per switch.

By contrast, alternative switches (such as solid-state relays) typically cost 20 to 50 times as much. And while such alternative switches may offer the advantage of increased switching speed, this may not be as important a consideration for an infrequently activated mode switch.

In some circumstances (for example at night) a cluster receives a small amount of housekeeping power. In some embodiments this housekeeping power may be provided over the cluster voltage lines by the inverter.

When the grid is connected, this house-keeping power may be supplied through the switches 1020 if the diode 1028 is shunted, for example via switch 1032. However, if there is a grid outage when the cluster is not producing, there is the possibility of a power outage at the cluster. This condition could be problematic if the cluster is not producing because it is mis-pointed during the day, leaving the cooling system and tracking system inoperative.

Accordingly, in order to provide a reliable, uninterruptible supply of housekeeping power in all conditions, a UPS such as 906 may be used to supply power 1036 via diode 1038. This circuit sets the minimum cluster bus differential voltage. Alternatively, this supply could be applied via a switch.

It may be desirable to maintain this supply availability whether an inverter slave is operating or not. In some embodiments, diode 1038 resides on circuitry that is not removed when servicing an inverter slave (for example on a mother board that inverter slaves plug to).

Switch 1040 may provide for an array to provide power to the UPS. This power could be used by other clusters, and/or could be used to charge a battery. If present, such a switch may be manual or motor actuated as described earlier.

If the uninterruptible power is diode 1038 connected, it resides on the cluster side of inductor 1030 or the diode 1038 will be forward biased when the boost switch 1026 activates. Because the remote conduction line inductance in series with 1030 may be substantial, the uninterruptible voltage may be sufficiently low compared to normal operating bus voltages, such that the diode does not become forward biased in normal operation. Alternatively, the diode could be switched open when the boost circuit operates.

A potential advantage of the common ground voltage of the cluster and controller 1014, is that current sensing 1042, bus-voltage sensing 1044, and phase voltage sensing 1046 may be performed accurately and inexpensively. Good attention to analog grounding 1048 should be followed.

A test connector 1050 may facilitate automated testing and trouble shooting.

The inverter may accurately track the maximum power point by having a signal or calculated value that is monotonic in output power. Nevertheless, it may be desirable for an inverter to be able to report its production power accurately.

In such cases, the current and voltage sensing of the inverter may require calibration. In some preferred embodiments, a slave will compare its measurements to precision measurements reported from its master to update its calibration. In turn, the slave may provide similar calibration services to balancer circuitry on the slave's cluster.

According to certain embodiments, switch timing is set using one-cycle control, analog feedback. In some embodiments, maximum power tracking is performed using one-cycle control, analog feedback.

In some embodiments the performance of the one-cycle control may be trimmed and optimized by a microcontroller. In some embodiments, the switch timing may be calculated using one or a plurality of digital signal processors or suitably fast digital controllers.

Figure 10B:
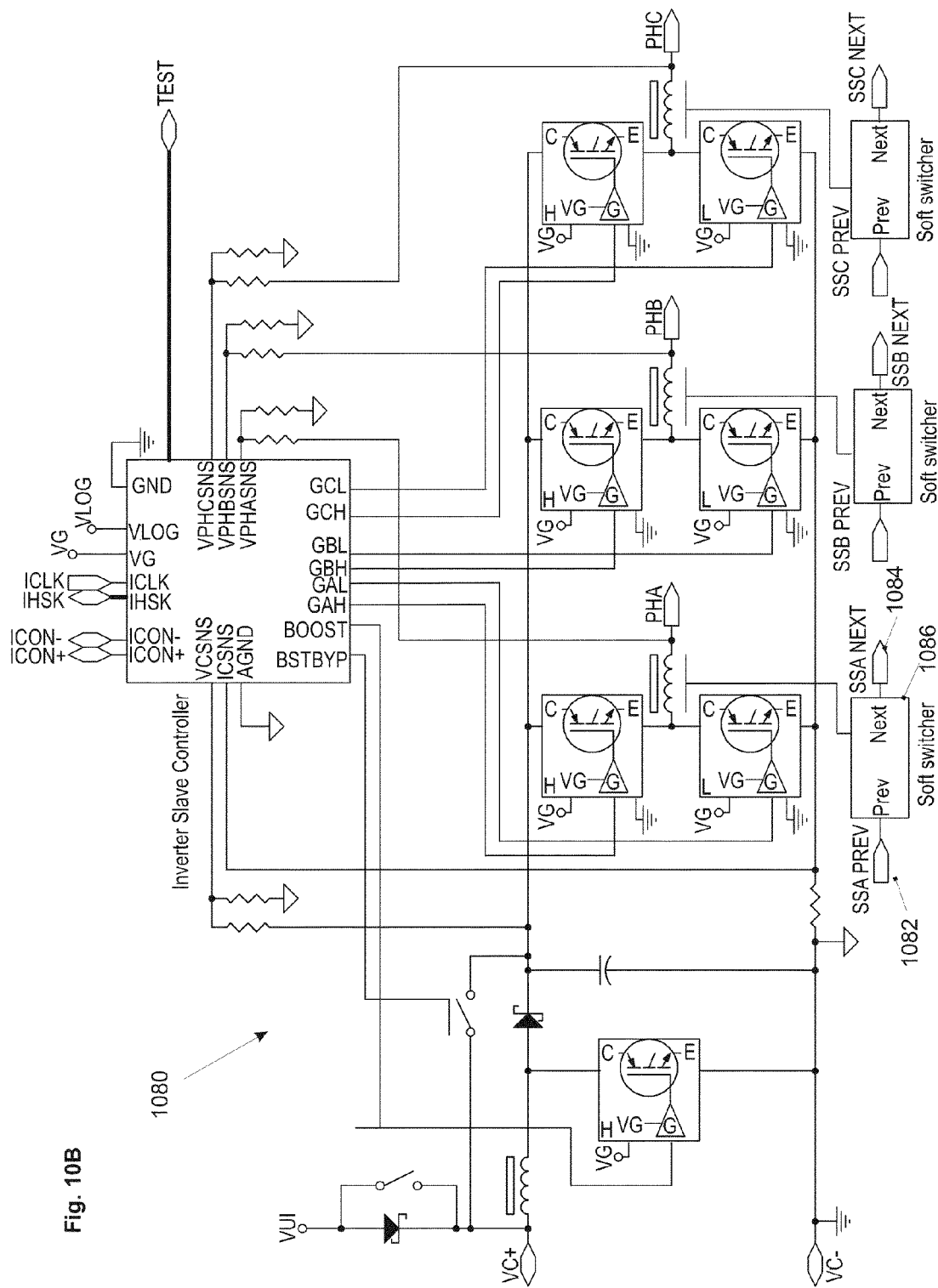
FIG. 10B shows a diagram of an embodiment of an inverter slave that uses a daisy chain of handshake signals to perform soft switching, reduced-stress switching, low-noise, switching, or other switching enhancements.

FIG. 10B shows a diagram of an embodiment of an inverter slave 1080 that uses a daisy chain of handshake signals 1082 and 1084 to perform soft switching, reduced-stress switching, low-noise, switching, or other switching enhancements. This is done via switch timing circuitry, and in some embodiments by auxiliary switching circuitry 1086.

FIG. 11A shows an embodiment of a UPS 1100 associated with inverters according to the present invention. A UPS controller 1102 digitally communicates with the plant via connections 1104.

In this particular embodiment, the communication is shared with the inverter slaves. In some embodiments, the UPS may communicate at a different level in the plant network hierarchy.

This controller performs power management from the grid 1106. In some embodiments the controller performs power management from a generator 1108 such as a diesel generator.

In this embodiment, the controller maintains a battery 1110 at a good state of charge, and supplies an uninterruptible bus voltage at the battery voltage. This embodiment utilizes the battery to provide a low-impedance voltage reference with respect to earth ground 1112.

In this embodiment, this is where earth ground is referenced on the low-voltage side of the step-up three-phase transformer. The connection between earth ground and the common, negative-most voltage reference in the plant is made at some position in the battery stack (e.g., 1114, 1116, or 1118) depending on what negative voltage offset is desired in the common cluster voltage.

Variations are possible. A similar scheme could be used to establish a fixed positive reference. An active switching scheme could be used to establish an arbitrary static or dynamic relationship between earth ground and cluster voltages. The cluster common voltage may be directly tied to earth ground.

During a grid outage, the controller may start generator 1108 to prevent batteries 1110 from depleting their charge. The size of batteries 1110 may be small enough to provide a brief period to start up the generator or to facilitate an orderly safe plant shut down.

In some embodiments, the UPS controller also produces logic 1120 and gate/analog 1122 voltages. The UPS system may be physically separate. For example, a generator 1108 may need to be mounted externally.

Batteries 1110 may be housed where corrosive and explosive gases cannot cause problems. The supplies for 1120 and 1122 may be proximate to the inverter slaves to minimize inductive spikes on the voltage supply.

Figure 11B:
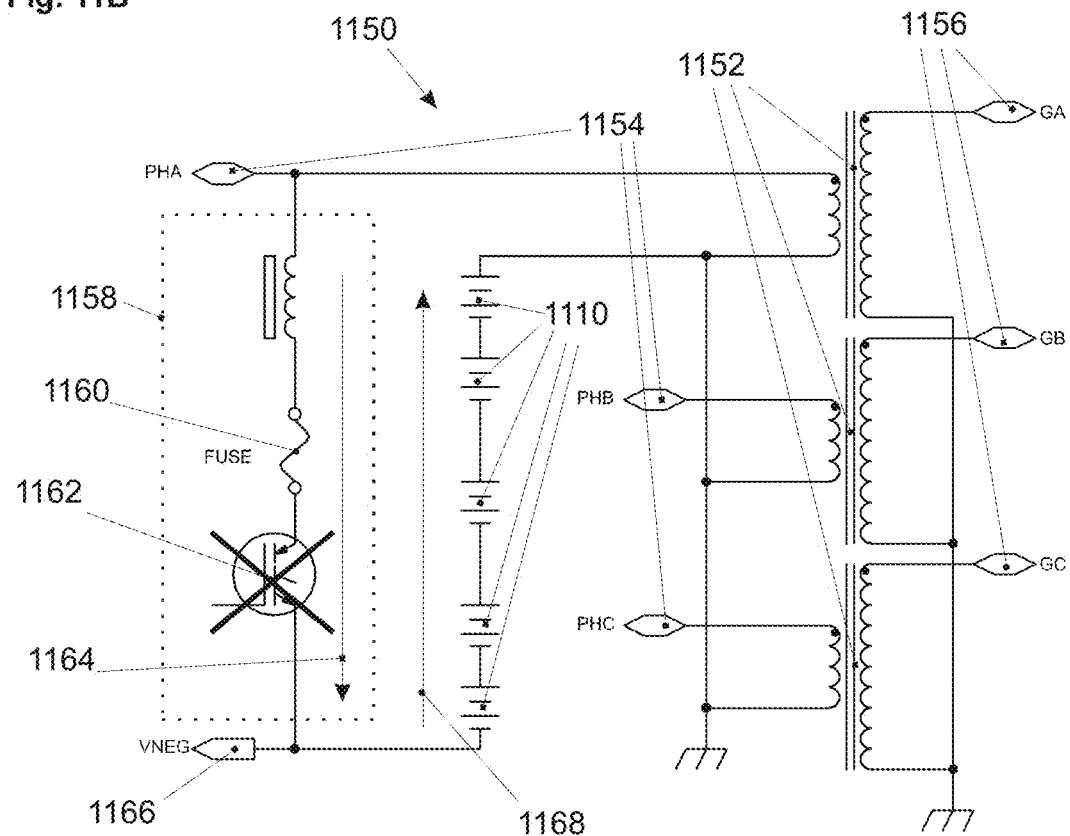
FIG. 11B shows an electrical connection arrangement for reducing secondary damage from a failed switch.

FIG. 11B shows a schematic diagram of an electrical circuit 1150 to the step up transformers 1152 that transform plant voltages 1154 to grid voltages 1156. In this embodiment, transformers 1152 are connected "Wye" to "Wye." It may be desirable to connect the plant side of the step up transform in a "Wye" configuration as shown in FIG. 11B to limit the secondary damage that can be caused by the failure of a power switch. For example, the circuit inside 1158 depicts a failed, fused (1160) power switch 1162 on the low-side of a buck inverter phase. Some switch failures result in the switch having a low-resistance, presenting a short-circuit state. In this embodiment, the resulting high fault current 1164 flowing through the failed circuit may be prevented from substantially affecting the common negative voltage (1166) by conducting a current 1168 through the plant battery 1110.

Without a voltage clamp circuit 1150 capable of handling this large current, the failed switch might cause the voltage 1166 to swing above the voltage of another phase, causing high heating in body or free-wheeling diodes of other low-side switches and possibly producing additional damage before the fuse 1160 can blow.

Figure 11C:
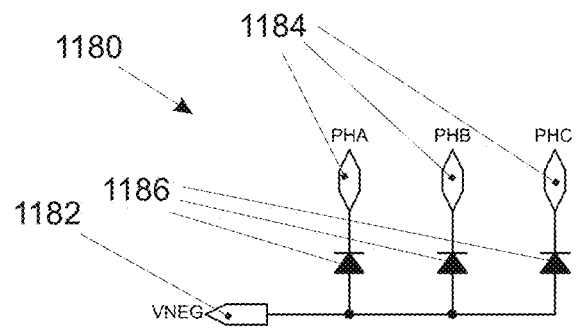
FIG. 11C shows an alternate circuit for reducing secondary damage resulting from an increase in negative common voltage substantially above the three-phase plant voltages.

FIG. 11C shows an alternative circuit 1180 for ensuring that the negative common voltage 1182 never rises substantially above the three-phase plant voltages 1184 by the use of diodes 1186. These diodes must be able to survive very large surge currents. Because 1182 and 1184 are common among all inverter slaves, this protection circuit may appear once in an inverter rather than separately for each inverter slave, e.g., in the UPS module or inverter master.

In some embodiments, such as circuit may establish a common negative voltage without a battery or independently from a battery.

Alternatively, if the positive voltage of all slaves are common, this positive voltage may be prevented from swinging substantially below other phases by a single copy per inverter system of the circuit as 1180, with the diode directions reversed.

In some embodiments, such a circuit may establish a common positive voltage without a battery or independently from a battery.

Protection circuitry such as 1180 may be applied individually per inverter slave to the non-commoned cluster voltage, that is, the positive cluster voltage if the negative cluster voltage is commoned and vice versa. Because of the need for the protection diodes to survive large fault currents such diodes may be relatively expensive. In some embodiments, this individual protection may not be cost justified and the designer may choose to allow two or three same-side switches to fail in tandem rather than to pay the expense of the individual protection diodes.

Figure 12A:
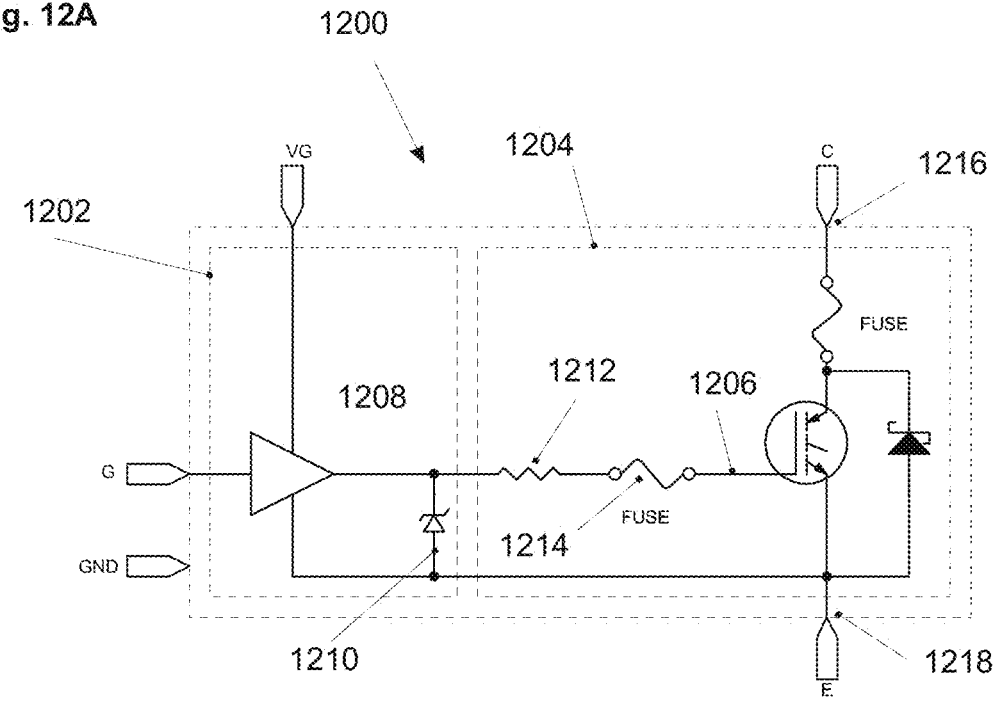
FIG. 12A shows a schematic circuit diagram of a low-side switch module comprising a low side driver module and a switch module.

According to certain embodiments of the present invention, the switch modules shown in FIGS. 10A and 10B may be engineered to be easily replaceable and to minimize secondary damage caused by a switch failure. FIG. 12A shows a schematic diagram of such a low-side switch module 1200 comprising a low side driver module 1202 and a switch module 1204.

The switch module depicts an IGBT and free-wheeling diode, but this is not required by the present invention. In other embodiments a switch module could comprise other elements such as a power MOSFET, solid-state relay, and/or other switches.

Power switch failure may result in a short circuit across the gate. Such a short circuit can expose the driver to excessive voltage and current, and result in destruction of the driver circuit 1208.

Embodiments of a switch module may prevent or reduce this damage by the use of a over-voltage suppressor 1210. Such a suppressor may comprise a zener diode and a gate resistor 1212 and in some embodiments a fuse 1214.

According to some embodiments of the present invention, the gate resistor may be sized to burn out in an over current situation and provide the fusing function. Such a resistor may also be favorable for avoiding latch up in some IGBTs. The circuit protection element 1210 may be sized to survive without damage long enough for the gate fuse or resistor to open its circuit or reach a sufficiently high impedance that the protection element can withstand the gate current.

In spite of protection, a gate driver module 1202 may still be susceptible to damage and may therefore be packaged as an easily replaced, cost optimized consumable.

In some switch failures, the switched terminals 1216 and 1218 become a short circuit. This failure may generally lead to secondary failures related to over current, and could result in significant additional damage from excessive power dissipation.

For this reason, the power module is fused. In some embodiments, the fuse is between the switch and the terminal 1218. This fuse may comprise a conventional fuse, a feature on a PCB trace that breaks or becomes high impedance, a thin or thick film device, a wire, or other forms of fuses that are known.

Figure 12B:
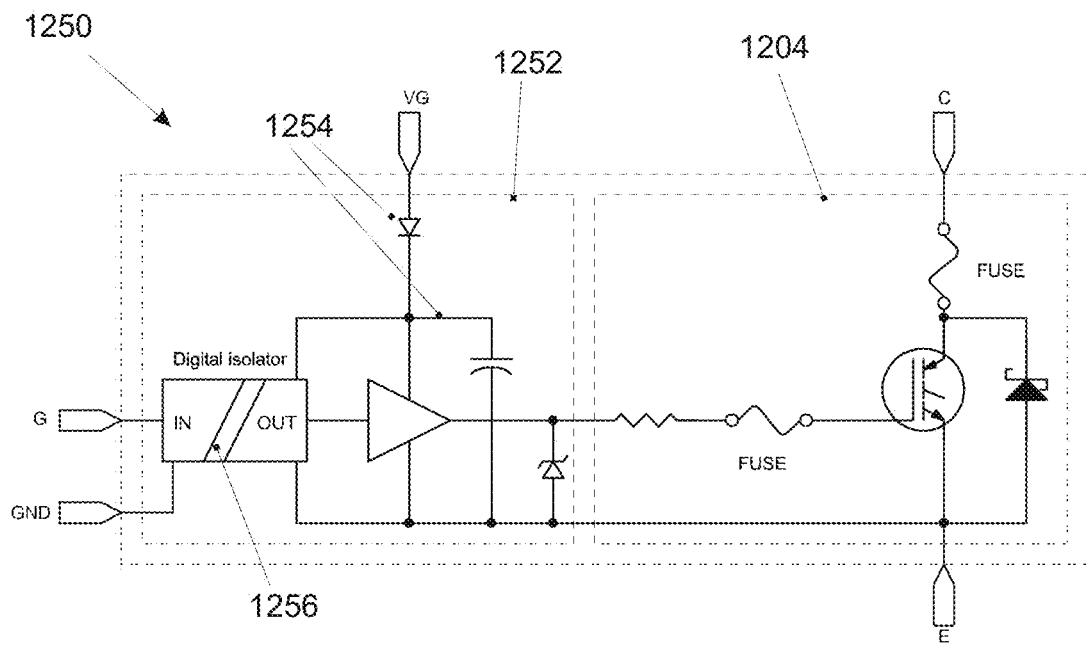
FIG. 12B shows a schematic circuit diagram of an embodiment of a high-side switch module.

FIG. 12B shows an embodiment of a high-side switch module 1250. This module is similar to that in FIG. 12A, but contains a high-side switch module 1252 that provides bootstrapping capability via elements 1254 and a digital isolator 1256. In some embodiments in which bootstrapping is not an option (e.g. static, high-side switches), a high-side driver module may alternatively contain an isolated gate drive power supply.

As with the low-side driver module, the high-side driver module and switch module may be designed such that failure of the switch does not normally produce a driver failure, but that the driver module is a cost-optimized, easily-replaced consumable.

Figure 13A:
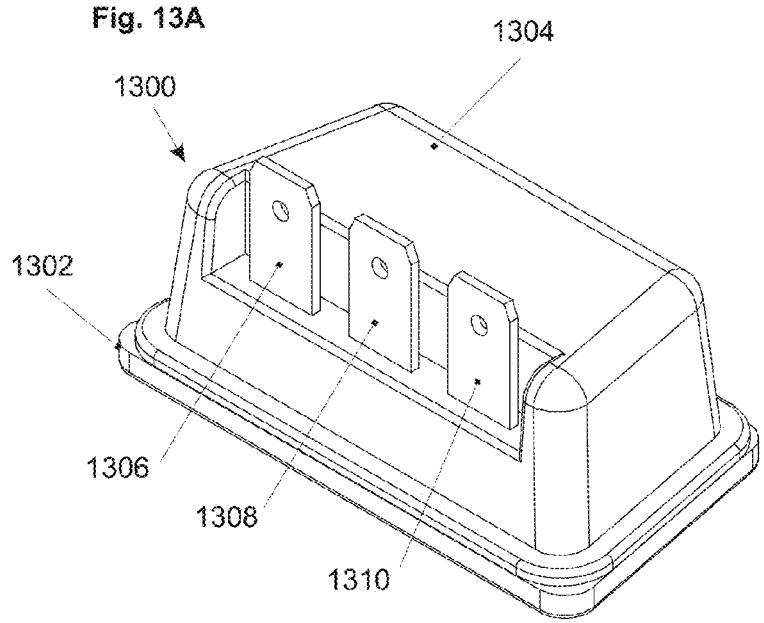
FIG. 13A shows an embodiment of a switch module.

In some embodiments, switch modules may be packaged as a cost-optimized and easily-replaced consumable or reparable module that nevertheless possess exceptionally good heat transfer characteristics. FIG. 13A shows such a switch module 1300.

Element 1302 is a high-thermal conductivity base plate. In some embodiments this plate is constructed from aluminum or copper. In other embodiments this plate may be another metal or a ceramic material.

In some embodiments, this plate is covered when installed with thermal transfer grease or a high-heat transfer compliant material such as a "sil pad", to reduce the contact resistance between the plate and external heat collector. According to certain embodiments of the present invention, this element 1302 is insulated electrically from the switch.

Element 1304 is a module cover. In some embodiments this module cover is molded or cast from a high-temperature-tolerant material, for example a thermoset resin such as epoxy or phenolic, or a suitably high-temperature thermoplastic such as polyester or polyamide, with or without fibers or particulate filling. Desirable properties for this material include high-temperature stability, flame resistance, impact resistance, strength, and insulation.

This module cover may be relied upon to resist forces from a catastrophic failure of the switch and fuses contained within, which may be accompanied by an over pressure and spray of hot metal and momentary arcing. The cover contains physical effects of such failures, avoiding damage to equipment outside the cover. Elements 1306, 1308, and 1310 are ports of the switch (e.g., the gate, collector, and emitter, respectively).

Figure 13B:
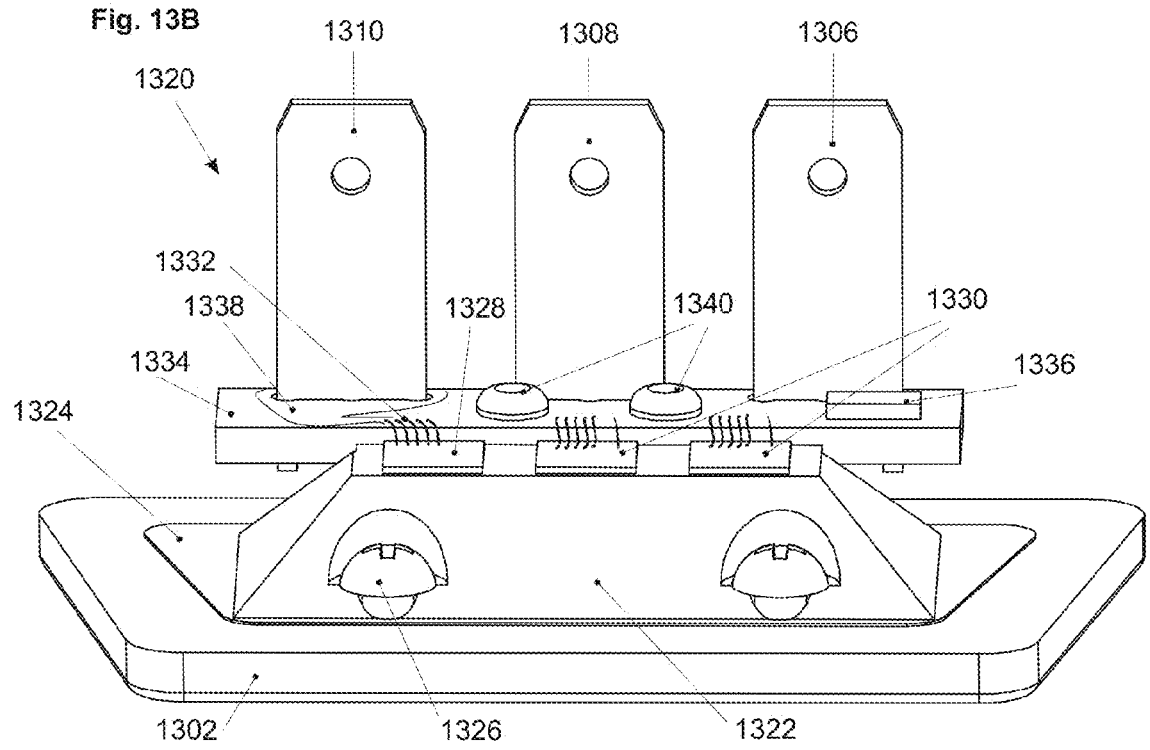
FIG. 13B shows the switch module illustrated in FIG. 13A with its cover removed.

FIG. 13B shows the interior 1320 of the switch module 1300. In this embodiment, heat transfer plate 1302 is electrically insulated from a heat spreader 1322 by a thin insulator material 1324. This material may be any suitable, high-temperature, high-thermal-conductivity electrical insulator, such as mica and synthetic mica plates, alumina ceramics, polyester, polyamide, or polyimide film, etc.

To reduce thermal contact resistance between the electrical insulator and the heat transfer plate, one may employ a mechanical preload, e.g., via screws 1326. Alternatively or in addition, thermal contact resistance may be reduced by the use of heat transfer greases, adhesives, or other known techniques.

The heat spreader 1322 may be constructed by a high-thermal-conductivity material such as aluminum or copper or alternatively another metal or alloy. This element may be designed to reduce the heat flux needed to pass through the electrical insulator by a factor of 2 to 10 to reduce the effective thermal resistance of the electrical insulator.

This reduction may be accomplished by making the heat spreader thick. For example the heat spreader may be on the order of the size of the die or thicker and correspondingly wide at the base, such that the angle from the edge of the die to the corner of the base of the spreader is a minimum of approximately 45 degrees, as shown.

In certain embodiments, the side walls of the heat spreader may not display such a taper. The base size could have approximately the same cross-sectional area and relative relation to the die as shown.

In this embodiment, element 1328 is a fast-recovery Schottky "free-wheeling" diode die. In this embodiments, elements 1330 are paralleled IGBT die. These die are attached to the heat spreader via a conductor using techniques and bonding materials known in the art, such as solder, silver-filled epoxy, and the like.

Elements 1332 are wire bonds. Examples of wire-bond materials include but are not limited to aluminum and copper. Other wire materials may include gold.

These wires connect the die to pads on circuit board 1334. In this embodiment, element 1336 is a gate resistor (such as a thin-film 0805, 0604, 0402 or other resistor) designed to fail open or as a high resistance during a sustained high-current pulse. In alternative embodiments, this resister may be a thick film, a printed resistor or alternate resistor. If a resistor does not have adequate fusing properties, it may be series connected with a fuse.

Element 1338 is a circuit trace designed to fuse when an excessive emitter current is encountered. This trace is designed not to produce excessive resistive losses in normal operation, but to fail quickly when a switch operates far above its rated current, indicating a fault.

Elements 1340 are mechanical supports for the printed circuit board. In some embodiments, these supports are rivets pressed into the heat spreader 1322 that conduct current from the back metallization of the die through the heat spreader to the printed circuit board and then out of the module via a connector (e.g., 1308).

FIG. 13C shows a view of the base (1350) side of the switch module cover 1304, showing a feature of the cover designed to mitigate external damage in the event of a failure. In particular, during a failure hot metal, particulates, and arcs can spray inside the module cover. These can lead to a dangerous over pressure.

To avert an overpressure and control the location and rate of release of excess pressure from the module without releasing harmful particles to sensitive circuit areas, vents and/or filters can be used. These vents and/or filters can be combined with the structure of the housing.

In FIG. 13C, element 1352 is notch cast or molded into the cover base 1350 that serves as a vent hole. During a failure, particles and gases rapidly enter this channel. Some particles are unable to turn the corner into channel 1356 and are trapped in reservoir 1354. The remainder of particles and gas pass through 1356.

Some particles are trapped in secondary reservoir 1358, having been inertially separated from the gas by the abrupt turn into channel 1360. Finally some particles are trapped in tertiary reservoir 1362.

The gas, now cooled by passage and stripped of most of its particles and all of the liquid metal particles escapes through external vent 1364. A duplicate vent 1366 may provide for reduced back pressure.

The necessary area and number of the of vents depends on the expected amount of energy release during a failure and air volume trapped within the cover. The ports for terminals 1368 may be designed to resist venting, since in some embodiments, venting through those ports may put particles in sensitive areas.

Variations are possible. In some embodiments, venting and filtering may employ mechanical filters instead of cyclonic or inertial filter. In some embodiments the cover may be designed with multiple walls to contain particles or with a compressible element to contain expanding gasses without leaking.

FIG. 14A shows a simplified mechanical drawing of the assembly 1400 of switch modules 1402, low-side modules 1404, and high-side driver modules 1406 into an inverter slave housing 1401. In the particular embodiment shown, the low-side and high-side driver modules contain a feature 1408 that indicates insertion direction and facilitates module removal. The recesses 1410 and 1412 in the surface of 1401 establishes the module insertion orientation.

In some embodiments, the physical design of the module makes it impossible to insert in the incorrect orientation or slot, e.g., the shape of modules 1404 and 1406 are designed not to fit into each other's slots. Switch modules 1402 may be similarly keyed to avoid incorrect orientation and to avoid plugging an incorrect module, e.g., wrong voltage or current rating, switch type, etc. into a module recess, e.g., 1414.

In this particular embodiment, the ledge 1416 presses against the module cover. This provides mechanical decoupling of forces normal to the heat transfer plate 1302 and electrical terminals, e.g., 1308. This pressure can also provide an enhanced seal that prevents particles from entering the inverter slave, since gases and particles are vented between the plate 1302 and cover base 1350.

FIG. 14B shows an arrangement 1440 of low-side 1404 and high-side 1406 driver modules and switch modules 1402 inserted into an inverter slave housing 1401, according to an embodiment.

Figure 14C:
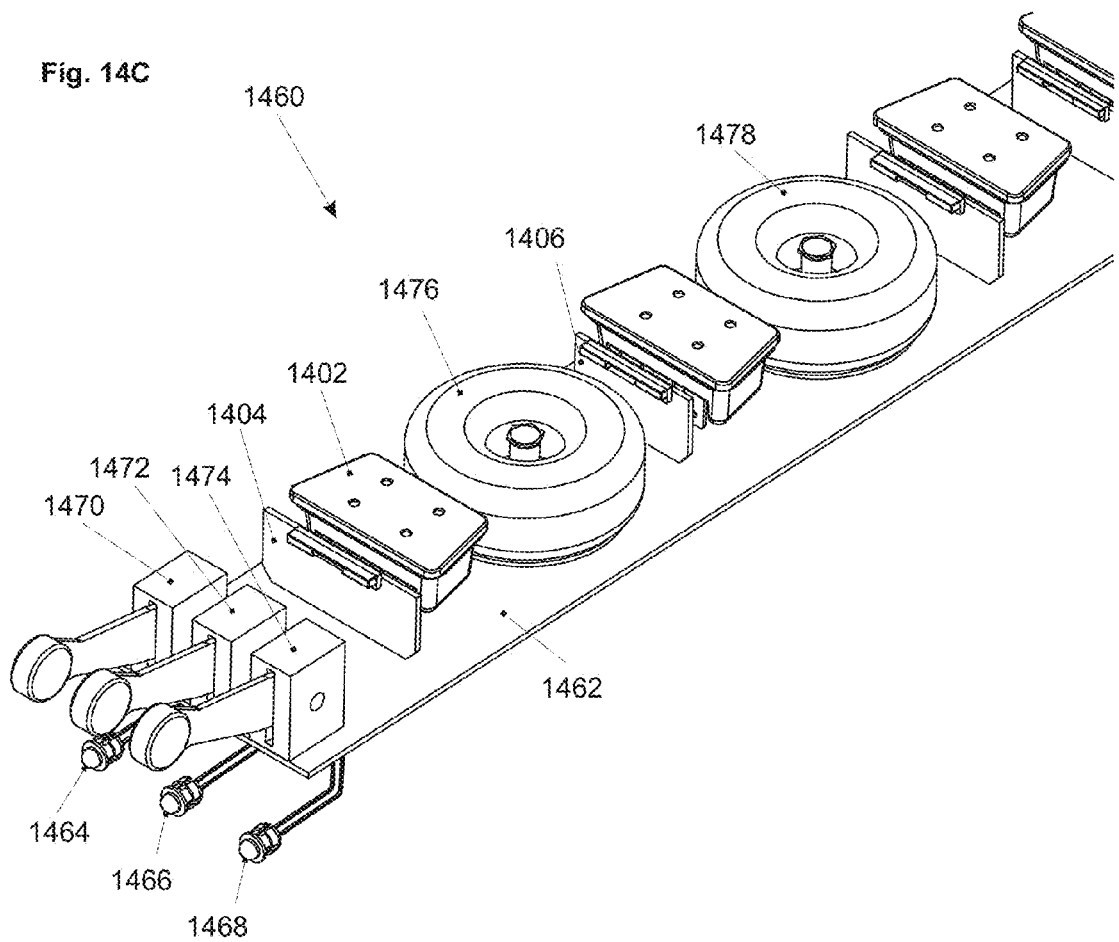
FIG. 14C shows a simplified internal assembly of an embodiment of an inverter slave.

FIG. 14C shows a simplified internal assembly 1460 of an embodiment of inverter slave. This figure illustrates one manner, in accordance with one embodiment, of orientation of modules 1402, 1404, and 1406 with respect to the printed circuit board 1462.

Elements 1464, 1466, and 1468 are indicators, such as light emitting diodes (LEDs). In some embodiments these indicators provide simple feedback about the state of the inverter. For example, these indicators can indicate:
 all indicators off=no power (inverter slave disconnected from mother board);
 indicator 1464 glowing or flashing red=fault, require service;
 indicator 1466 glowing green or yellow=boost circuit activated, indicating that it is not safe to close boost-circuit bypass switch (e.g. 1472);
 indicator 1468 glowing green=operating or passed self check: ready to engage. Alternatively indicators could be multiple color LEDs.

One possible goal of embodiments according to the present invention, may be to allow for convenient maintenance. Accordingly, simplifying the human interface may be important.

For example, it may be undesirable to use a red LED to indicate anything but a fault. On the other hand, it may be important to use flashing LEDs to indicate faults so that color-blind operators are not at a disadvantage. In some embodiments, flashing and red light is used as a fault indication and steady and green light is used as a normal operation indication.

Elements 1470, 1472, and 1474 are switches that may be used to optimize inverter efficiency, such as bypass the boost circuitry when it is not needed. In some embodiments there may be no switches, one switch, two switches, three switches or more according, to how many optimizations or operating modes are available. These switches can be actuated manually or via a robotic traverse, and can provide a clear visible indication of switch state.

Elements 1476 and 1478 are power inductors. For example, element 1476 may be the inductor for a boost circuit and 1478 may be an inductor in a buck inverter phase. These inductors may generate significant heat and are mounted in good thermal communication with the top of the slave inverter housing 1401, where active cooling may be applied.

Figure 15A:
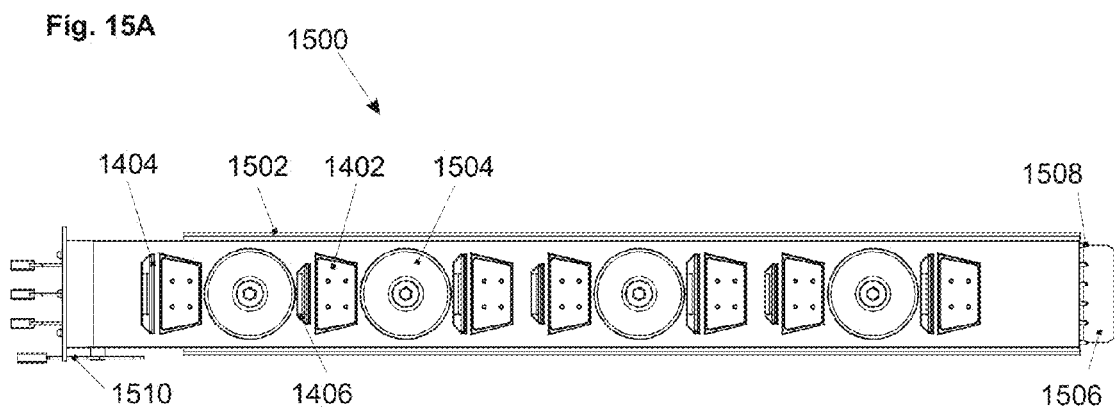
FIG. 15A shows a top view of an inverter slave according to an embodiment of the present invention.
Figure 15B:
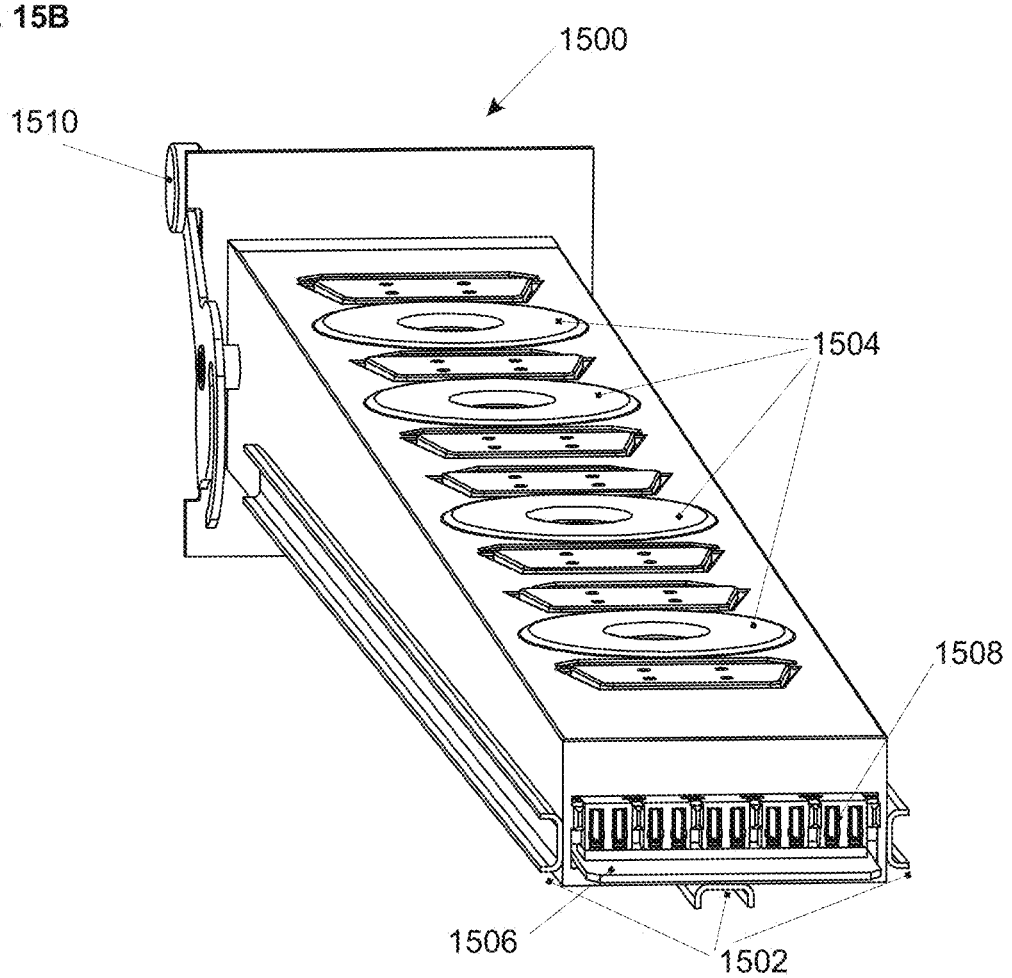
FIG. 15B shows a shows a back side view of an inverter slave according to an embodiment of the present invention.

FIG. 15A shows a top view of an inverter slave 1500, and FIG. 15B shows a back side view of an inverter slave 1500, in accordance with an embodiment of the present invention. Elements 1502 are rack slides which may be used to guide the inverter into place in a rack, and to transfer compressive preloads on heat transfer elements to inverter structure.

Element 1504 is a raised section of the inverter housing. Element 1504 may provide good thermal contact with an active cooling plate to transfer heat from a power inductor.

Element 1506 is an element of the inverter that makes early contact with the mother board. Element 1508 are the high-voltage power connectors. Element 1510 is a lever used to engage and disengage the inverter slave. Element 1510 may alternatively be another physical mechanism that provides mechanical advantage, such as one or a plurality of levers having different characteristics or orientation from that in 1510, one or a plurality of screws, or a combination of different mechanisms that achieve substantially the same function as element 1510.

According to certain embodiments, the invert connectors and electronics may be engineered so that the inverters can be "hot plugged," in some embodiments via one or more of the following operations:
1) Inserting the inverter phase to the rack causes the inverter housing to be a earth ground and drains off electrostatic charge to ground safely.

2) Sliding the inverter to the end of its travel with the lever 1510 in the up position, stops the inverter slave short of any electrical connections other than earth ground.
3) Lowering the lever 1510 to the down position allows the inverter slave to be pushed further, allowing the logic circuitry to engage with the motherboard but preventing any high-voltage power connections from contacting.
4) The order of circuit contacting may be: inverter slave ground (1014), then logic power (1012), then gate power (1010), then processor clock (1008), then communications and handshaking circuits. In some embodiments, the clock signal may be applied before the gate power circuit.
5) In this lever position, the unit undergoes a boot up self check and communicates with the master inverter. If the unit checks out, it turns on a green light, such as a green, slowly flashing light, to indicate to the operator that it is ready to be engaged with high-voltage power. If not, the unit turns on a fast flashing red light to indicate that the inverter is not ready to be engaged.
6) If the unit indicates a fault, the unit is removed and taken to a test fixture for automated diagnosis and troubleshooting. When the unit is repaired, the fixture may set a flag indicating a clear state of health. In general, a fixture may set a usage timer that may expire periodically to prompt an inverter for return to the test fixture for preventive maintenance, diagnostics, and recalibration.
7) If the unit does not indicate a fault, the user then engages the high-voltage power electronics by pulling up on lever. This lever contains a cam which forces the inverter backward with mechanical advantage.
8) The unit detects the state of the power and begins to engage in switch synchronization and power inversion.

To remove a unit the following procedure may be employed:
1) One may choose to do a "safe shut down" by alerting the master controller of this intention via a software interface. This may in turn alert the cluster to go into a non-power producing mode, tell the inverter to stop switching, etc.
2) The user lifts the engagement lever 1510, removing the high-voltage power connections.
3) The user then pulls the unit out of its slot for maintenance or pulls the unit out far enough to disengage logic power, raise lever 1510 and slide the inverter slave back to rest in the full disengaged position.

In some embodiments of the present invention, an inverter will be housed with a supply of spare consumables, a test fixture, and/or a number of operable spare inverter slaves, so that down time for an inverter phase is limited to the time required to swap out inverter slaves. A maintenance worker can replace consumables and use the test fixture to re-commission inverter phases offline.

Figure 16B:
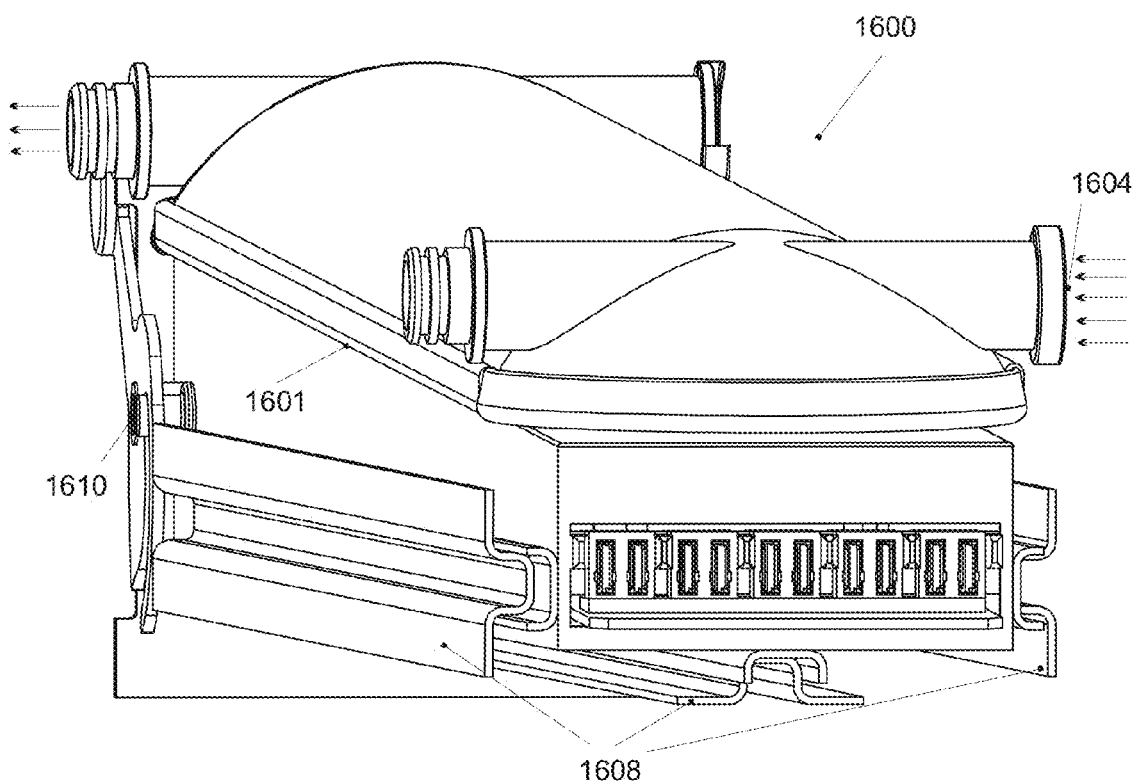

FIGS. 16A and 16B respectively show isometric top front and back views 1600 of an embodiment of an inverter slave engaged with its active cooling module 1602. The inverter housing top surface has an wedge angle 1601 such that as it slides toward the back of its travel it engages with the bottom surface or cooling plate 1603 of the cooling unit 1602.

Element 1604 is a coolant inlet port, and element 1606 is a coolant exit port. Elements 1605 and 1607 are coolant bypass ports, allowing these cooling heads to be arrayed in parallel.

Elements 1608 are reinforced rack rails (reinforcements not shown) that maintain a large mechanical preload between the elements 1504 and 1402 and the cooling module bottom surface or cooling plate 1603. Other reinforcements between the cooling module and rack, which do not move with respect to each other, are also not shown for clarity.

Raising the lever 1510 causes a cam to bear on rack-mounted pin 1610 with mechanical advantage that slides the inverter slave toward the back. Working with the wedge angle of the inverter top in this manner produces a significant mechanical preload to reduce thermal contact resistance to cooling module.

Figure 17A:
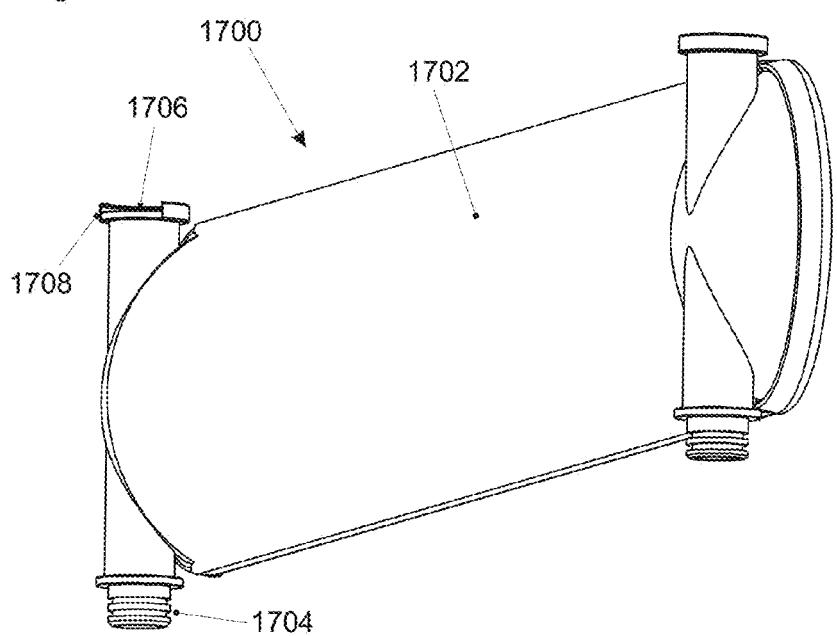
FIGS. 17A-17D show components of an embodiment of a coolant module.

FIGS. 17A-17D show components of the coolant module embodiment 1700. In FIG. 17A, element 1702 is the coolant module housing which provides a reinforced back wall of the coolant flow conduit and provides for fluid entry and exit through engineered, leak proof connectors employing redundant o-ring seals in a male connector 1704, which mates with an engineered female connector 1706 of another coolant module 1700.

A spring clip 1708 holds the mated connector securely. The coolant module housing seals to the cooling plate via an o-ring that is maintained under compression by near continuous spring clips.

Figure 17B:
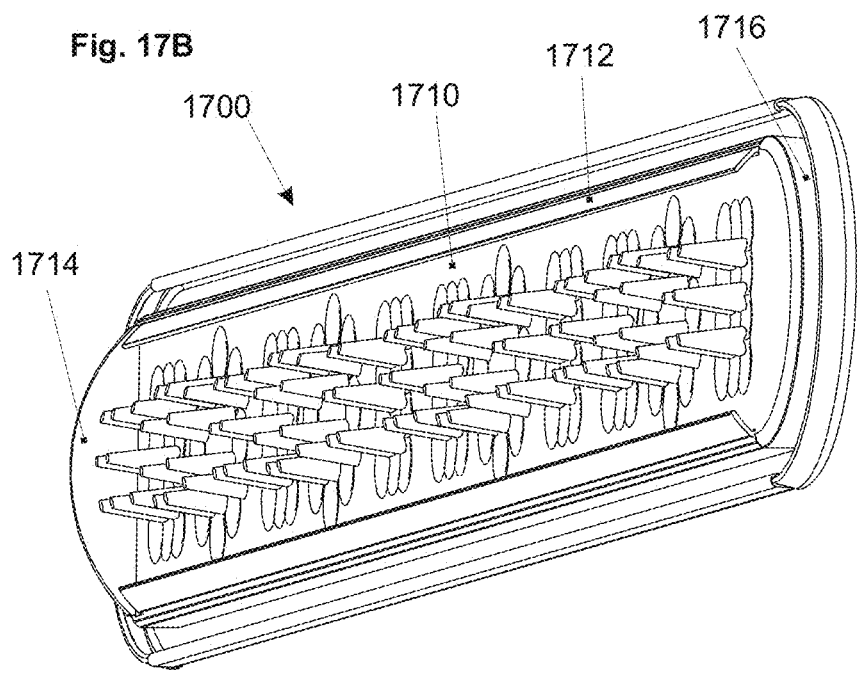

FIG. 17B shows the coolant module with the module housing removed, revealing the flow splitter plate 1710. The flow splitter plate contains arrays of nozzle orifices that direct coolant from the cool side (shown) to the hot side (obscured) by the splitter plate. By inertially transporting cool coolant to the coolant plate, these jets efficiently cool against high heat flux with low flow pressure drop.

This splitter plate contains features (such as 1712 and 1714) to make a substantially leak-free seal from one side of the splitter plate to the other via the coolant module housing and other features 1716. This makes a substantially leak-free seal from one side of the plate to the other via the cooling plate. Leaks from one side to the other of the splitter plate do not result in external coolant leaks.

Figure 17C:
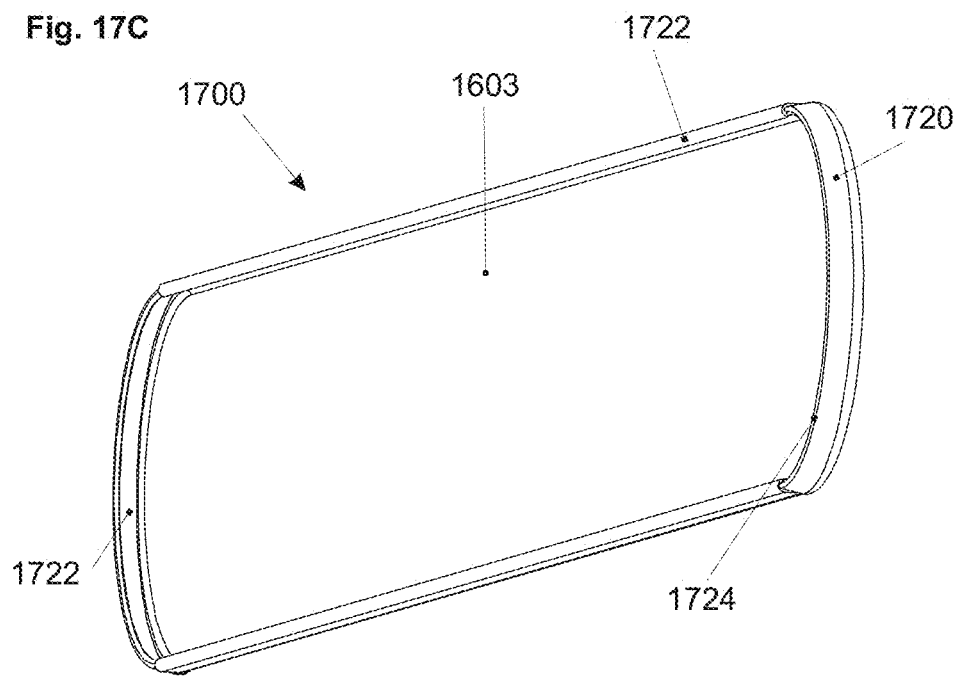

FIG. 17C shows the cooling module 1700 with the housing and splitter plate and o-rings removed, leaving the cooling plate 1603 and end clips 1720 remaining. The cooling plate contains clip features 1722 to retain the housing against the internal pressure. The end clips provide this retaining feature (1724) over the region that the cooling plate does not have this feature.

Figure 17D:
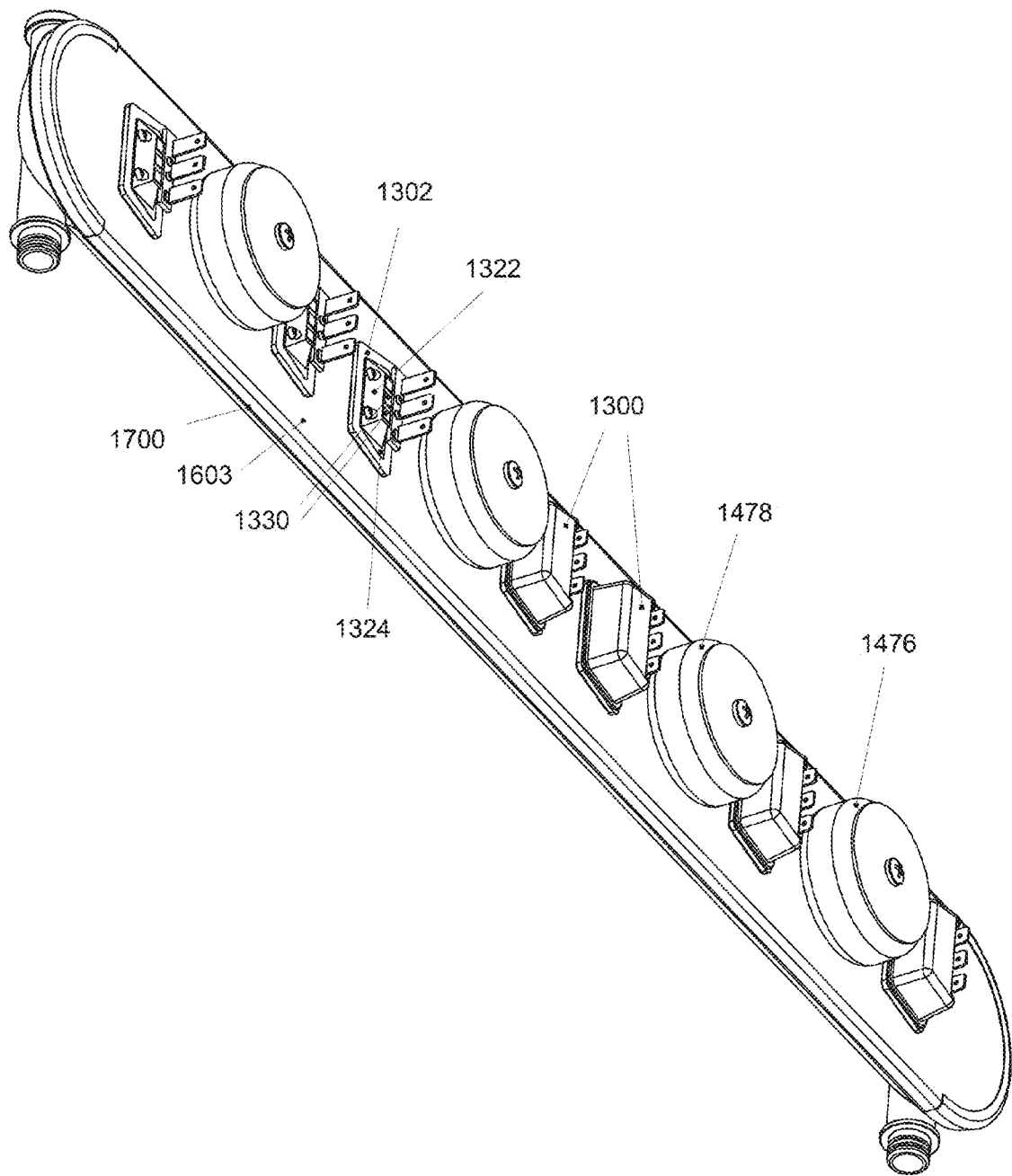

FIG. 17D shows the full cooling module 1700 with the location of the cooled components, 1300, 1478, 1476, etc. relative to the cooling plate revealed. Heat from a switch flows from die 1330 through spreader 1322 through electrical insulator 1324, through plate 1302 through cooling plate 1603 and into the coolant.

Figure 17E:
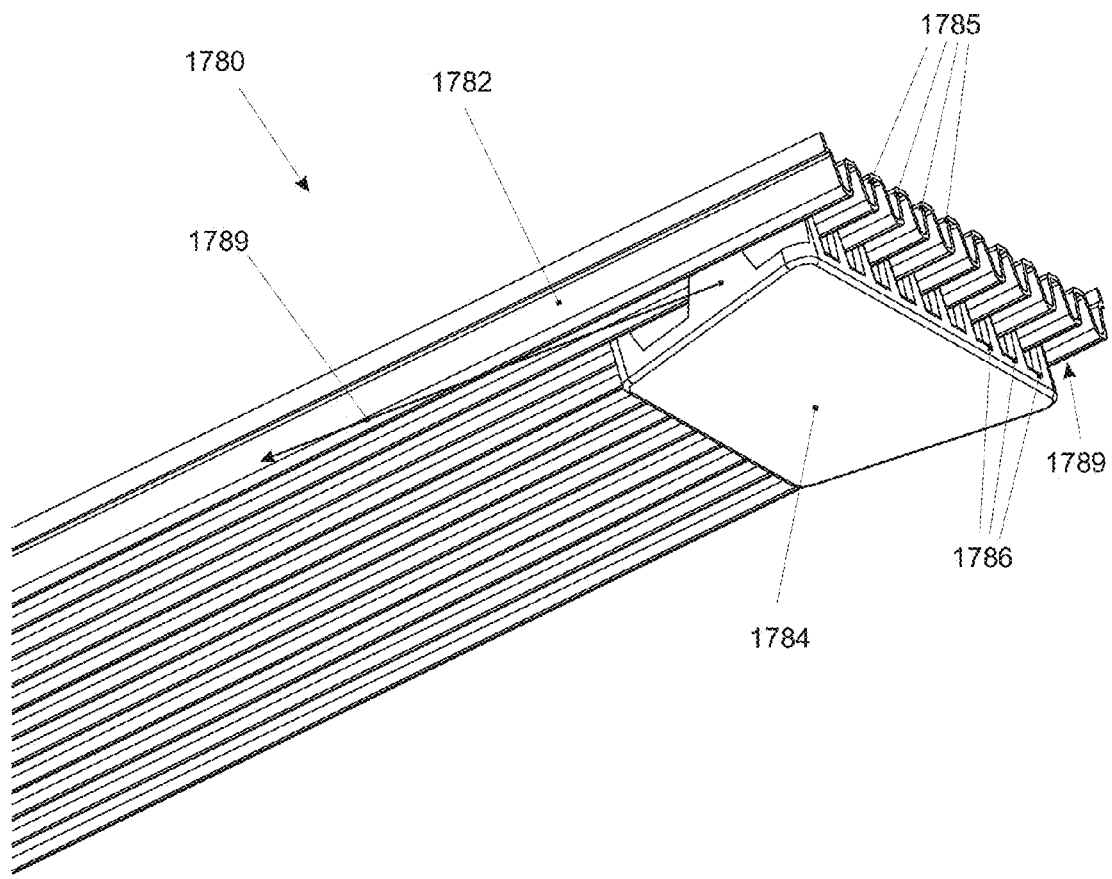
FIG. 17E shows an alternate interface that mates the cooling module and cooled elements

FIG. 17E shows an alternate embodiment of the interface 1780 between the cooling plate 1782 and a cooled component, e.g., a switch module having cooled plate 1784. Nesting, and in some embodiments intentionally interfering and binding features 1785 and 1786, reduce contact resistance by increasing the total mechanical preload forces between the surfaces for a given normal force applied between the elements 1788. This reduced force may reduce the mechanical reinforcement required by the frame and the loads transferred through the cooling system plate to the cooling system housing for a given thermal resistance. The inclined force 1789 applied, e.g., by a front-panel lever, may further reduce the mechanical effort required of an operator to obtain a high-conductivity thermal interface.

Figure 17F:
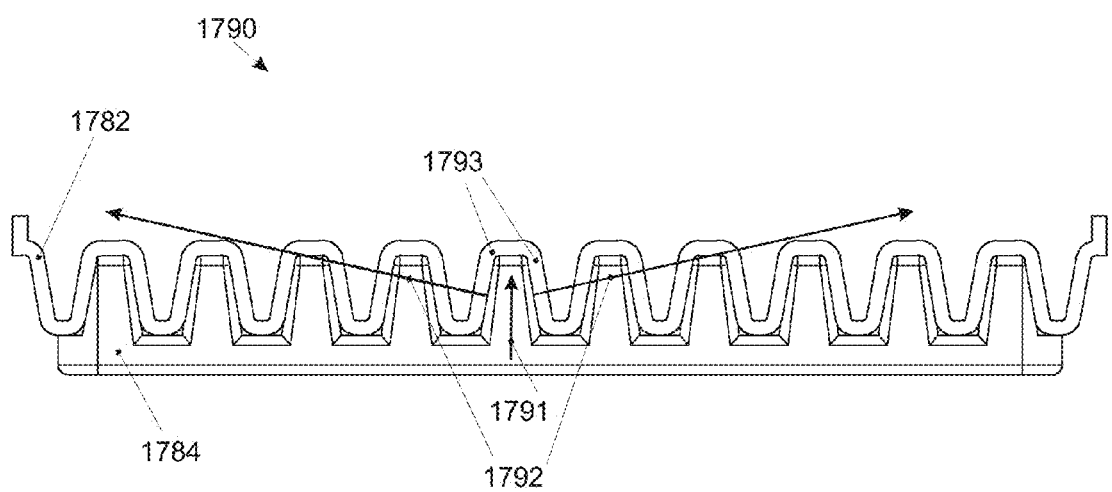
FIG. 17F is an expanded view of the cooling plate and cooled plate interface arrangements illustrated in FIG. 17F.

FIG. 17F shows an expanded edge view 1790 of the cooling plate 1782 and cooled plate 1784 interface. Because of the wedge geometry a normal preload force 1791 produces much larger opposing preload forces 1792 that are largely borne by stresses internal to the plates, e.g., at 1793. This technique is mechanically efficient because it creates and resolves the large forces locally, using internal stresses rather than requiring physically large and remote structural elements to bear high loads. This arrangement may further minimize detrimental thermal expansion effects on the mechanical preload 1793. In some embodiments this interface is designed to increase the mechanical preload under conditions of relatively high cooled-plate temperatures so that thermal expansion provides a beneficial effect.

Figure 17G:
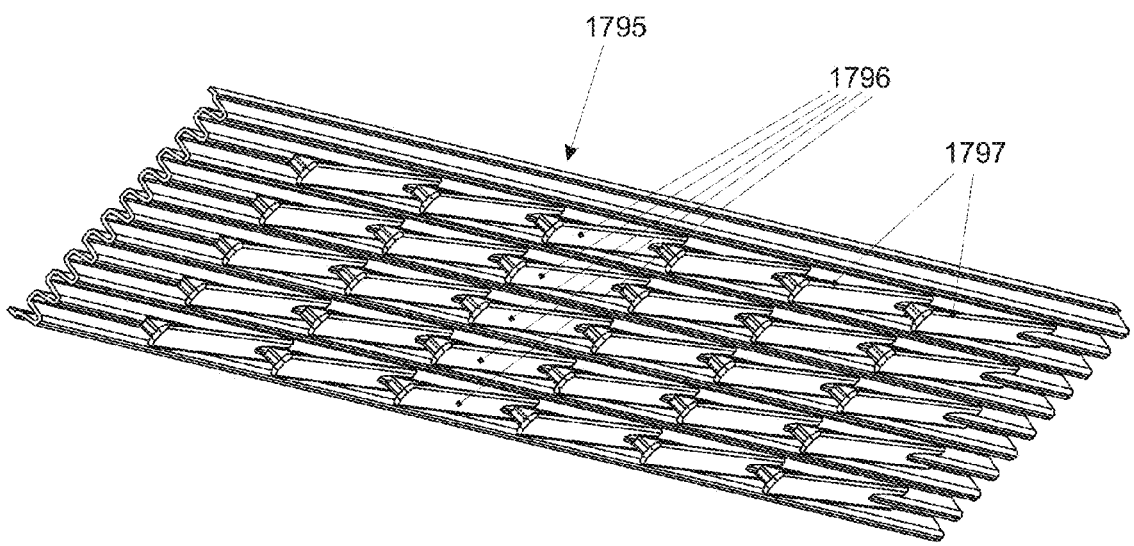
FIG. 17G shows an alternate interlocking interface between the cooling plate and cooled elements.

FIG. 17G shows and alternative embodiment of a cooling plate design 1765 that may further reduce the loads and sensitivities to compliance between the cooling system and support rack and inverter slave housing and support rack. In this embodiment one or a plurality of features, e.g., 1796 may mechanically interlock with mating features on a cooled plate such that the interlocking features bear a substantial portion of the normal force between the cooled and cooling plate. These features may be designed to allow multiple cooled plates to be interlocked by staggering the heights between successive patterns as indicated by 1797.

Figure 18A:
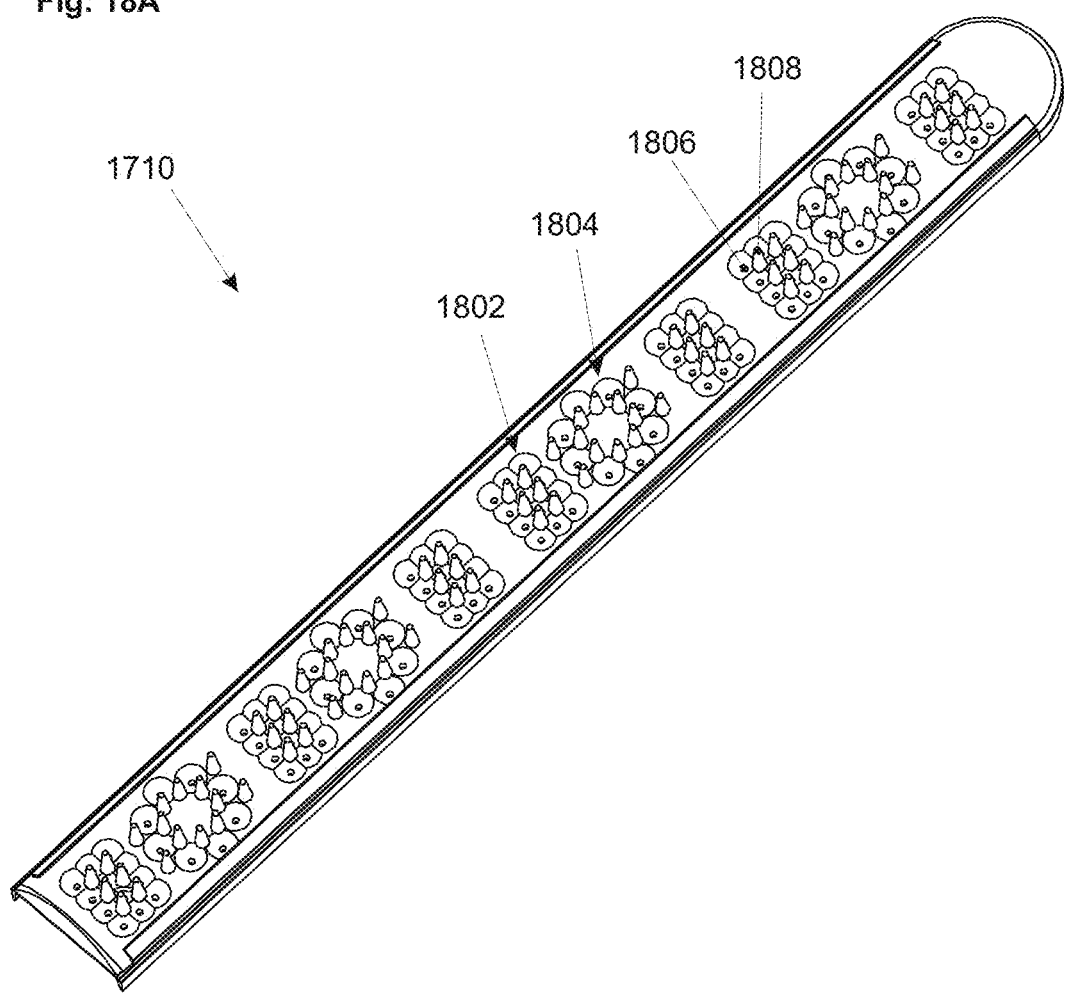
FIGS. 18A and 18B show the cold side of a splitter plate.
Figure 18B:
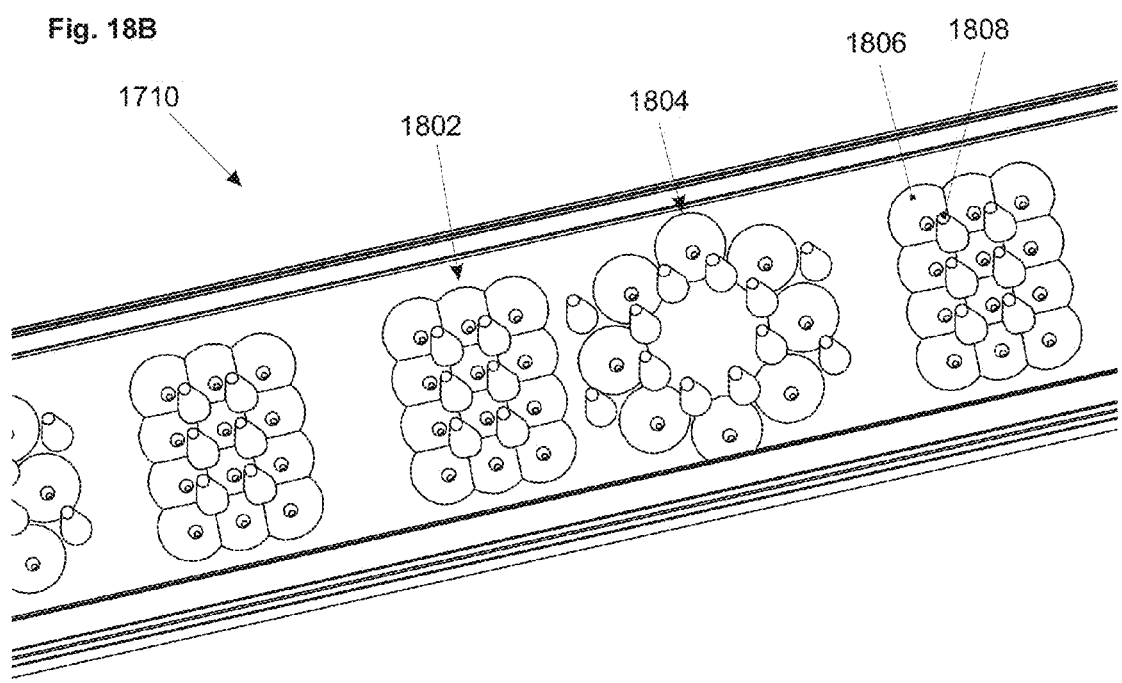

FIG. 18A illustrates the cold side of the splitter plate 1710. FIG. 18B is an enlarged view of the cold side of the splitter plate 1710 illustrated in FIG. 18A. Within the splitter plate, there are arrangements of features 1802 designed to cool a switch module efficiently and features 1804 to cool an inductor efficiently. The active splitter elements include nozzles (e.g. 1806) and support posts (e.g. 1808). The support posts transfer preload forces to maintain low thermal contact resistance.

Figure 18C:
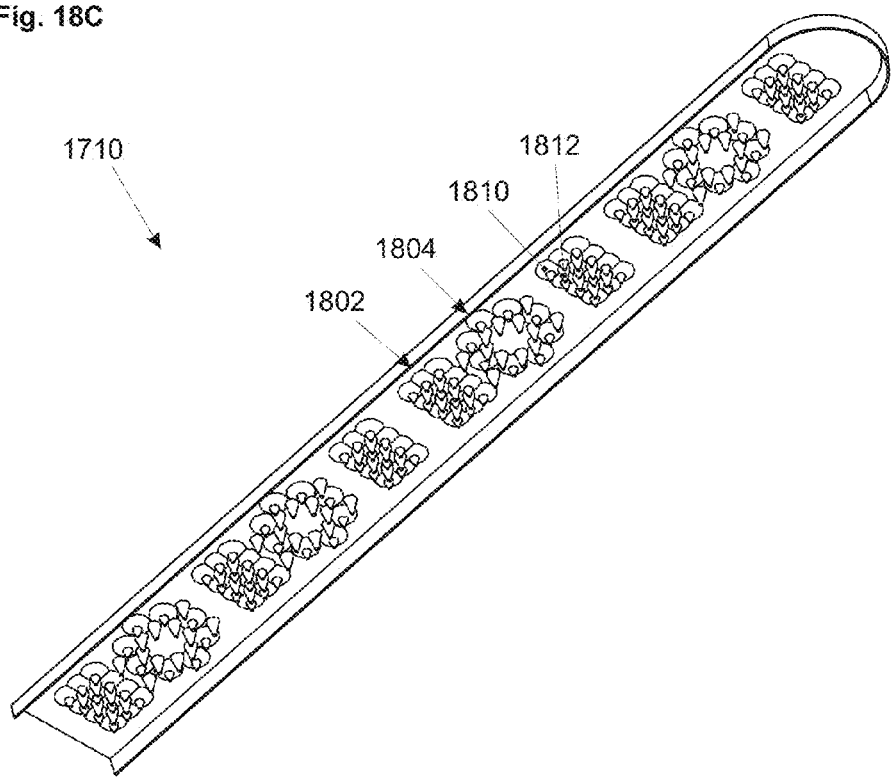
FIGS. 18C and 18D show the same patterns on the hot side of the splitter plate.
Figure 18D:
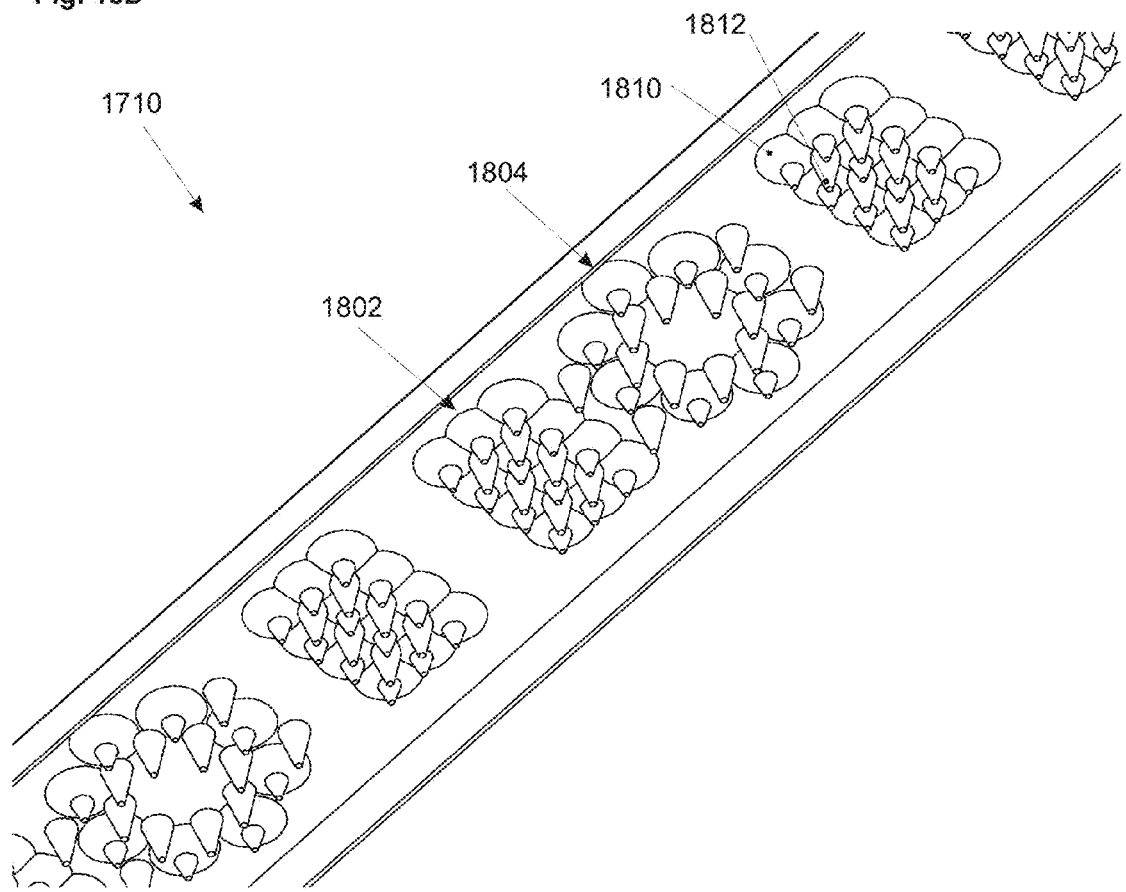

FIG. 18C illustrates the same patterns 1802 and 1804 on the hot side of the splitter plate. FIG. 18D is an enlarged view of the hot side of the splitter plate illustrated in FIG. 18C. The rear surfaces of the nozzle (e.g. 1810) and spacer (e.g., 1812) are indicated. The spacers protrude further than the nozzles and establish a nozzle stand-off distance for maximum jet-cooling efficiency.

In some alternative embodiments of the present invention, ridges and valleys or other features on the cooling plate may alternatively set the nozzle stand-off distance. In some embodiments, structure of the nozzle wall may bear on features on the cooling plate, performing a combined function of establishing the jet and the spacing of the jet on the surface. In some embodiments, a nozzle sprays a jet into one or channels comprising a linear recess in the cooling plate. In some embodiments, this recess may be produced by extrusion, stamping, or forming, e.g., roll forming. In some embodiments the surface of the cooling plate opposite the jets contains features that mesh and bind with features on the surface of cooled items, such as 1302. In some embodiments, the nozzles are designed to direct coolant toward areas were the binding force or normal force between the cooling plate and the cooled items is high.

Figure 18E:
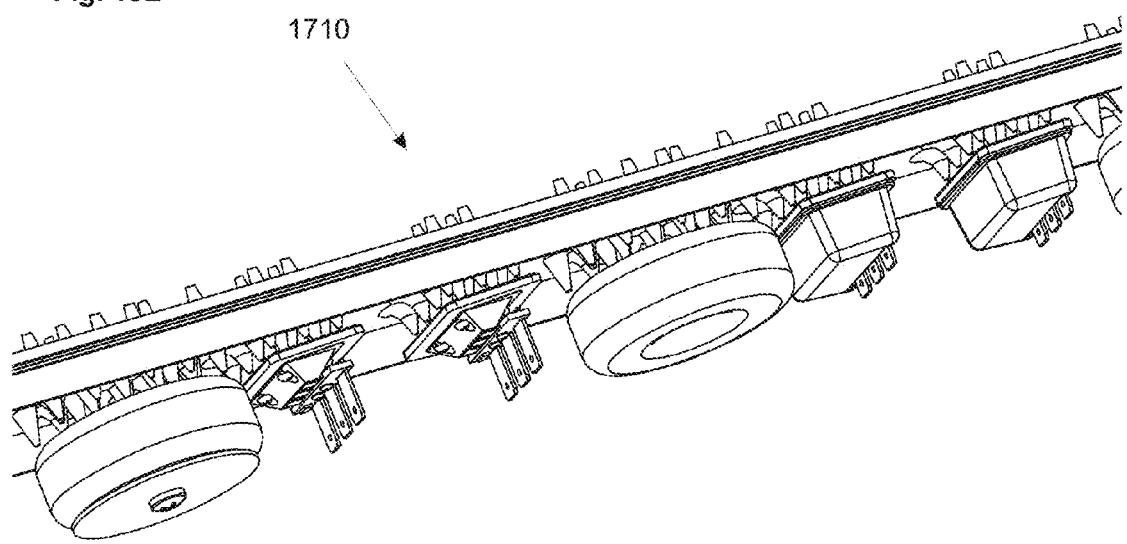
FIG. 18E shows how the cooled components lie physically with respect to the patterns of jets in the splitter plate.

FIG. 18E is an illustration showing how the cooled components are arranged physically with respect to the patterns of jets in the splitter plate.

Figure 19:
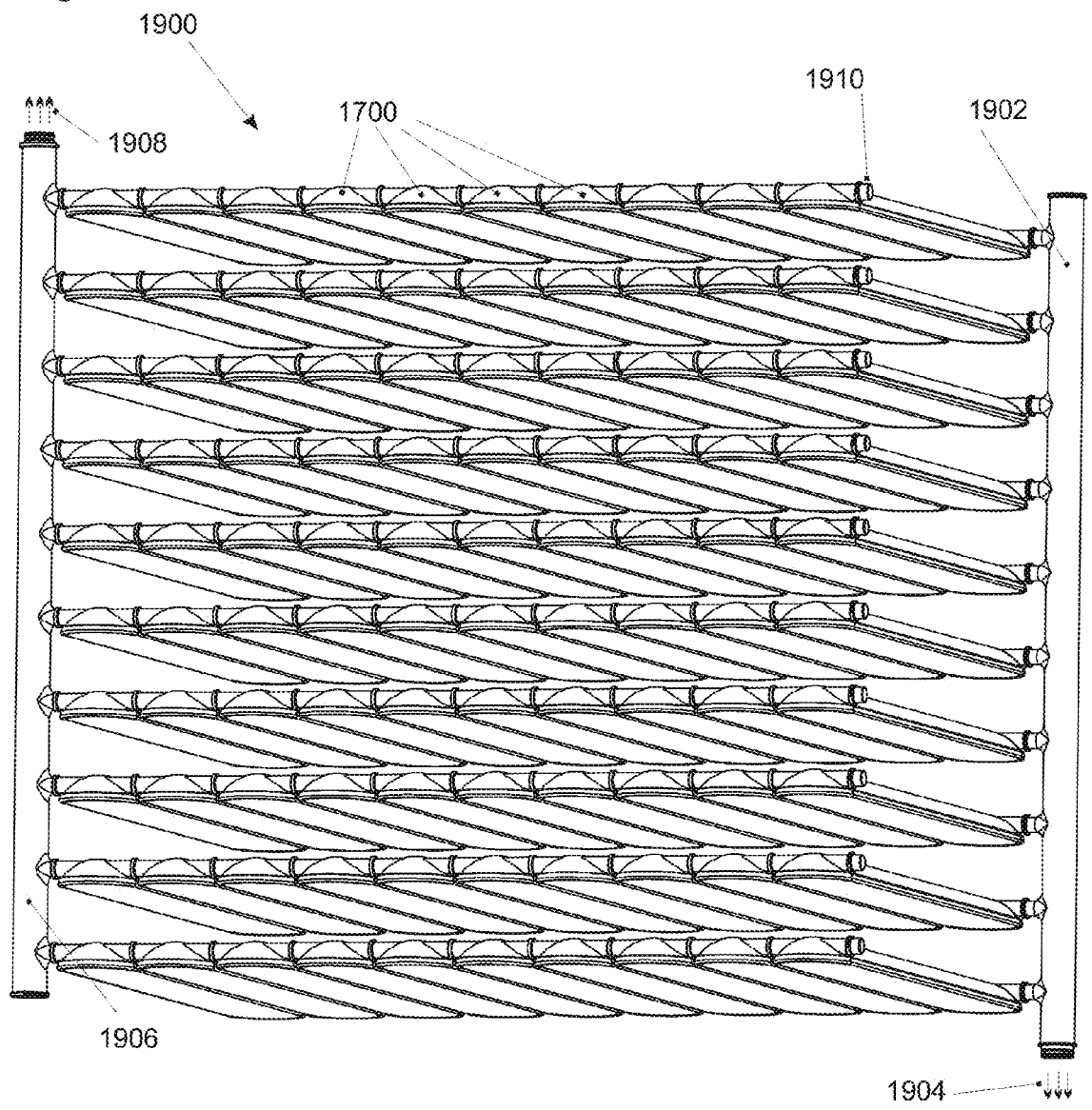
FIG. 19 shows a ten-by-ten array of coolant modules assembled into an inverter heat exchanger.
Figure 20A:
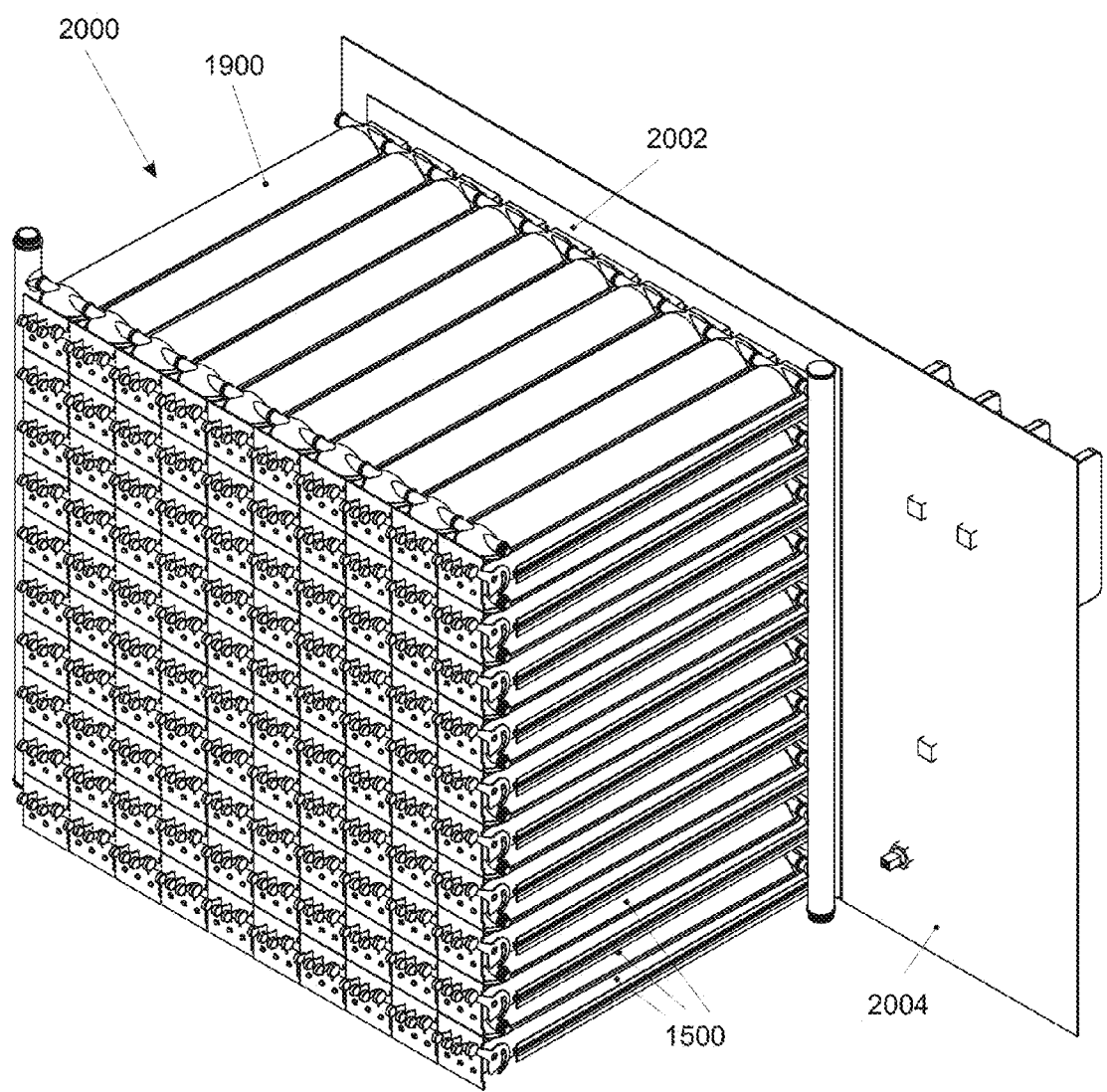
Figure 20B:
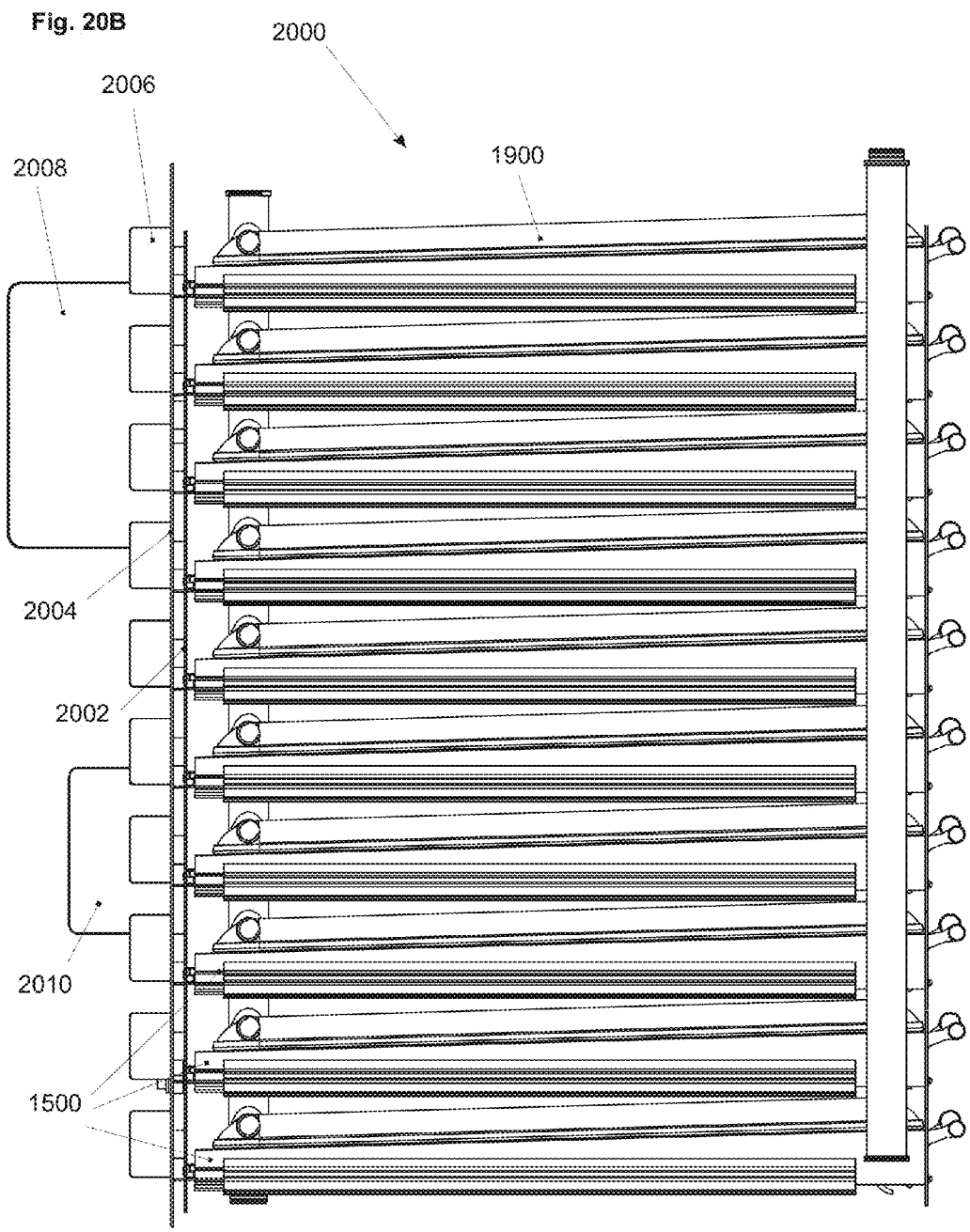

FIG. 19 shows a ten-by-ten array of coolant modules 1700 assembled into an inverter heat exchanger 1900. The rows of coolant modules are terminated in the right back at a cool-coolant manifold 1902, through which cool coolant enters at the port 1904. Manifold 1902 may be located at the bottom of the array to facilitate the purging of bubbles and establishment of uniform flow throughout the array.

The rows of coolant modules are terminated in the left front at a hot-coolant manifold 1906 having an exit port 1908 that may be located at the top of the array to facilitate the purging of bubbles. This opposing arrangement of inlet and outlet port helps to establish a substantially uniform flow through the array by creating similar pressure drops in the fluid path.

The use of nozzle orifices and piping that is sized so that the nozzles produce the most pressure drop may further assist with maintaining cooling uniformity. The cooling ability of the exchanger may not be substantially affected by how much liquid is contained in the coolant modules, but rather by the coolant fluxes through the orifices.

In the event of a coolant pump fault, the volume of coolant in the exchanger may define how long an operator has to repair the pump or turn off the inverter. This is because the exchanger could switch to a boiling mode.

To maintain a substantially constant coolant pressure, it may be desired to continue the manifold 1908 or 1902 or both, to a minimum height and terminate the pipe in a free-surface reservoir. Such an arrangement may be hydrostatically pressurized and resistant to significant over pressures from boiling, pump faults, etc.

The unused bypass ports of the modules can be terminated in plugs. This is shown by reference no. 1910 on the front right side, with the corresponding plug on the back left side being obscured in the view presented.

FIGS. 20A-20D illustrate an embodiment of an assembly 2000 of inverter slaves 1500, cooling system 1900, motherboard 2002, and back panel 2004, arranged and fitting together. FIGS. 20A, 20B, 20C, and 20D are illustrations of a front isometric view, a left side view, a right side view, and a top view of assembly 2000, respectively.

Elements 2006 are connection points for connections with individual clusters. Element 2008 is a three-phase AC connection to go to step-up transformers. Element 2010 is a connection to the uninterruptible power supply output.

Figure 21:
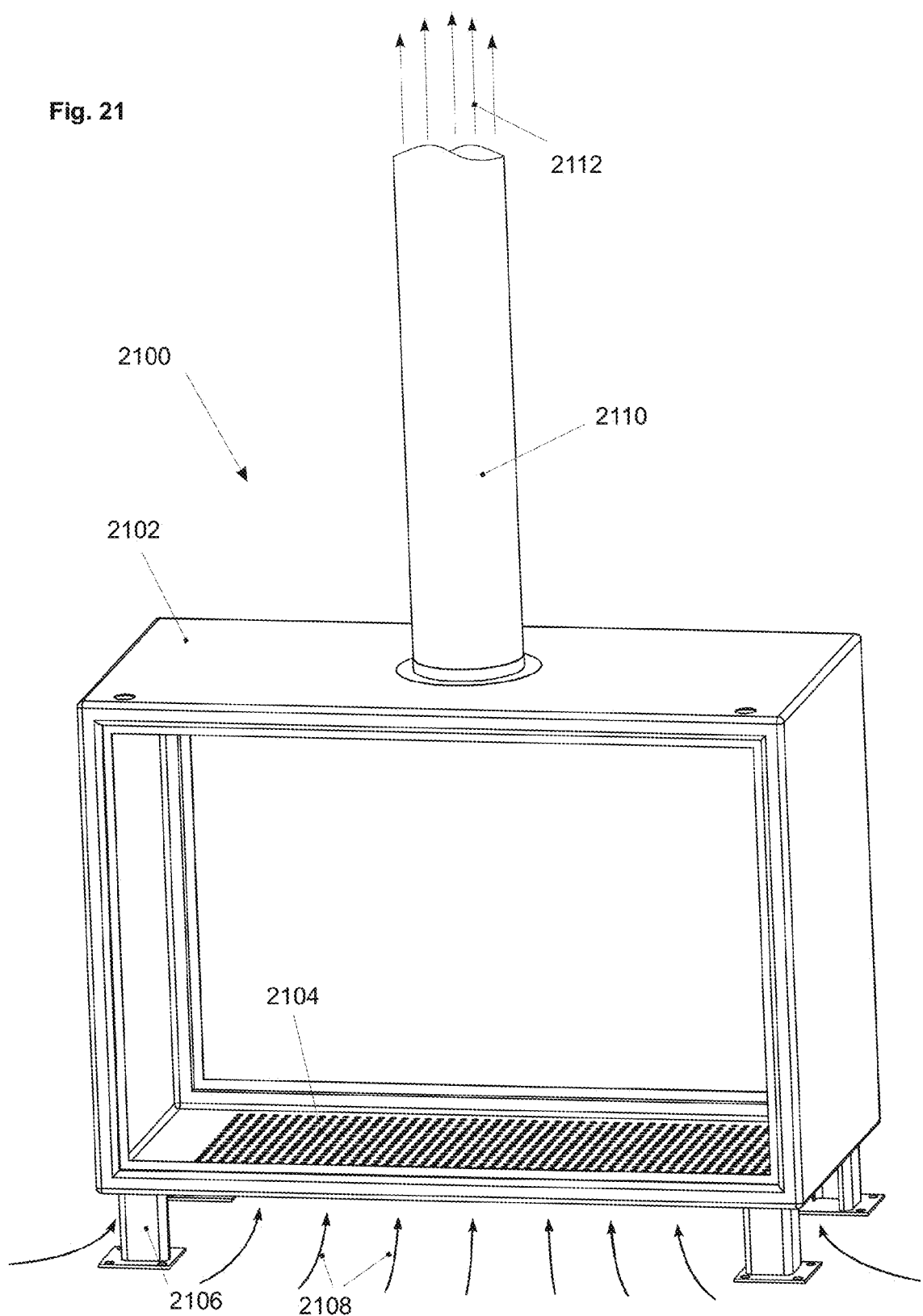
FIG. 21 shows a mechanical drawing of a housing structure according to an embodiment of the present invention, that contains the assembly illustrated in FIGS. 20A-20D.

FIG. 21 shows a mechanical drawing of a housing structure 2100 according to an embodiment of the present invention, that contains the assembly 2000. This structure comprises a sheet-metal rack enclosure 2102 having vents 2104 located substantially at the base of the structure, and standoffs or legs 2106 that are sufficient to work in concert with the vents to provide for relatively unimpeded air flow 2108 to assist with cooling elements of the inverter that are not actively cooled.

The natural convection in such an embodiment may be augmented by the use of a top-mounted vent pipe 2110 having a significant height to produce an updraft via the stack effect. Such a pipe may have the additional benefit of venting the smell (which may be poisonous) of out-gassing electronics or failed modules, outside of a secondary inverter enclosure such as a shipping container. In some embodiments, natural convection may be augmented by the use of an exhaust fan.

Figure 22:
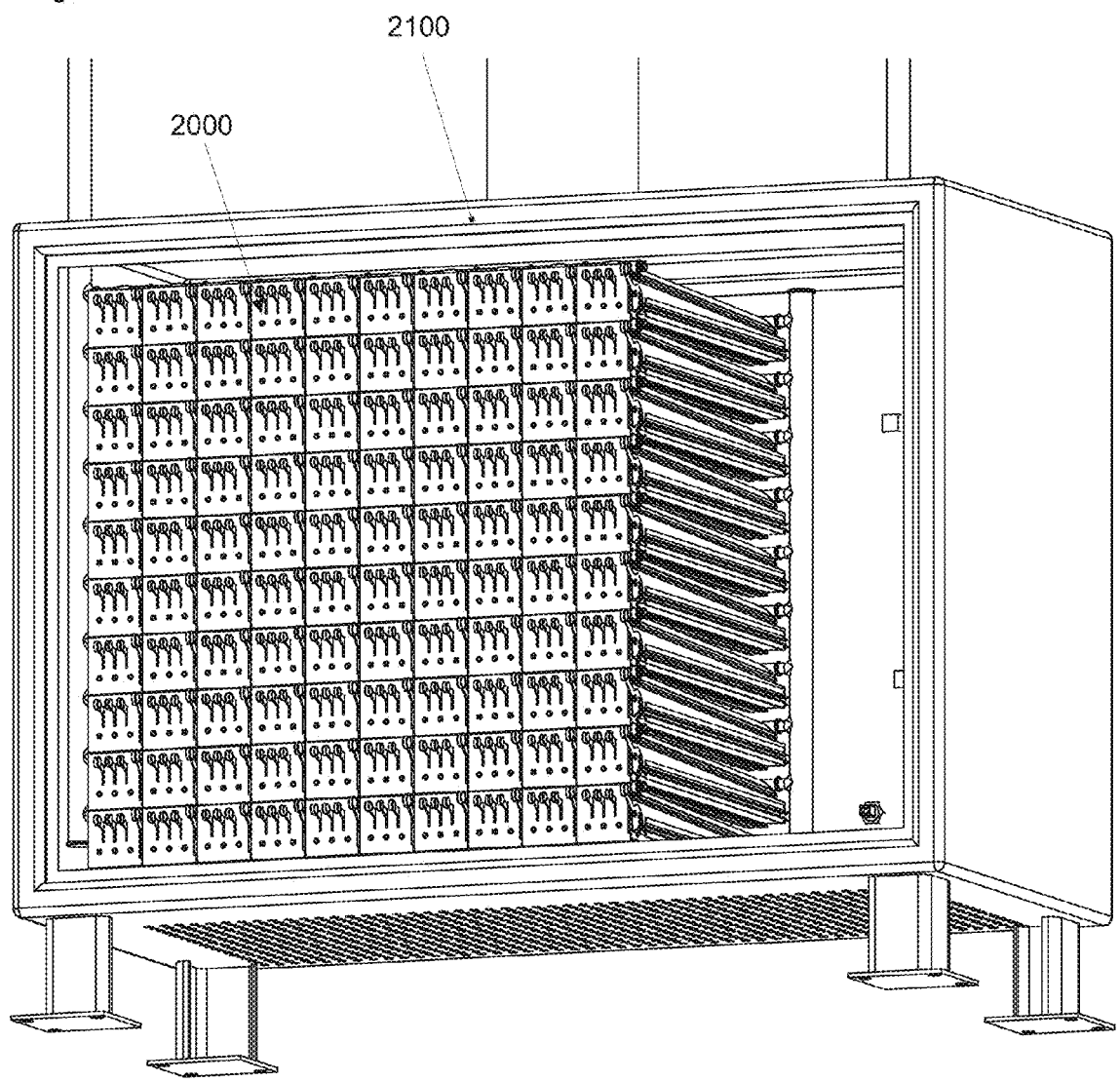
FIG. 22 shows the assembly illustrated in FIGS. 20A-20D disposed in a housing without a front panel attached.
Figure 23A:
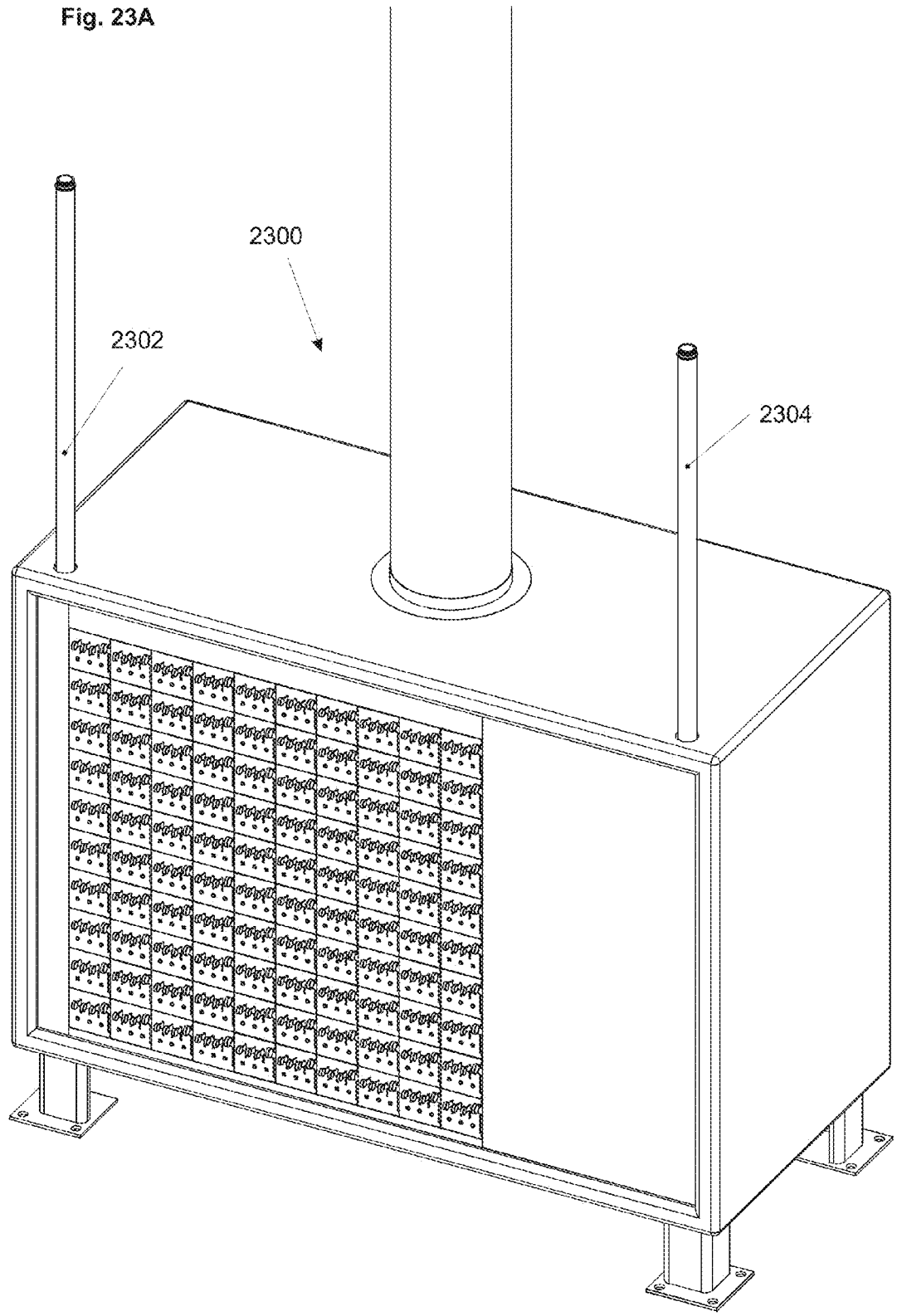
FIGS. 23A-23E respectively show a top-front isometric view, a front view, a back isometric view, a back view, and side view of the inverter assembly 2300 with front-panel attached.
Figure 23B:
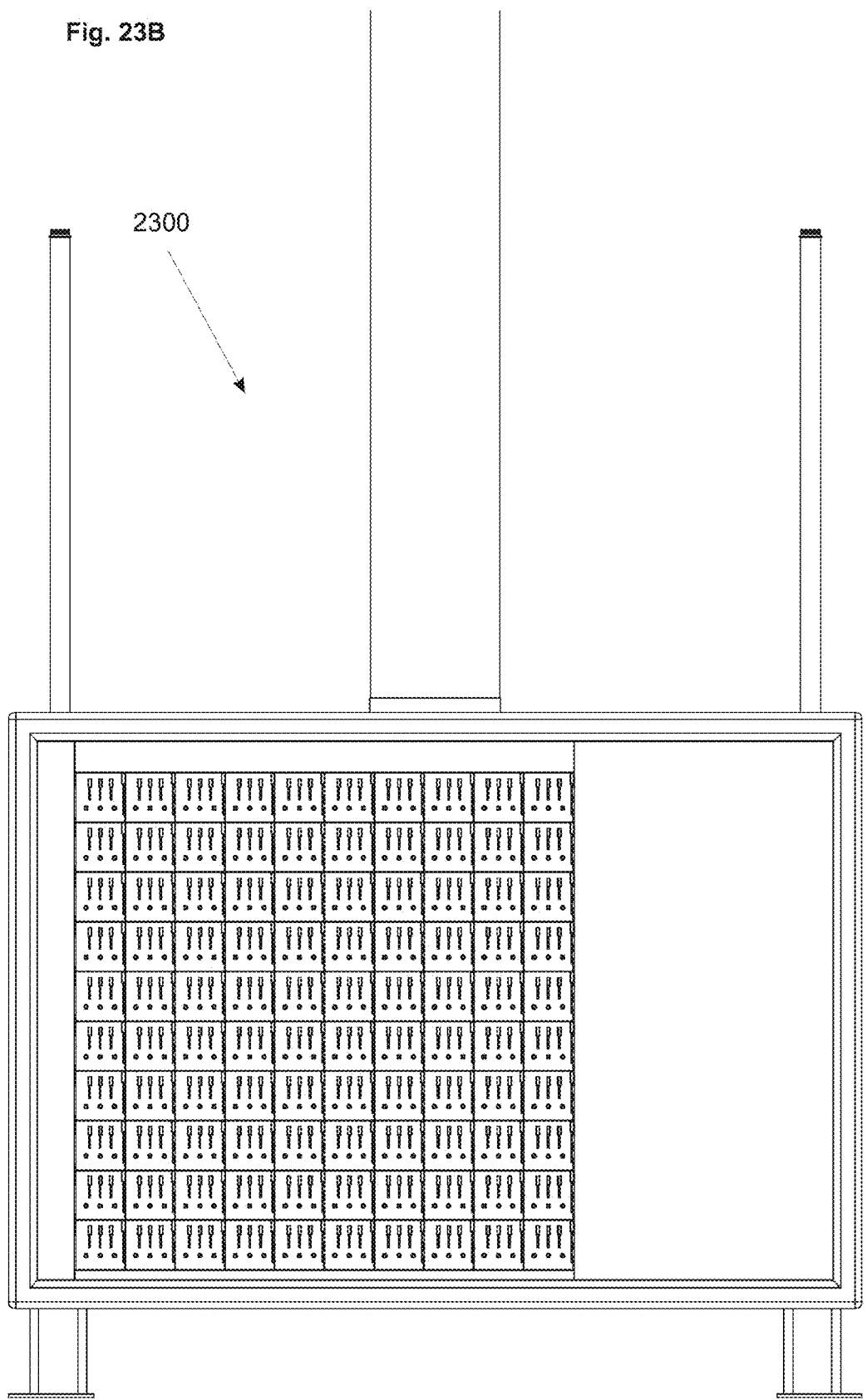
Figure 23C:
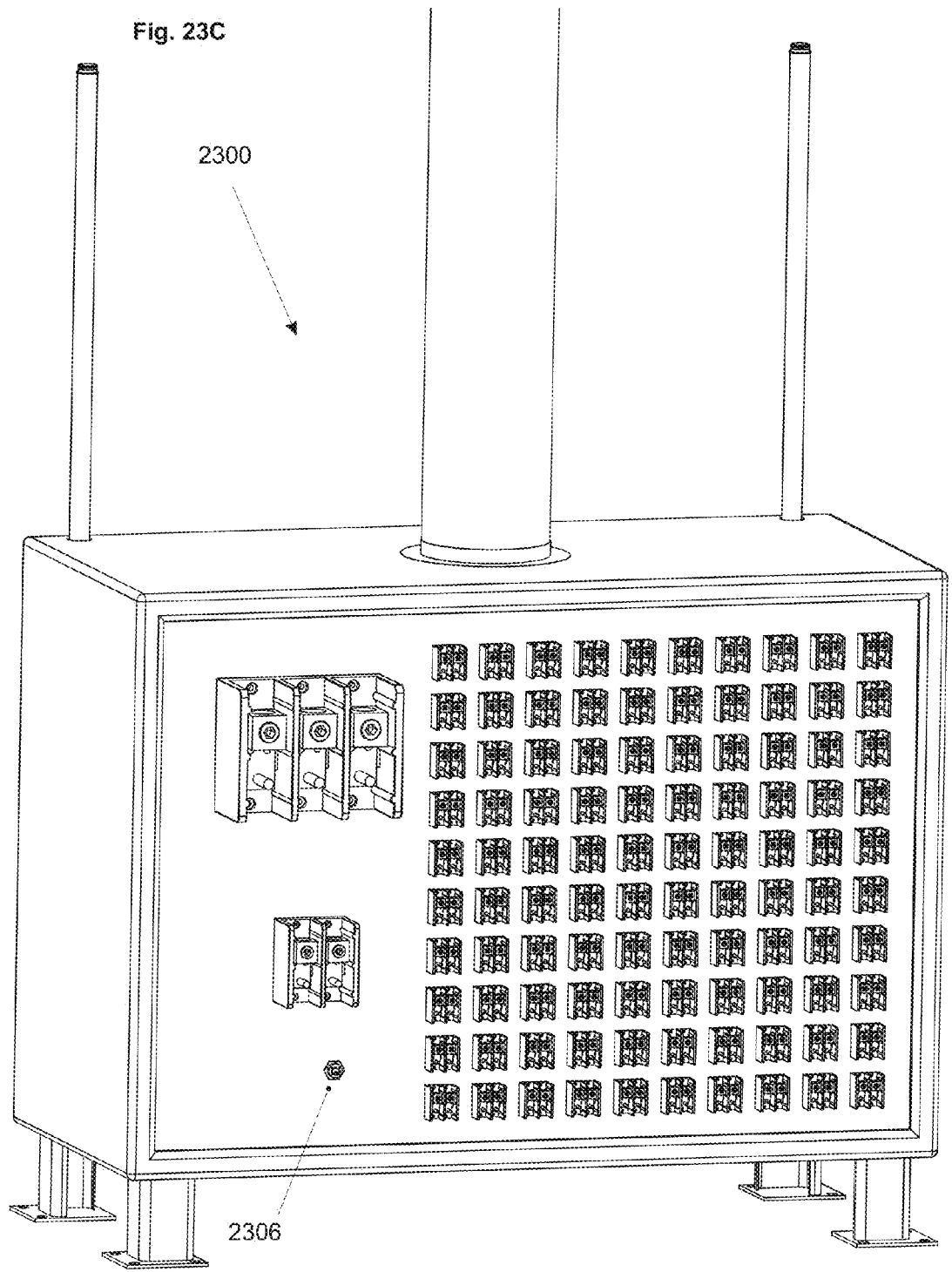
Figure 23D:
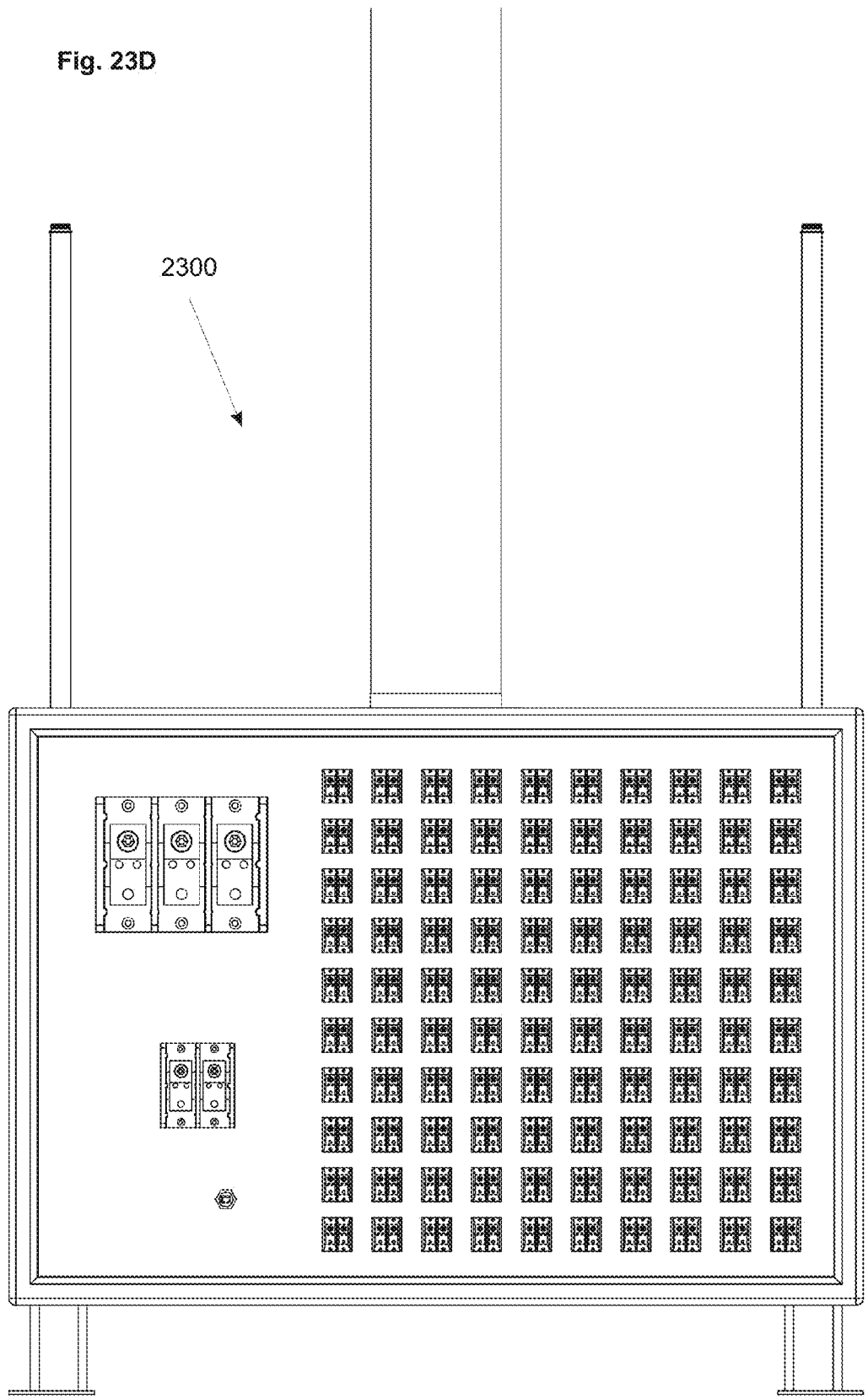
Figure 23E:
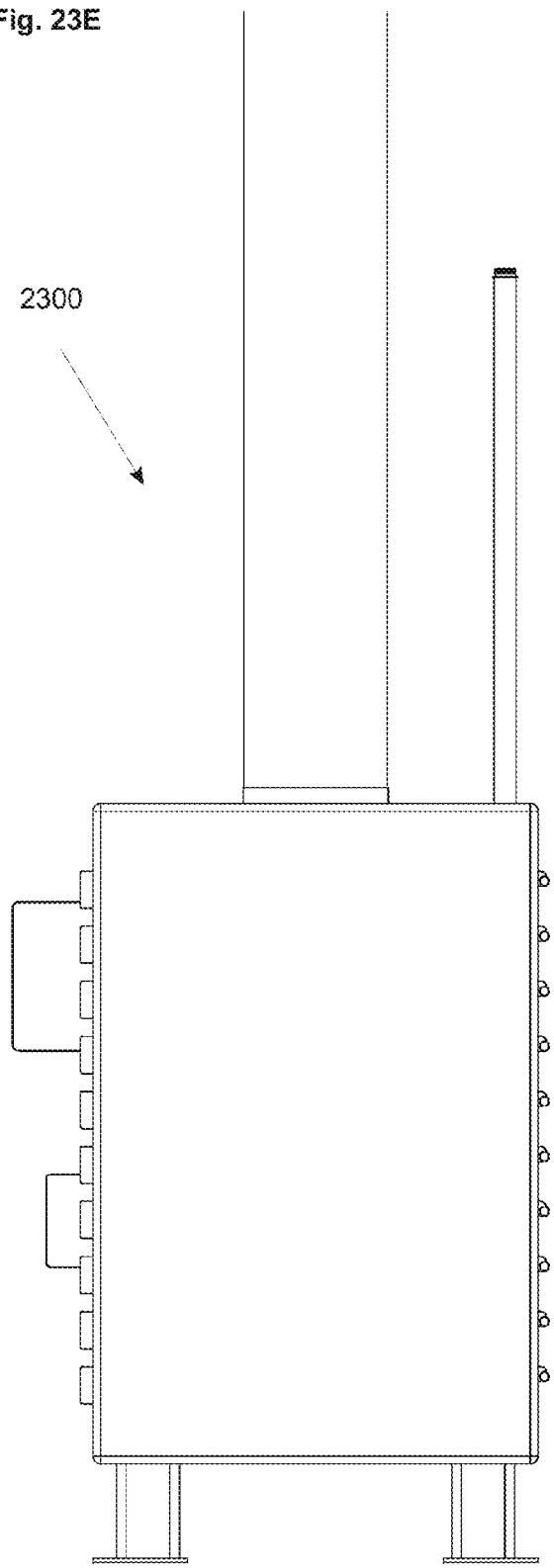

FIG. 22 shows assembly 2000 placed in housing 2100 with no front panel attached. The significant open space on the right side may be used to house a control computer, batteries for the UPS, UPS control circuitry, coolant pumps, or other elements. In some embodiments, one or more of these elements may be designed to reside in a separate container for safety, corrosion, leakage, safety concerns. FIG. 22 shows and embodiment where the housing 2100 is larger than the assembly 200 in the lateral direction. Other embodiments can include a housing 2100 that is larger than the assembly in the vertical direction or a housing that is substantially the same size as the assembly. If the housing and the assembly are substantially the same size then elements such as the control computer, batteries for the UPS, UPS control circuitry, and coolant pumps would be disposed outside of the housing 2100.

FIGS. 23A-23E respectively show a top-front isometric view, a front, back isometric view, a back view, and a side view of the inverter assembly 2300 with front-panel attached. The pipe 2302 is the hot-coolant exhaust port. This pipe should lead to a liquid-air heat exchanger, preferably a radiator having at least the option for forced convection.

Alternatively, the radiator may reside at the base of a chimney and derive its cooling in part or entirety from the stack effect. A coolant pipe may rise to a height and terminate in a free-surface reservoir to maintain a limited pressure head in case of boiling. The pipe 2304 is the cool-coolant return line. Element 2306 is a digital communications connector, e.g., an Ethernet connector.

Figure 24:
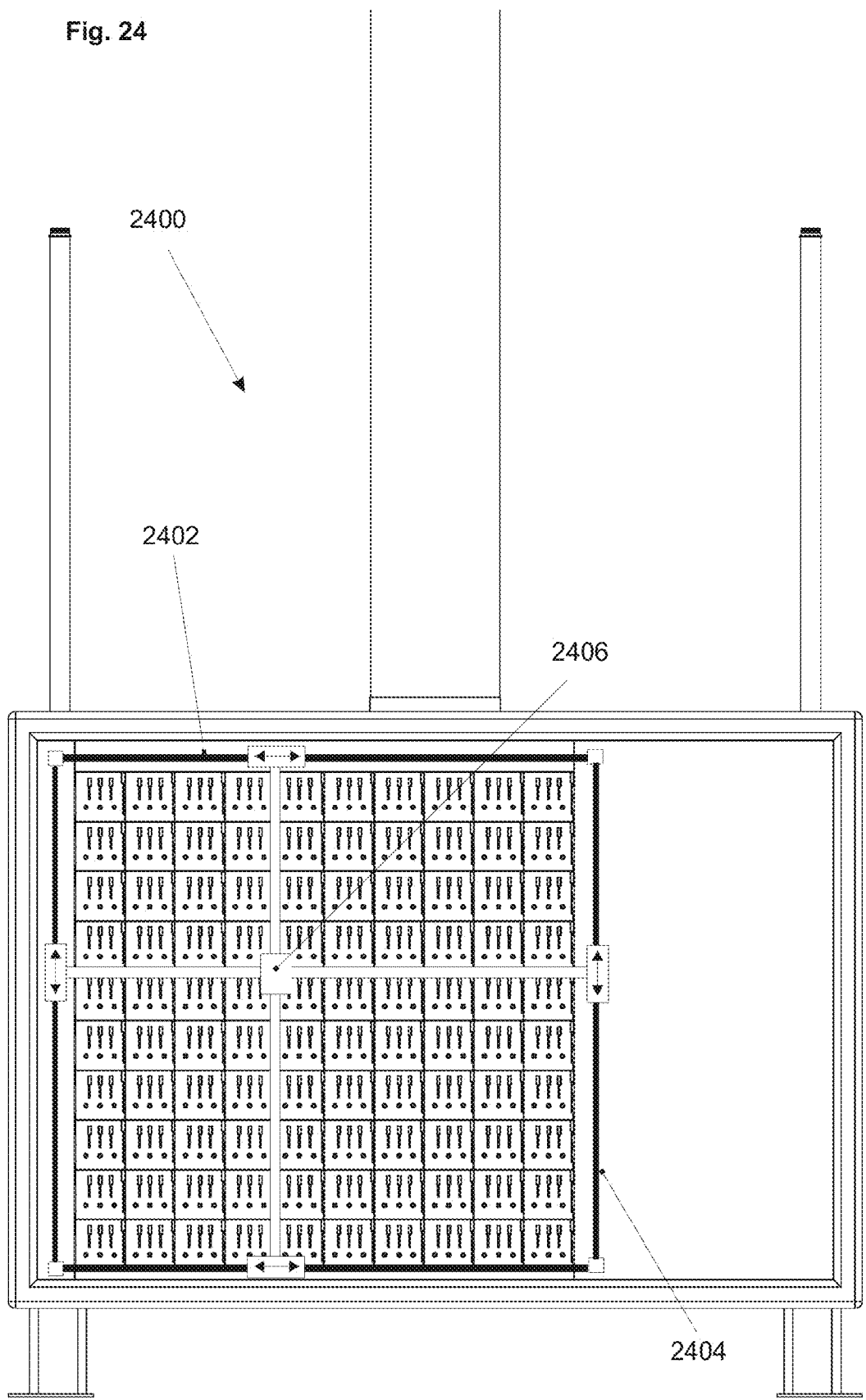
FIG. 24 shows an embodiment of the interleaved inverter containing a motorized traverse to programmatically operate arrays of mechanical switches.

FIG. 24 shows an embodiment of the interleaved inverter containing a motorized traverse to programmatically operate arrays of mechanical switches. In some embodiments, the traverse may also actuate the lever 1501 to disengage inverters. In the embodiment shown, the traverse can be moved across (2402) and up and down (2404) the inverter front control panel. Element 2406 is a traverse stage that may contain a feature or plurality of features to allow it to actuate switches and linear levers. In some embodiments it may be able to actuate rotary switches or screws. In some embodiments, the traverse may be able to produce motion in the direction normal to the front panel. In some embodiments, an alternative mechanical arrangement of a robot may be employed, e.g., and articulated arm, etc.

In some embodiments, the inverter change out may be entirely performed by a comparatively unsophisticated robot. In such embodiments, human operators may be kept far from high-voltage safety hazards. In some embodiments, inverter consumable replacement and repair may be performed robotically.

According to certain embodiments of the present invention, the inverter slave self diagnoses faults. In some embodiments, the inverter slave can only crudely identify that a fault has occurred by not achieving an expected voltage or current, or by some parameter such as operating temperature going outside of an expected range.

In some embodiments, the ability to perform thorough automated trouble shooting may be relegated to test equipment. This test equipment may plug into the normal inverter connectors and in some cases a special test connector providing access to additional signals and controls that may aid in diagnosis.

Some embodiments of inverters according to the present invention contain smoke, heat, or fire detectors. Some embodiments may contain fire-suppression apparatus, such as CO2, dry chemicals, halon, foam or other fire-suppression means known in the art.

In some embodiments these fire suppressors are under manual control. In some embodiments, these fire suppressors are under programmatic control. In some embodiments these fire suppressors are controlled by a smoke, heat, or fire detector.

Some embodiments of the present invention contain leak and water detectors.

Some embodiments of the present invention may contain certain elements such as power filter capacitors within explosion-proof vessels. In some embodiments, capacitors are liquid cooled.

In some embodiments, the coolant comprises dielectric oil. In some such embodiments, inverter phases may be immersed in circulating coolant rather than isolated from the coolant. According to certain embodiments, inverter slave assemblies are disposed vertically, with controls and indicators facing substantially upward and the remainder of the inverter immersed in circulating coolant. In some embodiments, coolant is circulated using a splitter-plate jet architecture as in 1710.

In some embodiments of the present invention, inductors are cooled via a wrap-around sink in contact with the cooling plate. In other embodiments, inductors are cooled via direct impingement or immersion of a conventional on a conformal insulating surface. In some embodiments, inductors are cooled via direct immersion or impingement of an insulating coolant.

In certain embodiments, the support structure, the cooling structure, the inverter housing, and the switch modules may contain springs, such as wavy washers, and the like. These springs function to maintain a preload despite thermal expansion, creep, etc.

Plant Layout

Figure 3:
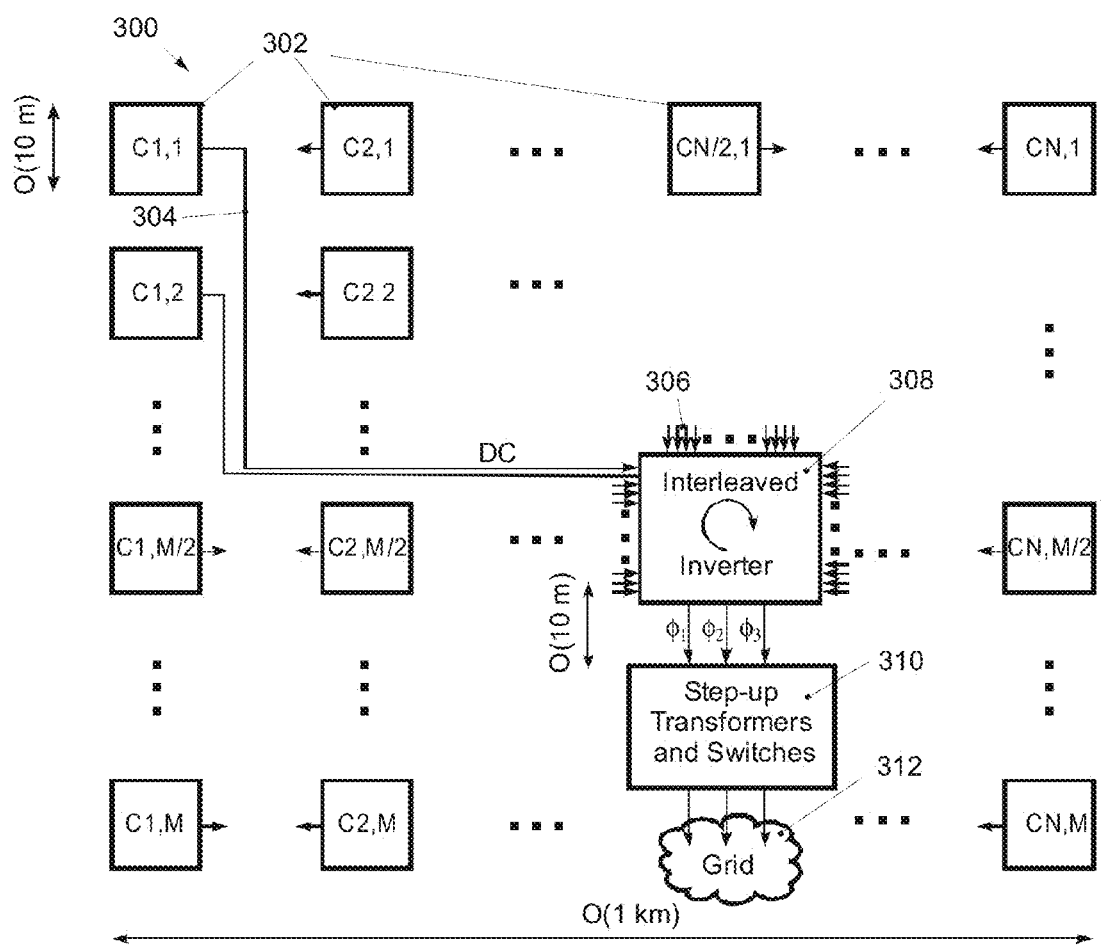
FIG. 3 shows an illustration according to the present invention, of an embodiment of a power plant layout.

FIG. 3 shows an illustration according to the present invention, of an embodiment of a power plant layout (300). Clusters (302) are arrayed in rows and columns. While site-specific terrain may require a departure from a standardized plant plan (such as a uniform array), standardization is advantageous because it permits a maximal amount of prefabrication of interconnects.

Array rows and columns need not be orthogonal. However, large departure from orthogonality may lengthen interconnect lengths appreciably. Individual lines (304, 306) transmit DC power to a massively interleaved central inverter (308) that may be located near the center of the array to reduce interconnect cost and losses.

A potentially favorable interconnect geometry involves running cables toward a central point along a row or column, and then running in the other direction toward the array center. This arrangement results in interconnect lengths that are somewhat longer than more straight-line connection, but eases prefabrication and speeds installation while mitigating potential shading of clusters by the interconnection system.

To reduce inductive and resistive losses, the transformers (310) that step the three-phase inverter output to grid (312) voltages are located within 30 m and even within 10 m of the inverter.

The benefits of interleaving are well known and include lower passive component filter requirements, higher-effective switching frequency, graceful degradation in performance with component failures, etc. In addition, the timing of switching can be coordinated to reduce switching stresses, providing improved switch life and power efficiency.

Co-locating all inverters reduces maintenance costs, provides for fewer enclosures and environmental seals, and eases water cooling, amongst other advantages. Moreover, the physical proximity of inverters facilitates inexpensive, high-speed timing coordination between inverters (for example via clock and hand-shaking lines, high-speed synchronous and asynchronous communication).

Installation of inverter systems in shipping containers may confer considerable cost benefits. Examples of such benefits include ease in distribution, and the advantage of using a commoditized and ruggedized, fire and environment-proof container.

Where a power plant already requires water cooling, the marginal cost of water cooling our inverters is small as compared to the advantages in power density, reduction in noisy fans, and elimination of points of egress (allowing entry of insects, environmental moisture, and pests). Water cooling inductors, switches, and capacitors may improve lifetime and performance envelope.

An example of an architecture for each individual inverter, is a boost-type three-phase inverter like that outlined in Y. Chen, K. Smedley, and J. Brouwer (2006) "A Cost-effective Three-phase Grid-connected Inverter with Maximum Power Point Tracking," IEEE 1-4244-0365-0/06 and Y. Chen and K. Smedley (2006) "Three-Phase Boost-Type Grid Connected Inverters," IEEE 0-7803-9547-6/06, both of which are incorporated by reference in their entireties herein for all purposes.

This inverter features a series input inductor, in accordance with our requirement that the inverter benefit from the inductance of the DC interconnects. This inductor sees a relatively low ripple current, reducing the size of the output capacitor needed at the cluster (and/or at receivers). The circuit employs six switches to produce a voltage boosted three-phase output. By carefully time-sequencing the switches, two thirds of the power switches can be soft-switched and the hard-switching is distributed evenly on the switches. It is anticipated that this performance can be further improved by judicious interleaving of many inverters. This inverter was successfully operated using OCC circuitry. A simple maximum power-point tracking scheme was also developed. These automatic analog controls contain hooks to allow precision digital fine-tuning and optimization from relatively modest microcontrollers.

While buck inverters achieve higher efficiencies in practice, the use of a buck inverter requires a minimum operating voltage. Efficient inversion is obtained when this operating voltage is only slightly higher than the maximum voltages differentials in the inverted waveform.

However, in accordance with certain embodiments where at any time there may be a large number of clusters where one or more concentrators are out of commission awaiting service, it may be necessary to operate at a correspondingly higher cluster voltage or provide a voltage boost stage, both of which reduce the efficiency of the overall system.

In contrast with the buck inverter, the boost inverter performance degrades gracefully with loss of voltage. Its proper function requires that a maximum voltage is not exceeded, which can be accomplished by design, given a photovoltaic source.

An inverter system according to an embodiment of the present invention may have the ability control the power factor of the plant directly, to assist in maximizing the production value of a power plant. Such may be required in order to 1) comply with the grid interconnection requirements specified by the local Electric Utility, 2) maintain consistent and stable inverter operations, 3) maximize power production revenues (by normally producing at near unity power factor), and 4) provide the opportunity at the plant level to participate in any available ancillary-services markets provided by Utilities or Independent System Operators.

Power factor control may be achieved at the inverter, as a part of the inverter control, preferably by a mOCC technique. Embodiments of the present invention may also exhibit the ability to make cycle-by-cycle and inter-cycle adjustments to output current, to mitigate grid anomalies produced by transient loads and power surges.

Figure 3A:
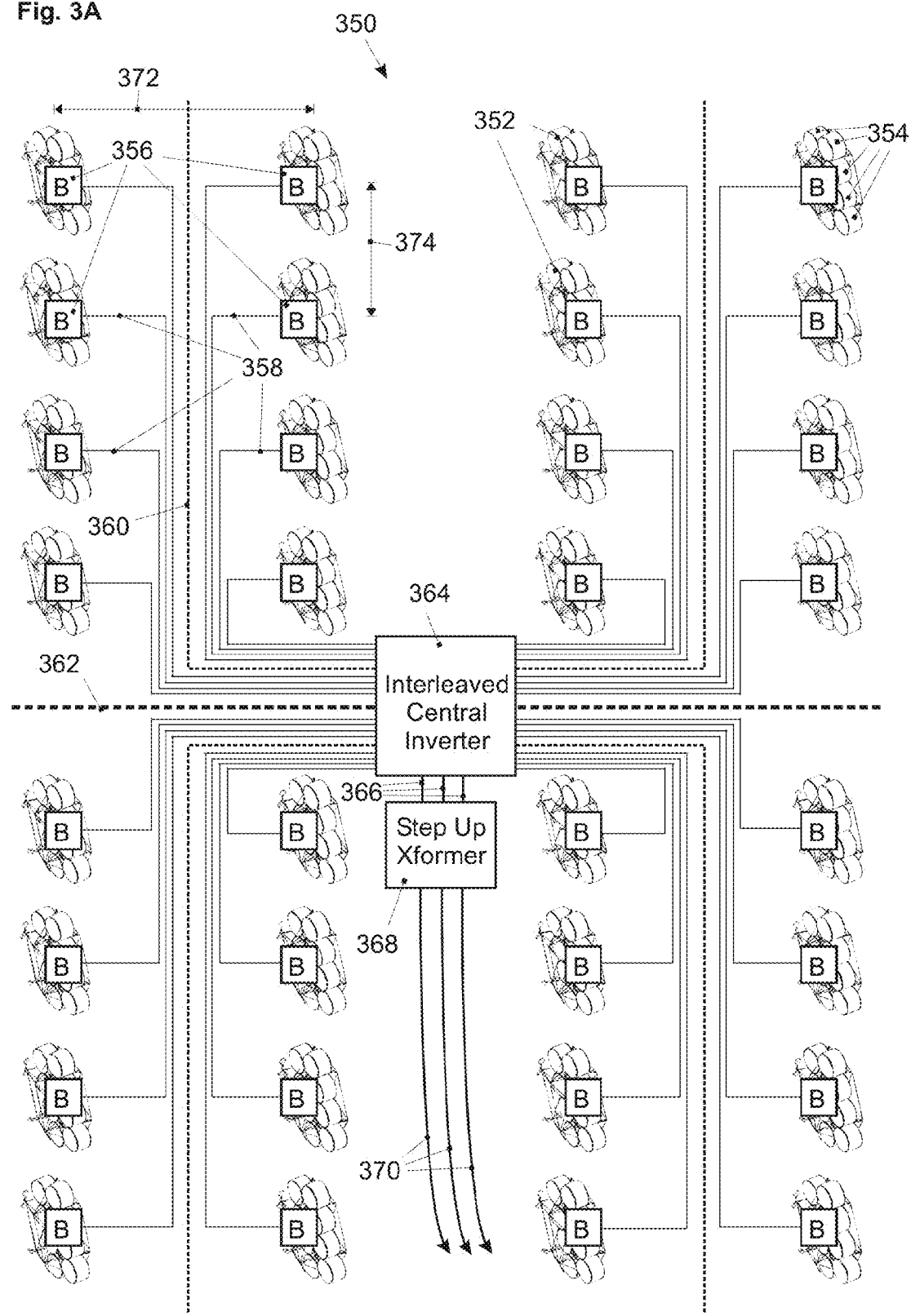
FIG. 3A shows a simplified view of a power plant according to an embodiment of the present invention.

FIG. 3A shows a simplified view of a power plant according to an embodiment of the present invention. As shown in FIG. 3A a power plant (350) according to embodiments of the present invention may comprise an array of clusters (352) comprising a plurality of receivers (354).

The power from each receiver may be maximized by the use of a separate balancer circuit (356) for each cluster that works by performing a power conversion only on the deviation of a series-connected receiver from its maximum power point. The substantially D.C. output of each cluster conducts along separate twisted pairs of conductors (358) to an interleaved central inverter (364).

In some embodiments, the inductance of the twisted pairs may be intentionally enhanced by spacing the conductors. In certain embodiments, the inductance of the connections may be intentionally reduced, for example by breaking the conductors into a plurality of smaller, tightly coupled conductors. In particular embodiments, the conductors may be disposed coaxially.

As shown in FIG. 3A, in some embodiments, the cable pairs (358) are grouped with other cables (360) that run down pairs of rows of clusters. This depiction may indicate placing the cable pairs in physical proximity, but does not require interconnecting.

Avoiding the combination of the power from numbers of clusters may offer certain potential benefits. One such benefit may be an ability to perform maximum power point tracking for each cluster efficiently. A possible benefit may be reduced cluster-cluster coupling, such that problems affecting one cluster may have a lessened impact on the performance or health of other clusters. Still another potential benefit may be that the power and current on each interleaved inverter may be strictly limited, reducing the need for protection circuitry associated with excessive D.C.-side power and current. Yet another possible benefit is that advantages of the use of interleaving may be taken without excessive concern for "load balancing" of the interleaved circuits.

In some embodiments, the diameter of the interconnect wire is chosen individually depending on the length of the cable run. For example, the diameter may be chosen to obtain a substantially constant resistance in each cable run, so as to obtain a target D.C. transmission efficiency at or near the minimum required conductor cost.

According to certain embodiments, the balancer circuit acts to establish a cluster voltage to permit interconnection of the cables from a plurality of clusters, without a substantial loss in cluster power-point maximization. In some embodiments, a plurality of cluster conductors may be interconnected. Cables from clusters may become strands of a cable as they join such a bussed connection in such a way that the diameter of the cable grows as the current-bearing requirements grow. In certain embodiments, this optimization of interconnect conductor mass is performed otherwise.

In some embodiments, cables from only a single row of clusters rather than a pair of clusters are grouped. In some embodiments, these grouped power cables from rows are further grouped with grouped cables from other rows (362) to converge on a central inverter (364). In some embodiments, this central inverter can be a massively interleaved inverter, with each interleaved inverter circuit fed by one or a subset of cluster cables.

The central inverter may not employ an isolation transformer. Grid isolation can be provided by stepping up the three phase AC output of the inverter (366) via step-up transformer (368) either to distribution or transmission voltages on lines (370).

In a particular embodiment an array may be disposed in a rectangular grid having ninety-degree angles between cluster axes. Alternatively an array may be disposed in a parallelogram grid having an angle between cluster rows and columns other than ninety degrees.

According to certain embodiments of the present invention, this array angle is chosen to reduce the impact of self-shadowing on the plant power output. The calculation of optimal angle may take into consideration one or more factors, including but not limited to the local latitude, the lay of the land, details of the cluster design, local weather patterns, utility power pricing schedules, land costs per acre, parcel boundary, and others.

The East-West spacing of clusters (372) may be different from the North-South spacing of clusters (374), according to an optimization calculation that involves substantially the same parameters as the calculation of an optimal array angle.

In some preferred embodiments, this spacing ratio is approximately 2:1. In other preferred embodiments, this spacing ratio may vary from approximately 1.3:1 to 3.5:1.

In some embodiments of the present invention, parameters including the row and column spacings and array angle may vary across a plant to accommodate un-even ground or flora. According to certain embodiments, the location of clusters may be intentionally staggered to achieve a particular appearance, including a desired aesthetic appearance, a pixilated image comprising clusters as pixels, a geometric pattern, a random or quasi-random pattern, or others.

In whatever form the power plants are arrayed, it may be advantageous to denumerate clusters according to array indices, e.g., {m,n}. As used herein, the term 'row' is defined as a set of clusters having a given constant index m, i.e. mth row, and the term 'column' is defined as a set of clusters having a given constant index n, i.e., the nth column.

In some embodiments of the present invention, a "central inverter" may be located near the center of an array. If a plant is large, such that the interconnect losses or cost between clusters on the periphery and center of the plant is high), the plant may be subdivided into a plurality of sub-arrays, each having an inverter located substantially centrally to the sub-arrays. Herein, the term "array" can refer to such a sub-array.

In some embodiments, power from a cluster may be conducted on a substantially balanced pair of conductors. In some embodiments, these conductors may be disposed helically about each other to reduce emissions. In some embodiments, power from a cluster may be conducted on an unbalanced, coaxial line. In some embodiments, the conductors are spaced to increase the inductance of the interconnects. In some embodiments, the conductors are spaced only by a minimal insulator to reduce inductance. In some embodiments, inductance is further reduced by dividing the cables into a plurality of parallel lines and interspersing the cables.

FIGS. 3AA-3AD show arrangements of cluster voltages according to embodiments of the present invention. In the arrangement 380 in FIG. 3AA, the positive voltage from a cluster, VC+ (382), can vary according to the power output of the cluster, while the negative voltage from a cluster, VC− (384), remains substantially at a zero-Volt reference (e.g., earth ground). According to certain embodiments, this constant value is established at the central inverter. In some embodiments, this constant value is established at the cluster.

Arrangement 390 in FIG. 3AB is the same as arrangement 380 except that VC− (392) is allowed to vary while VC+ (394) remains substantially at a zero-Volt reference.

Some embodiments comprise a combination of cluster cables according to arrangement 380 and 390.

Arrangement 396 in FIG. 3AC is similar to 380, but VC− (398) is maintained at a substantial negative value with respect to ground 397. This type of arrangement may be beneficial for allowing high cluster voltage differences [(VC+)−(VC−)] to be conducted safely and inexpensively through a plant.

Arrangement 399 in FIG. 3AD is similar to 396, but with the opposite polarity.

Arrangement 386 in FIG. 3AE maintains substantially symmetric voltages 387 and 388 about a reference voltage 389 (e.g., 0 V or earth ground). In some embodiments, this substantially symmetrical variation is maintained through a control loop in an inverter circuit. In other embodiments, this symmetry is maintained at the cluster. According to certain embodiments, this arrangement may be maintained by connecting approximately equal numbers of receivers in series on the positive and negative side of earth ground near a cluster.

The absolute magnitude of the difference [(VC+)−(VC−)] can vary widely, depending on the state of health of a cluster. For example, this absolute magnitude can vary depending upon whether receivers are non-functioning or poorly functioning, the amount of illumination on the receivers, and other factors.

The clusters should tolerate the variation in this cluster voltage. For example any internal power supplies derived from the cluster voltage, should be able to tolerate a sufficiently wide variation.

For cost effectiveness and efficiency, some power-intensive devices within a cluster, such as motors and pumps, may be powered via switching a voltage waveforms from the cluster bus directly. These devices should be able to perform some operations at a minimum cluster voltage.

Particular embodiments of the present invention may extract power efficiently from clusters comprising concentrated photovoltaic receivers. In some embodiments, the concentrators are subject to routine maintenance and replacement.

Accordingly, in certain embodiments it may be desirable to tolerate a population of un-producing receivers to stabilize the rate of maintenance. It may be desirable to extract power from functioning receivers in spite of one or a plurality of un-producing receivers within a cluster.

In some embodiments, the efficiency with which power is extracted may drop with the number of functioning receivers, in exchange for improved efficiency with all or all-but-one receiver functioning. For example, this efficiency compromise may favor the use of a boost stage in an inverter when one or more than one receivers is not producing.

Greater numbers of non-producing receivers may require higher levels of boost, thereby reducing efficiency. Some embodiments can produce a modest boost, e.g., 1.5:1. Other embodiments may produce a significant boost, e.g., up to ~3:1. Still other embodiments allow a higher (in some cases arbitrary) voltage boost, and are switched off only when prudent. For example, certain embodiments may switch off when the net extracted power equals zero. In some embodiments, when a cluster is completely or nearly completely functioning, the boost stage may be switched out or not operated, providing high inverter efficiency.

The inverter connected to the cluster can likewise tolerate a large voltage swing. For this reason, some embodiments may utilize a voltage-boosting inverter. In certain embodiments, the inverter comprises a boost stage followed by a buck inverters.

According to some embodiments, the inverter comprises a boost stage that operates only when necessary followed by a buck inverter. Such embodiments may enjoy high efficiency in good illumination and the ability to produce power in less than ideal illumination at a slightly reduced efficiency.

When there is insufficient production from the clusters to power themselves, the inverter may supply auxiliary power to a cluster by maintaining a nominal cluster voltage.

In some embodiments, a plurality of converters may be utilized intermediately between groups of clusters and the central inverter. The converters may act on imbalance voltages between clusters, allowing combination of cluster outputs by paralleling while maintaining maximum power-point tracking of individual clusters. The converters may act on imbalance current between clusters, allowing combination of cluster outputs by series connection.

In some embodiments, outputs of a plurality of clusters (for example a row of clusters or a column of clusters) may individually feed an interleaved inverter. A plurality of outputs from inverters may be combined centrally and stepped up to grid voltage or stepped up individually and combined centrally.

In some embodiments of the present invention, the central inverter solely establishes the common potential for the power system of the plant. This common potential is commonly called "ground," but is not to be confused with the "earth ground" potential, because the local potential of the earth may vary considerably across the extent of a power plant. Moreover, the potential established at the central inverter may be different from that at a cluster as a result of ohmic losses in the current return line.

Interconnects

Relatively long transmission-line runs (such as O (1 km)) may be unavoidable in designing plants that harvest appreciable amounts of solar power. Accordingly it may be important to 1) control the cost of the interconnect wires, 2) minimize conductance losses, 3) control EMI/RFI, and/or 4) control inductance.

Material selection may be important. From a cost standpoint, Aluminum wire is favored, costing several times less than a copper conductor of the same resistance. For long runs, difficulties connecting aluminum wires are far outweighed by the cost savings.

Material cost should be minimized by judiciously choosing conductor size for a substantially consistent resistance from each cluster to the inverter. In most cases, overall cost is reduced at a small decrease in material efficiency by selecting the wire gauge from a limited number of discrete sizes.

Figure 4A:
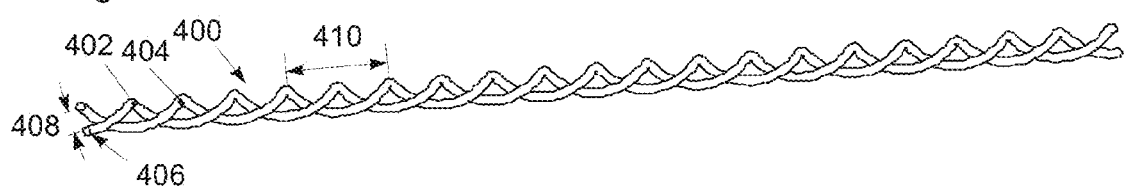
FIG. 4A shows a diagram of a pair of DC transmission lines.

FIG. 4A shows a diagram of a pair of DC transmission lines (400). Wire 402 carries current of one sign; wire 404 carries a return current. By twisting the wires, as known in the art, electromagnetic field emissions away from the wires are significantly reduced as is pickup of noise from nearby cables.

In addition to twisting the cables with a pitch (410), the wires can beneficially have a gap (408) between them. The wires then behave similarly to an air-spaced parallel-sided wire loop, provided the helix angle is small and the spacing between the wires is several wire diameters (406). With a modest air gap, e.g., 3 to 50 mm, especially ~10 mm, such air-spaced wires posses a considerable inductance over typical plant-scale runs, e.g., O (100 uH). A low ratios of helix length to spacing, significantly more conductor is needed to cover a linear distance than with an un-twisted wire pair, but EMI/RFI shielding is better. Favorable ratios are between 1:1 and 50:1, with ~12:1 being a reasonable compromise.

Being an air-spaced inductor, the inductor losses should be low, provided these cables are kept from low-resistance ferrometals by several pitch distances (410) to avoid hysteresis and eddy-current losses. This series inductance can be used to enhance the operation of properly architected inverters, such as the boost inverter described above. In some cases, it may be possible to eliminate discrete power inductors in these inverters.

In some cases it is advantageous to flatten the helix. Such a configuration may be used to allow the cable to roll up or flex more readily in one direction.

Figure 4B:
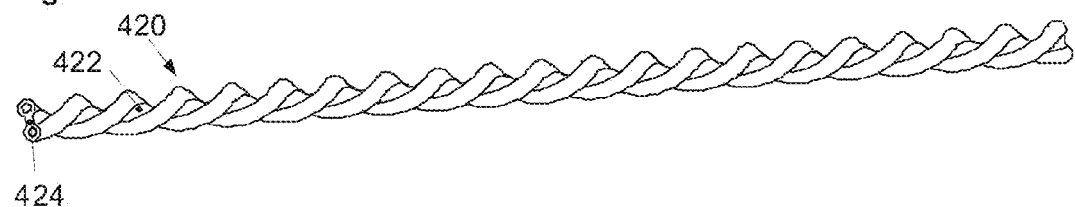
FIG. 4B shows a cross-sectional view of the spacing of an insulated twisted pair maintained by a polymer web.

As illustrated in the embodiment of FIG. 4B the spacing of an insulated twisted pair (420) may be maintained by a polymer web (422) having a cross-section like that of 424, which minimizes polymer use. This insulator may be extruded with bare wires or pre-insulated wires. A sufficiently inexpensive superparamagnetic, magnetic, or ferromagnetic powder, such as hematite, $Fe_2O_3$, iron powder, iron-silicon powder, etc. could be mixed with the spacer polymer such that the spacer and/or wire insulators enhance the inductance of the transmission wires. This would further reduce emissions and improve inverter performance.

Figure 4C:
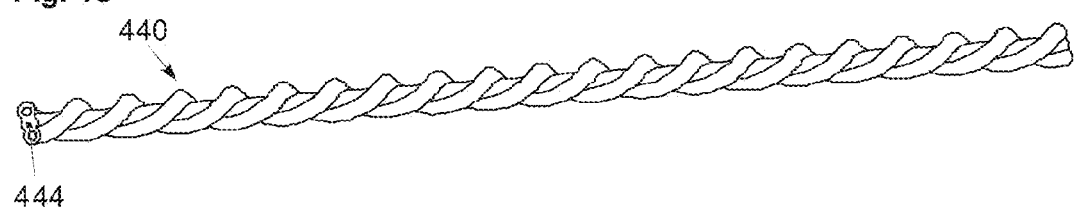
FIG. 4C shows a cross-sectional view of an alternative cross-section of an insulated twisted pair which minimizes polymer use.

The embodiment of FIG. 4C shows an alternative spacer cross-section (444) that may be adopted if the use of an inductance-modifying filler material is cost justified.

The following summarizes one or more characteristics of particular embodiments of an inverter.

- A boost architecture may be favored so there is tolerance for one or more concentrators in a cluster to be out of service with a modest loss of efficiency. Moreover a boost architecture allows a plant to operate in relatively low direct normal irradiance.
- Water cooling may be used liberally to enhance component life, reduce size and mass, eliminate costly heat sinks, etc.
- The standard enclosure for the inverter may be a shipping container into which inverter racks are integrated in a factory.
- Power from individual clusters or small groups of clusters may be inverted individually in a massively interleaved array, e.g., O (200 inverters) per megawatt.
- Interleaved switching may be coordinated to reduce switching stresses and improve efficiency while reducing RFI and line-voltage distortion.
- Components that are subject to failure (such as switches and their drivers, capacitors, etc.) may be individually packaged to minimize the cost of the consumable element and the maintenance cost of its replacement.
- Normal failures shall degrade performance gracefully.
- Imminent failure and cumulative damage may be monitored if practical to support preventive maintenance.
- Secondary damage from normal failures may be prevented by appropriate design of (potentially reusable) individual containers.
- Consumable component containers may also contain features for mechanical locking, making electrical connections, etc., to assist with simple change out. Some of these connections can be used to detect the absence or replacement of the device.
- These component containers may further act as adapters to allow us to replace failed components with new ones having different physical geometries as components evolve.
- Maintenance should not require specialized knowledge or skills. Replacing consumables should be safely performed hot and, to the greatest extent practical, returning inverters to service should be nearly automatic.
- The state of health and performance of all circuitry can be monitored, controlled, and troubleshot/debugged using our standard RS485/Ethernet network.
- All firmware can be safely upgraded remotely using our standard RS485/Ethernet network.

Communications and Control

Figure 25:
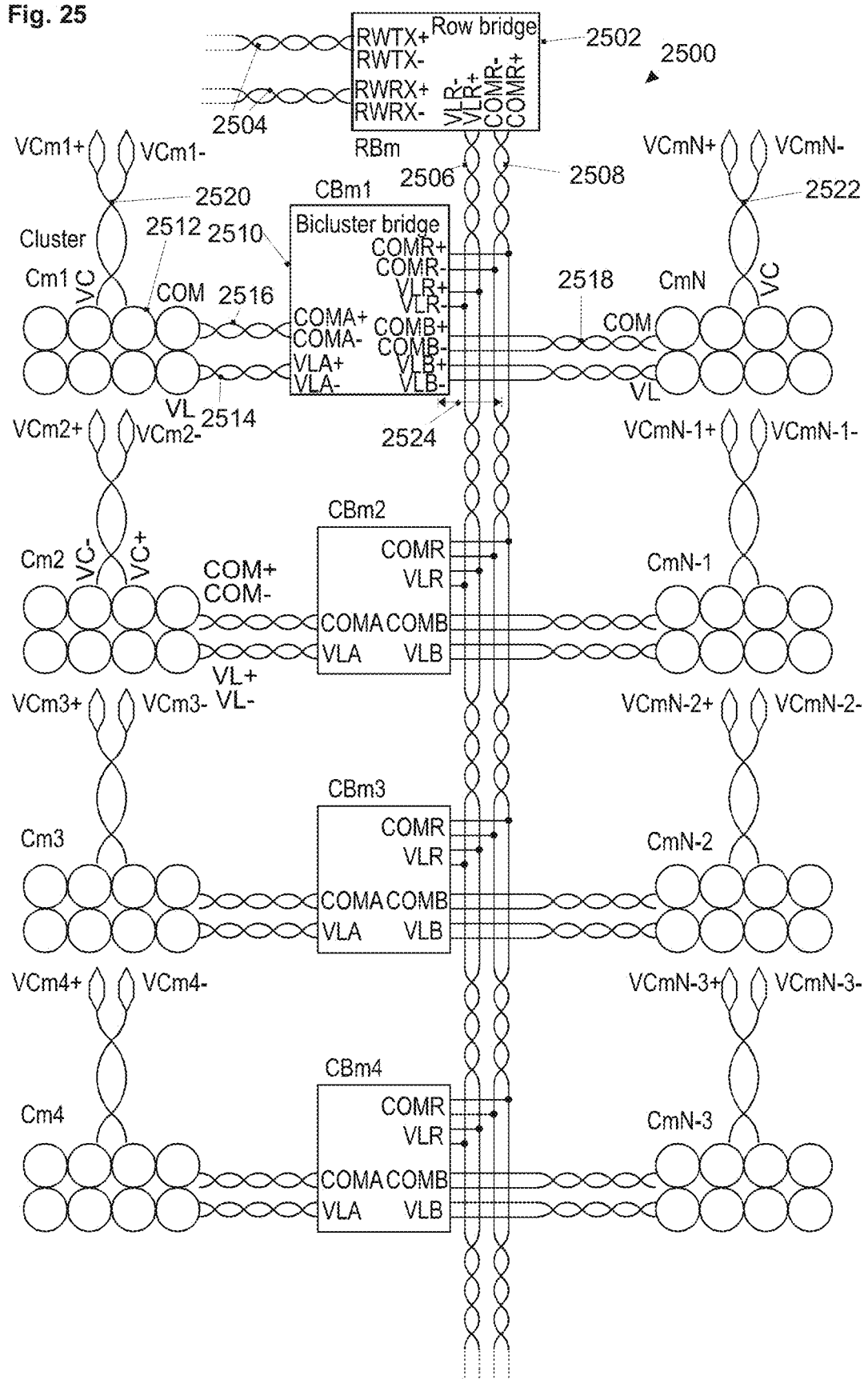
FIG. 25 shows a schematic diagram of a communications and control network according to an embodiment of the present invention.

FIG. 25 shows a schematic diagram of a communications and control network 2500 according to an embodiment of the present invention. A challenge with a large-area plant is to maintain tight control to detect and handle faults, and/or to sense and optimize performance, in spite of the potential for intense electrical noise and/or substantial ground-level variations.

In some embodiments, communications may be handled in part by a "Row bridge" (2502) that serves as a bridge between a higher-level, in some cases, plant-wide communications network (2504) such as an Ethernet network, RS485 network, or other differential voltage signaling network and a sub network that services one or two rows of clusters.

In some embodiments, sub network communications utilizes a pair of twisted pair cables, 2506 and 2508. In some embodiments, these cables comprise a twisted ribbon cable.

In some embodiments, these cables comprise separate twisted wires, such as those in CAT5 or telephony cables.

In some embodiments, at least cable 2508 has a controlled impedance. Examples of such controlled impedance include between about 30-300Ω, and between about 80-120 Ω.

In some embodiments, the row sub network utilizes the RS485 protocol. In some embodiments the Row bridge establishes a low-voltage communication bus power, for example between about 5 to 24 VDC, that provides power to the sub network side of a bridge 2510 between the sub network and one or more cluster networks. This power is used by nodes on the sub network to transmit differential voltages on the twisted pair 2508. The power may also provide a voltage reference to ensure that the common-mode transmitted voltage lies within the range of the Row-bridge (2502) receiver.

The particular embodiment of FIG. 25 shows the one-or-more cluster bridge as being a bi-cluster bridge. The one-or-more cluster bridge provides voltage isolation between the sub network (2508) and the cluster network (2516). Element 2512 depicts a cluster.

According to certain embodiments, it may be desirable to supply primary power to the bridge from one or more of the connected clusters (e.g., via 2514) rather than 2506. This is because the run length of 2506 may be much longer, and that power may be shared by a plurality of cluster bridges.

If the bridge serves more than one cluster, it may need to isolate communications lines (2516) and (2518) between the two clusters. This is because in some embodiments, clusters may have ground references that vary with respect to each other by more than the common-mode range afforded by the RS485 or other differential signaling specification. This ground-reference variation may be influenced by possible differences between the cluster voltages (2520 and 2522).

According to certain embodiments it may be desirable to arrange the communications line 2508 as a transmission line having negligible distance 2524 between the line and cluster bridges. The cluster bridges in turn may reside at a node in a cluster network transmission line.

Communications transmission line terminals can be properly terminated in an appropriate impedance to prevent signal degradation from reflections. Reliable communications rates >1 MBAUD may be achieved in such a system, even for a plant having a span of order of 1 km. Such a communication rate may support advanced plant-power optimization, even with rapid variations in illumination and collection efficiency (for example from wind gusts and buffeting).

Plant Power Usage

The primary power used by clusters for their operations (e.g. communications, cooling, pointing, tracking, focusing, and others) may be supplied via the cluster voltage difference [(VC+)−(VC−)]. During production, this voltage difference may be produced by the receivers. During periods of no production, this voltage difference may be supplied from the central inverter, which normally draws this auxiliary power from the grid.

In certain embodiments, the inverter may have a modest battery to provide and sink bus power momentarily in the event of a grid outage. This battery may be backed up by a diesel generator to provide plant power during extended outages during which no production is possible.

In the event of a forced grid disconnection while producing power, the battery or other load may provide a momentary power sink while the plant takes steps to reduce power output.

In some embodiments, clusters may short-circuit one or more receivers to prevent an excessive rise in bus voltage In summary, embodiments of power system architectures in accordance with the present invention may be determined by one or more factors. One factor is the nature of the basic power-producing unit. In certain embodiments, this basic power-producing unit may comprise a silicon solar cell that produces only ~0.6 V and has a particular maximum power point of operation that depends on the device and the level of illumination.

Another factor is the nature of the power resource. In solar power embodiments, sunlight is a dilute power resource, and therefore power may need to be collected over large areas and transmitted long distances in a solar power plant.

Still another factor is the maximum voltage. For safety of maintenance staff, a maximum voltage of electrical transmission within a power plant. This maximum may also be set by device economics, and in some cases by device physics.

Still other factors comprise practical constraints. For example, in a system based upon photovoltaic receivers, it may be expensive and difficult to ensure that these receivers share a common maximum-power current without active electronic intervention.

The above considerations may lead to embodiments of plant architectures exhibiting one or more of the following characteristics. First, cells may be series connected in correlated strings (for example a module, dense-array receiver, or ganged sparse array), which are generically referred to as receivers.

It may be difficult to perform maximum power point tracking for series strings containing fewer than a threshold number of cells. Below this threshold level, passive optical and electrical techniques may be needed to balance currents. Examples of such techniques include but are not limited to, judicious paralleling of compensating substrings, in order to make departures from maximum power point operation acceptably low.

Above this threshold number of cells, active circuitry can be economically employed to improve efficiency. However, this circuitry may operate only on "imbalance" currents. That is, receivers can be series connected in a "cluster" to boost the voltage. Active circuitry can only supply deficit or drain surplus currents to and from receivers such that each receiver operates near its maximum power point.

It is possible to group these clusters of receivers into superclusters and perform the same balancing operation between clusters. However, adding layers to this hierarchy can increase costs.

Certain embodiments may employ one or two balancing stages for our system. The last stage of this balancer may comprise a sufficient number of series cell connections to reach the maximum bus voltage deemed safe for intra-plant transmission.

In certain embodiments, power may be transmitted to a single point (which may be at or near a center of a power plant), over separate, spaced twisted wires specifically optimized for increased inductance and a target resistive loss at maximum current. The length of these interconnect wires can be O (100 m to 1 km) depending on the power rating of the plant.

A separate three-phase boost inverter can be connected via these wires separately to each cluster. That is, the power-bearing wires may not be bussed on their way to the inverter. Keeping these wires separate helps to avoid issues of maximum-power-point mismatch at the combination point and inverter load balancing at the splitting point.

In certain embodiments the boost inverters may be massively interleaved. Such configurations may serve a number of purposes, including reducing filtering requirements, and reducing EMI/RFI.

Massive interleaving of the boost inverters may permit expansion of the peak efficiency envelope. For example, such configurations may allow variable frequency operation. In some embodiments the outputs of the inverters may be directly connected, e.g., without an isolation transformer.

According to certain embodiments, the inverter interleaving can be deterministically coordinated, allowing optimizations such as soft-switching. In particular, filtering requirements of a deterministic system ideally scale as $N^{-1}$, where N is the number of inverters.

Above a threshold number ($N_d$), non-idealities reduce the effectiveness of the interleaving and further decreases in filtering requirements are negligible. Above another threshold ($N_{nd}$) non-deterministic interleaving, which reduces filtering requirements as $N^{-1/2}$, is cost effective and readily supports "one-cycle control," an inexpensive, high-performance control technique.

In certain embodiments, the outputs of the interleaved inverter array may be boosted directly to grid voltages via transformers located within ~10 m of the inverter array. Some embodiments may employ water cooling for increased cooling performance, reduced cost, and reduced parasitic load.

While the above-referenced embodiments have been described in connection with the design of plants utilizing energy conversion devices in the form of inflated balloons for collecting solar energy, the present invention is not limited to this approach. In accordance with alternative embodiments, similar considerations may apply to alternate arrays of energy conversion devices, including but not limited to chemical cells, batteries, thermocouples, fuel cells, wind turbines, and water turbines.

Having thus described exemplary embodiments of the present invention, it should be noted by those skilled in the art that the within disclosures are exemplary only and that various other alternatives, adaptations, and modifications may be made within the scope of the present invention. Accordingly, the present invention is not limited to the specific embodiments as illustrated herein, but is only limited by the following claims.

What is claimed is:

1. A central inverter comprising:
a housing;
a plurality of individual inverters each removably coupled to a rack inside the housing, each of the plurality of individual inverters having an input and an output, the input of each individual inverter for providing electrical coupling to at least one of a plurality of photovoltaic receivers disposed remote from the housing, and the output of each individual inverter for providing an AC output;
a cooling apparatus configured to provide common cooling to each of the plurality of individual inverters, wherein the cooling apparatus is configured to cool one or more of the plurality of inverters by producing a jet of water that impinges on a cooling plate that is in thermal communication with the one or more of the plurality of individual inverters;
timing circuitry electrically coupled to each of the plurality of individual inverters, the timing circuitry configured to provide switch timing and synchronization between the plurality of individual inverters; and
a central output for combining the AC output from each of the plurality of individual inverters.

2. The central inverter of claim 1 wherein each of the plurality of individual inverters includes at least one of a removably coupled capacitor module or a removably coupled switch module.

3. The central inverter of claim 1, wherein the jet is hydrostatically pressurized.

4. The central inverter of claim 1, wherein the cooling plate is coupled to materials in thermal communication with a heat generator.

5. The central inverter of claim 1, further comprising a second housing that is coupled to the housing and houses at least one of a radiator or a fan.

6. The central inverter of claim 1, wherein the housing includes a plurality of vents at a first side of the housing and a pipe extending from a second side of the housing.

7. The central inverter of claim 1, wherein an individual inverter of the plurality of individual inverters includes a switch enabling it to provide power to one or more of the plurality of photovoltaic receivers.

8. A central inverter comprising:
a housing;
a plurality of individual inverters each removably coupled to a rack inside the housing, each of the plurality of individual inverters having an input and an output, the input of each individual inverter for providing electrical coupling to at least one of a plurality of photovoltaic receivers disposed remote from the housing, and the output of each individual inverter for providing an AC output, wherein each of the plurality of individual inverters includes a series input inductor to reduce an output ripple current of the central inverter;
a cooling apparatus configured to provide common cooling to each of the plurality of individual inverters;
timing circuitry electrically coupled to each of the plurality of individual inverters, the timing circuitry configured to provide switch timing and synchronization between the plurality of individual inverters, the switch timing coordinated using daisy-chained handshaking signal; and
a central output for combining the AC output from each of the plurality of individual inverters.

9. The central inverter of claim 8, wherein the switch timing is determined using a clock signal from a microcontroller.

10. The central inverter of claim 8, wherein the switch timing is coordinated using a handshaking signals.

11. The central inverter of claim 8, wherein each of the plurality of individual inverters includes at least one of a removably coupled capacitor module or a removably coupled switch module.

12. The central inverter of claim 8, wherein the housing includes a plurality of vents at a first side of the housing and a pipe extending from a second side of the housing.

13. The central inverter of claim 8, wherein an individual inverter of the plurality of individual inverters includes a switch enabling it to provide power to one or more of the plurality of photovoltaic receivers.

14. A central inverter comprising:
a housing;
a plurality of individual inverters each removably coupled to a rack inside the housing, each of the plurality of individual inverters having an input and an output, the input of each individual inverter for providing electrical coupling to at least one of a plurality of photovoltaic receivers disposed remote from the housing, and the output of each individual inverter for providing an AC output;
a cooling apparatus configured to provide common cooling to each of the plurality of individual inverters;

timing circuitry electrically coupled to each of the plurality of individual inverters, the timing circuitry configured to provide switch timing and synchronization between the plurality of individual inverters;

a central output for combining the AC output from each of the plurality of individual inverters; and a robotic mechanism controllable to perform at least one of: removing individual inverters from the rack, placing individual inverters in the rack, or actuating a switch associated with one or more of the plurality of individual inverters.

15. The central inverter of claim 14, wherein each of the plurality of individual inverters includes at least one of a removably coupled capacitor module or a removably coupled switch module.

16. The central inverter of claim 14, wherein the housing includes a plurality of vents at a first side of the housing and a pipe extending from a second side of the housing.

17. The central inverter of claim 14, wherein an individual inverter of the plurality of individual inverters includes a switch enabling it to provide power to one or more of the plurality of photovoltaic receivers.

* * * * *